(12) United States Patent
Oh

(10) Patent No.: US 12,421,105 B2
(45) Date of Patent: Sep. 23, 2025

(54) SEMICONDUCTOR DEVICES AND RELATED METHODS

(71) Applicant: Amkor Technology Singapore Holding Pte. Ltd., Singapore (SG)

(72) Inventor: Sung Jae Oh, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 17/862,609

(22) Filed: Jul. 12, 2022

(65) Prior Publication Data

US 2023/0002217 A1  Jan. 5, 2023

Related U.S. Application Data

(63) Continuation of application No. 16/505,957, filed on Jul. 9, 2019, now Pat. No. 11,383,970.

(51) Int. Cl.
*B81B 7/00* (2006.01)
*B81C 1/00* (2006.01)

(52) U.S. Cl.
CPC .......... *B81B 7/007* (2013.01); *B81C 1/00301* (2013.01); *B81C 1/0088* (2013.01);
(Continued)

(58) Field of Classification Search
CPC .............. B81B 2207/096; B81B 7/007; B81C 1/00246; B81C 1/00301; B81C 2203/0109; B81C 1/00269; H01L 23/5389
See application file for complete search history.

(56) References Cited

U.S. PATENT DOCUMENTS 5,258,647 A * 11/1993 Wojnarowski .......... H01L 24/75
257/E23.178
9,461,018 B1  10/2016  Tsai et al.
(Continued)

FOREIGN PATENT DOCUMENTS

CN  103608922  2/2014
CN  106373934  2/2017
(Continued)

OTHER PUBLICATIONS

Taiwanese Office Action for Application No. 109122255, dated May 13, 2024, 20 pages.
(Continued)

*Primary Examiner* — John A Bodnar
(74) *Attorney, Agent, or Firm* — McAndrews, Held & Malloy, Ltd.

(57) ABSTRACT

In one example, an electronic device can comprise (a) a first substrate comprising a first encapsulant extending from the first substrate bottom side to the first substrate top side, and a first substrate interconnect extending from the substrate bottom side to the substrate top side and coated by the first encapsulant, (b) a first electronic component embedded in the first substrate and comprising a first component sidewall coated by the first encapsulant, (c) a second electronic component coupled to the first substrate top side, (d) a first internal interconnect coupling the second electronic component to the first substrate interconnect, and (e) a cover structure on the first substrate and covering the second component sidewall and the first internal interconnect. Other examples and related methods are also disclosed herein.

12 Claims, 65 Drawing Sheets

(52) U.S. Cl.
CPC ... *B81B 2207/096* (2013.01); *B81B 2207/097* (2013.01); *B81C 2201/034* (2013.01); *B81C 2203/0109* (2013.01)

(56) References Cited

U.S. PATENT DOCUMENTS

| | | | |
|---|---|---|---|
| 9,508,674 | B2 | 11/2016 | Pan et al. |
| 2008/0083960 | A1* | 4/2008 | Chen .................. H04R 1/04 438/51 |
| 2009/0079054 | A1* | 3/2009 | Asai .................. B81B 7/0038 257/E23.137 |
| 2009/0134481 | A1 | 5/2009 | Sengupta |
| 2011/0036174 | A1 | 2/2011 | Hooper et al. |
| 2011/0062573 | A1 | 3/2011 | Zhe et al. |
| 2011/0304015 | A1* | 12/2011 | Kim .................. H01L 25/0657 257/532 |
| 2011/0316130 | A1 | 12/2011 | Su et al. |
| 2014/0264808 | A1 | 9/2014 | Wolter et al. |
| 2014/0291829 | A1 | 10/2014 | Le Neel et al. |
| 2015/0021791 | A1 | 1/2015 | Park et al. |
| 2015/0179616 | A1* | 6/2015 | Lin .................... H01L 23/3121 257/773 |
| 2016/0207759 | A1 | 7/2016 | Salmon et al. |
| 2016/0306042 | A1 | 10/2016 | Schrank et al. |
| 2016/0358889 | A1 | 12/2016 | Lai et al. |
| 2017/0069564 | A1* | 3/2017 | Kwon .................. H01L 23/5389 |
| 2017/0313579 | A1 | 11/2017 | Ghidoni et al. |
| 2017/0320726 | A1* | 11/2017 | Leitgeb ................ B81B 7/0061 |
| 2017/0323853 | A1 | 11/2017 | Hu et al. |
| 2018/0090465 | A1 | 3/2018 | Chen et al. |
| 2018/0297834 | A1* | 10/2018 | Renaud-Bezot ...... B81B 7/0064 |
| 2019/0164909 | A1 | 5/2019 | Chang Chien et al. |
| 2019/0189564 | A1* | 6/2019 | Guzek .................... H01L 21/56 |
| 2020/0381409 | A1* | 12/2020 | Chen .................. H01L 21/6835 |

FOREIGN PATENT DOCUMENTS

| | | |
|---|---|---|
| CN | 107337173 | 11/2017 |
| TW | 201903907 | 1/2019 |
| TW | I836377 | 3/2024 |

OTHER PUBLICATIONS

Taiwanese Office Action for Application No. 113108382, dated Sep. 4, 2024, 9 pages.
Chinese Office Action for Application No. 202010640045, dated Jan. 16, 2025, 27 pages.
Korean Office Action for Application No. 10-2020-0079275, dated Sep. 27, 2024, 19 pages.
Chinese Office Action for Application No. 202010640045.0, dated Jul. 15, 2025, 17 pages.

* cited by examiner

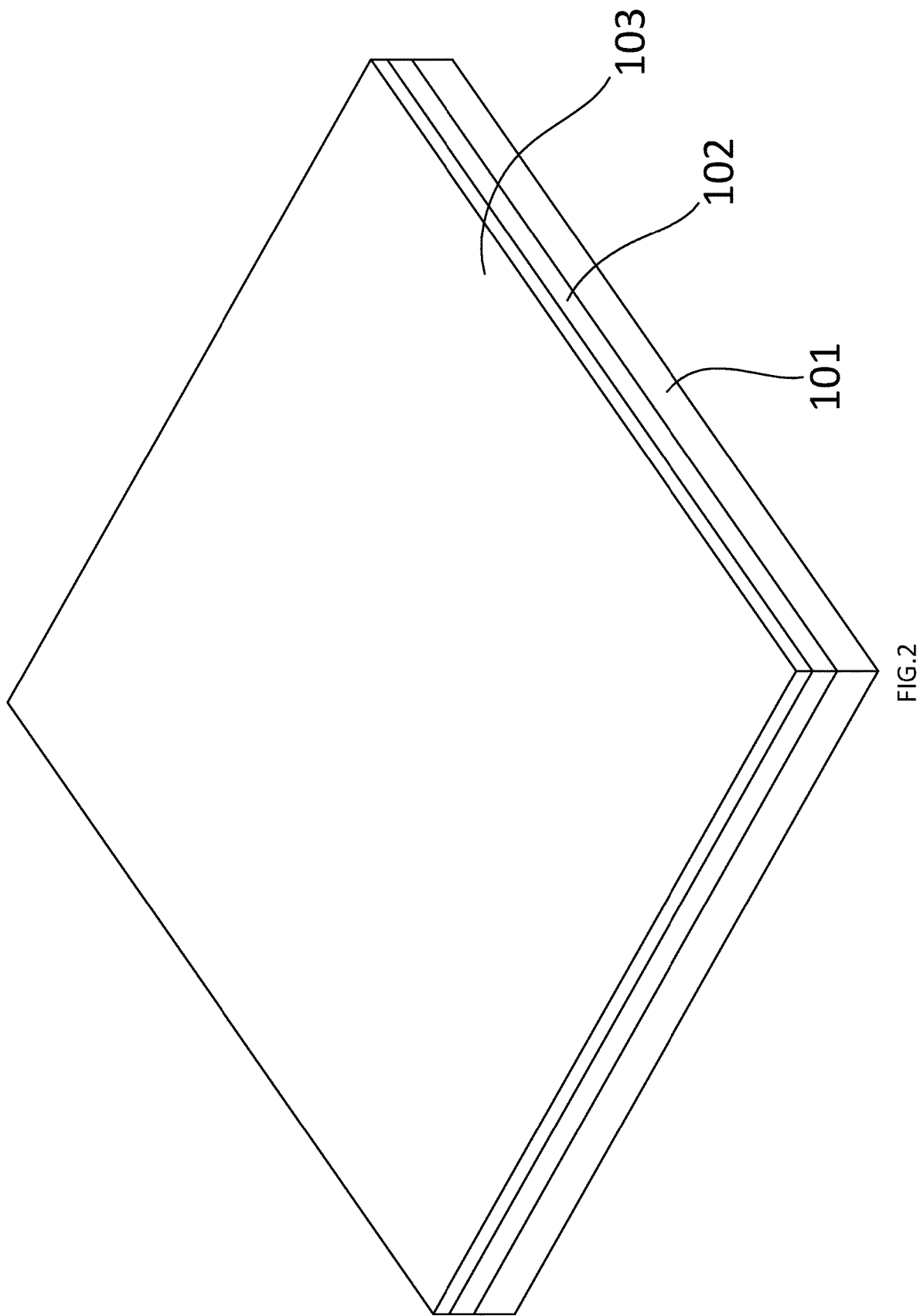

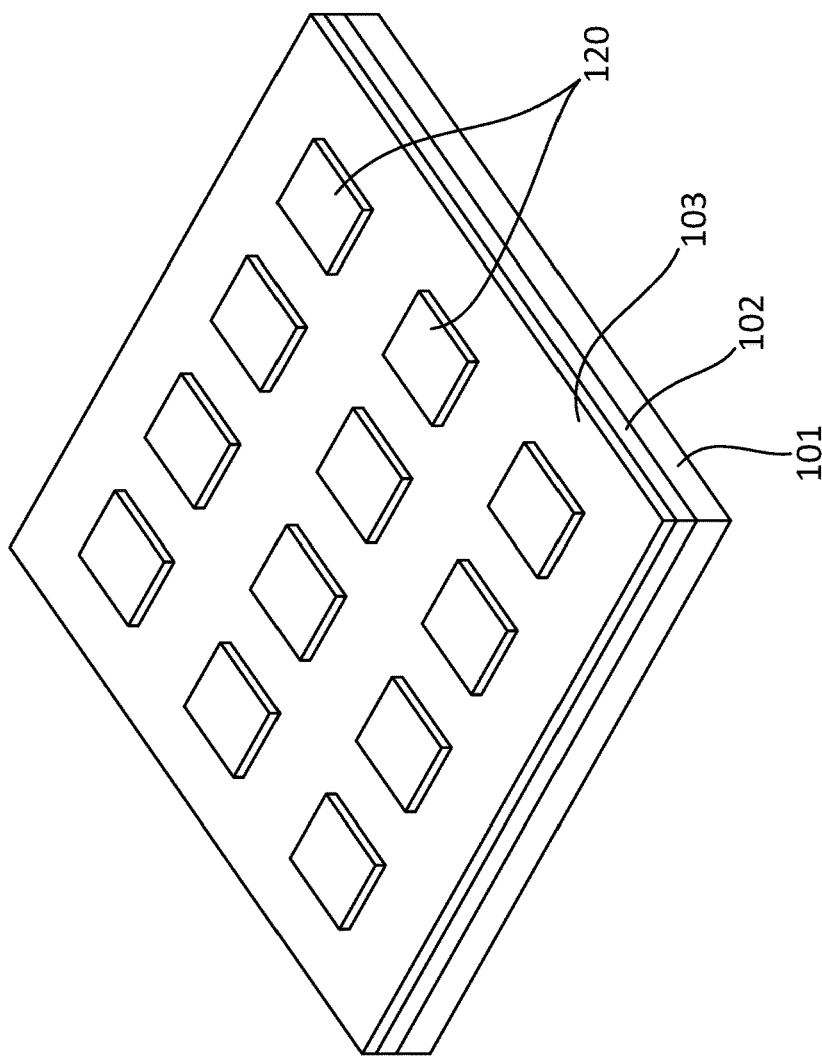
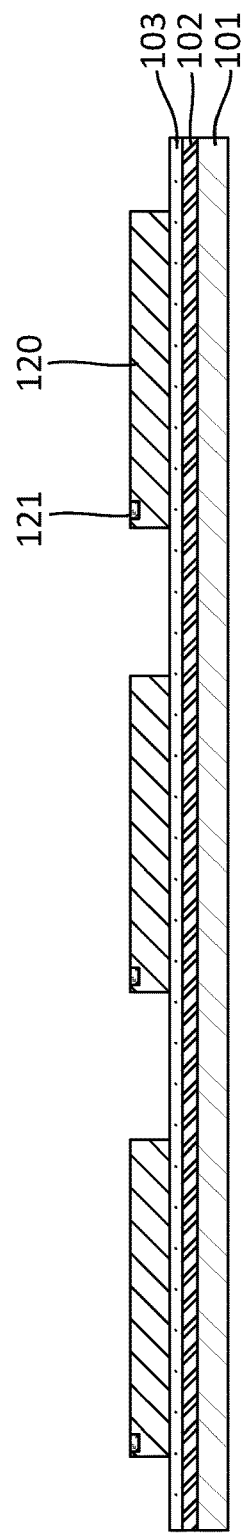
FIG.3A
FIG.3B

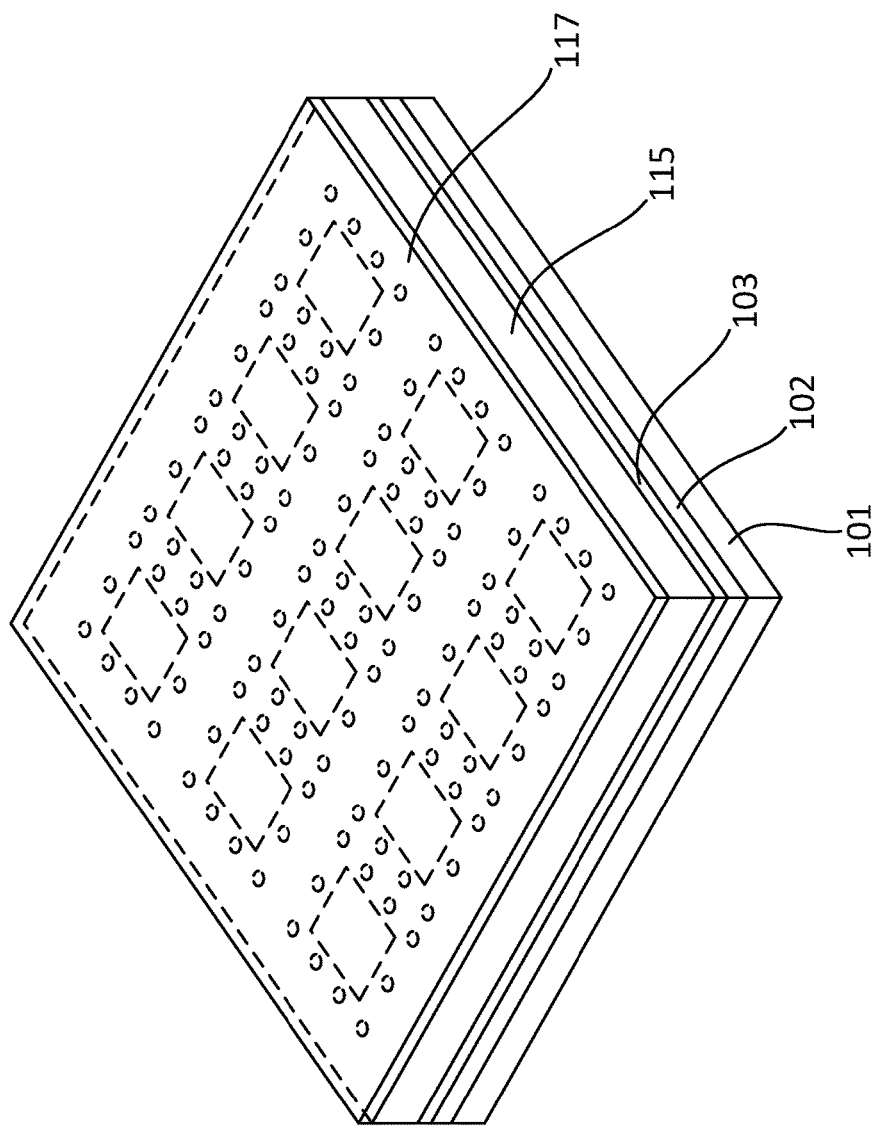
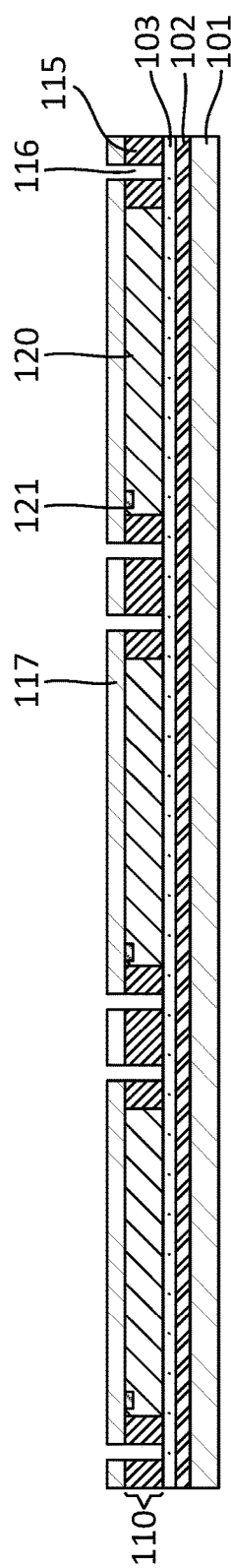
FIG.6A
FIG.6B

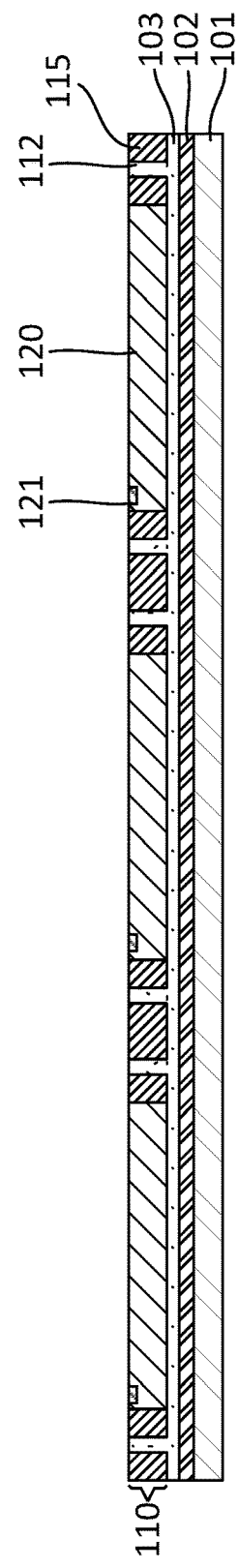
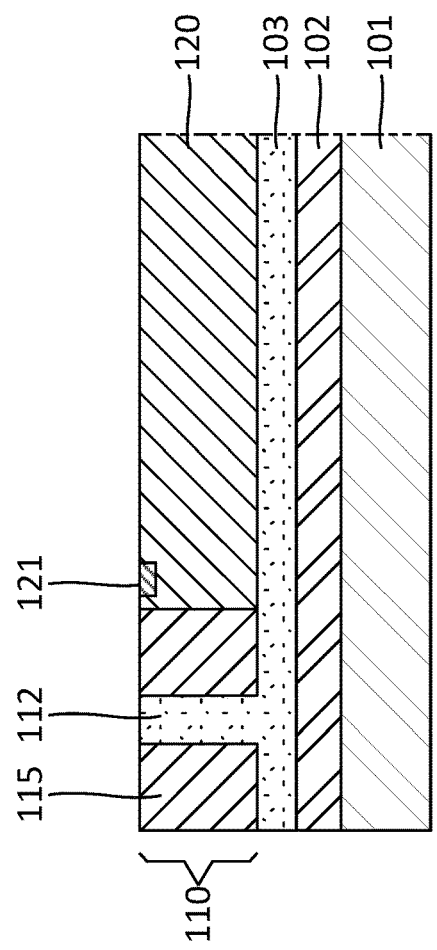
FIG. 8B
FIG. 8C

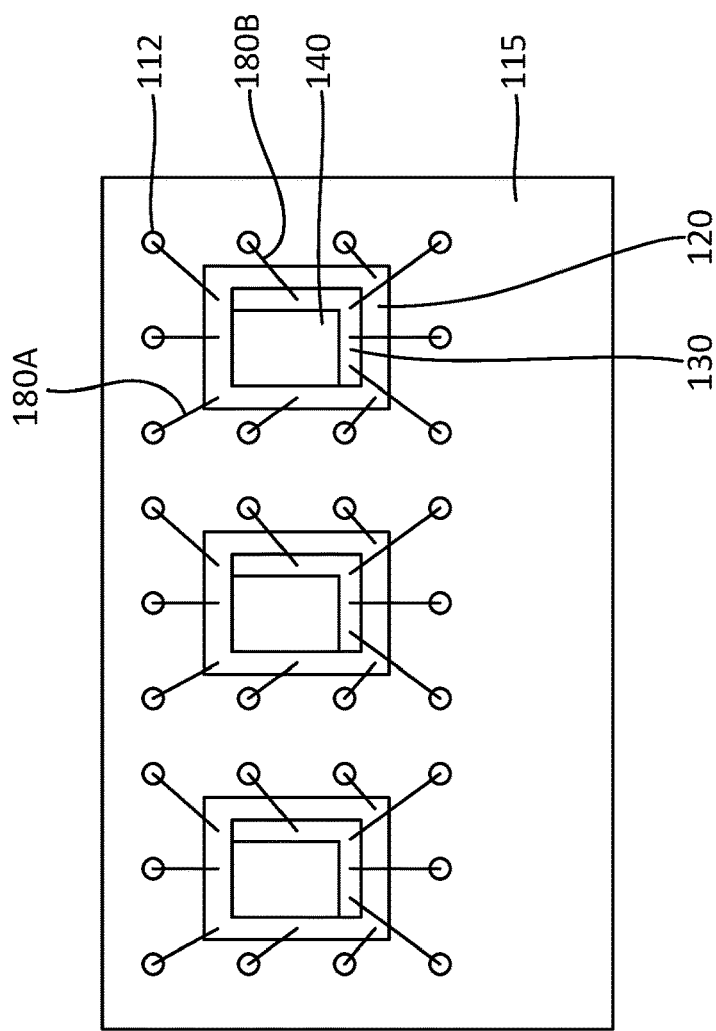
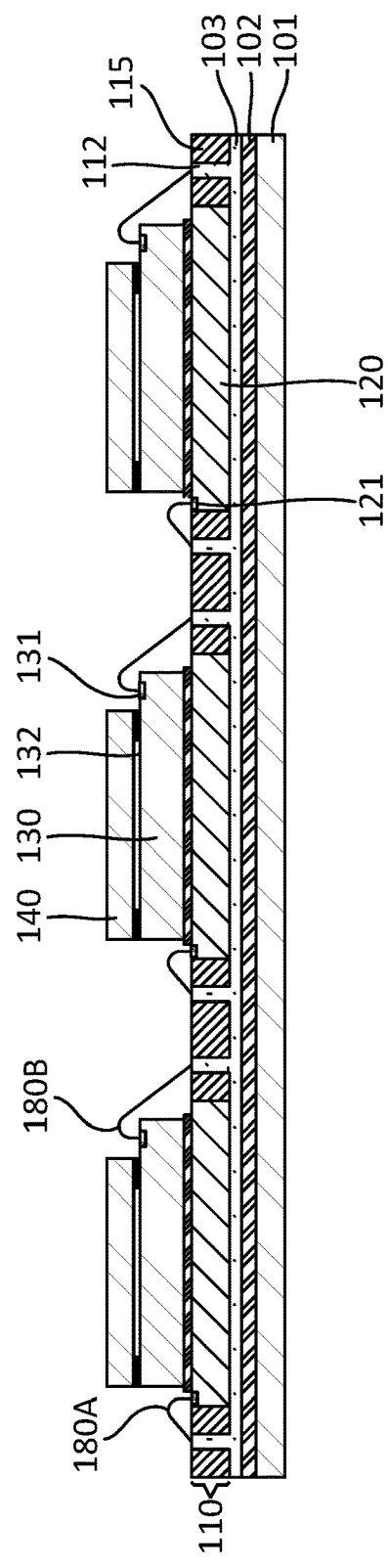
FIG.10A
FIG.10B

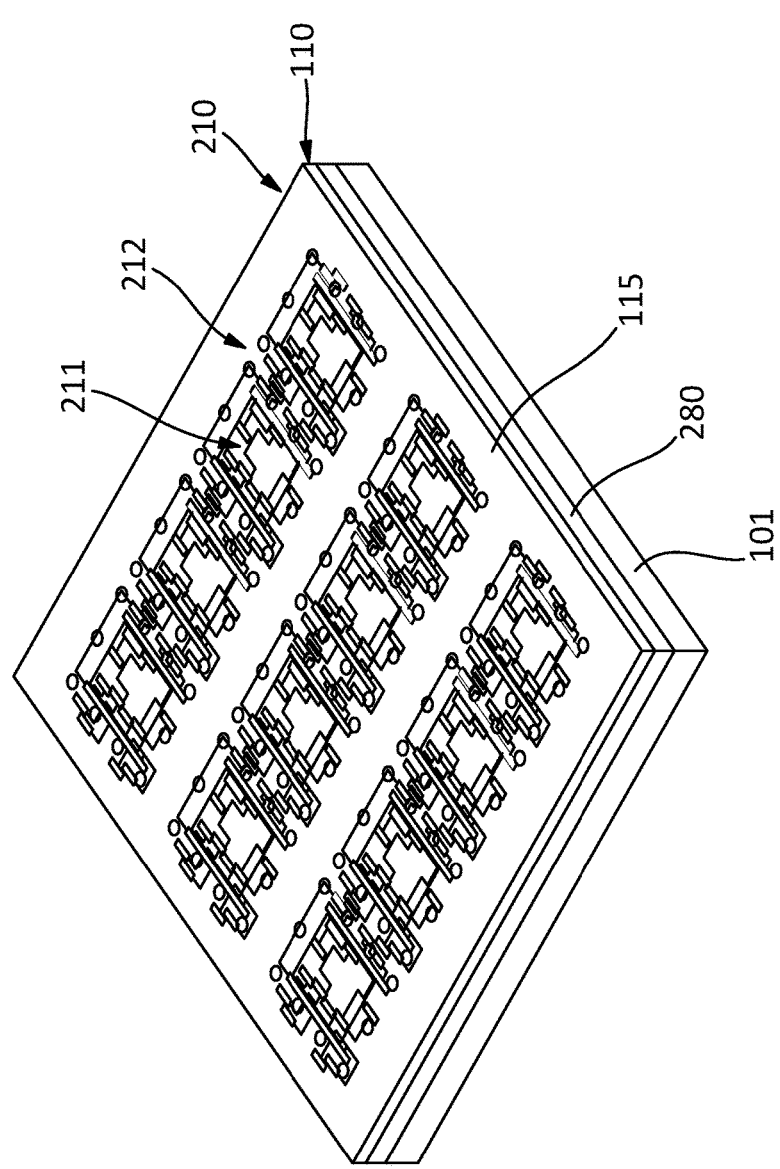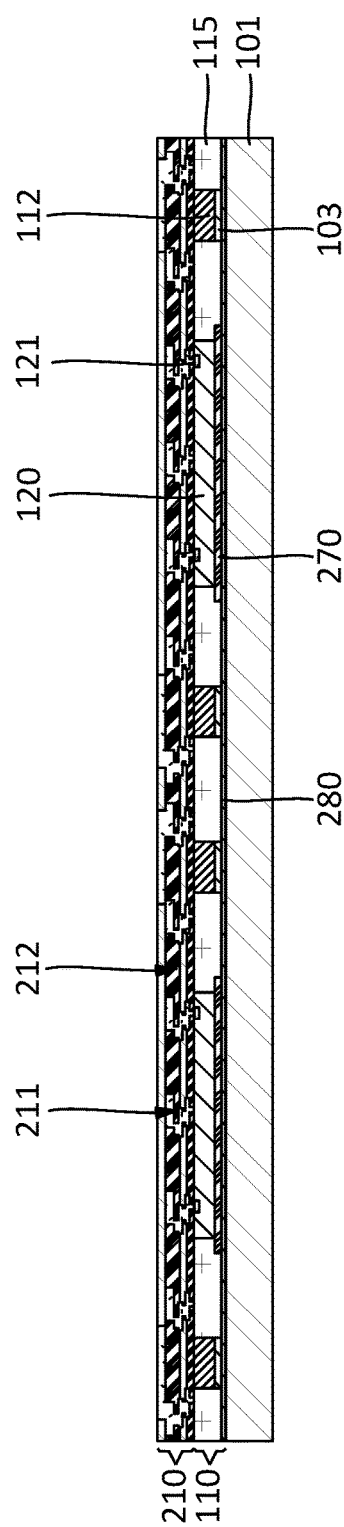
FIG. 21A
FIG. 21B

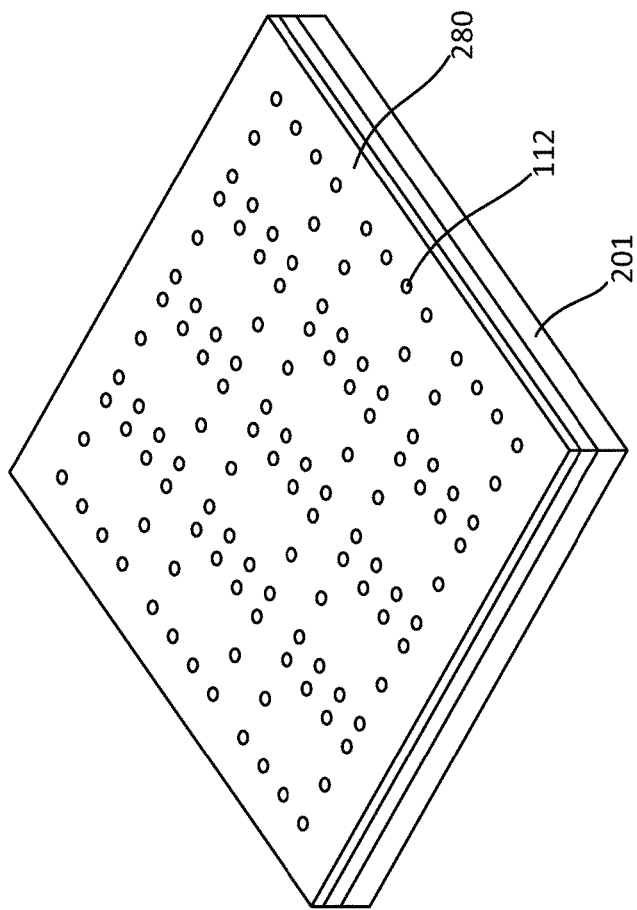
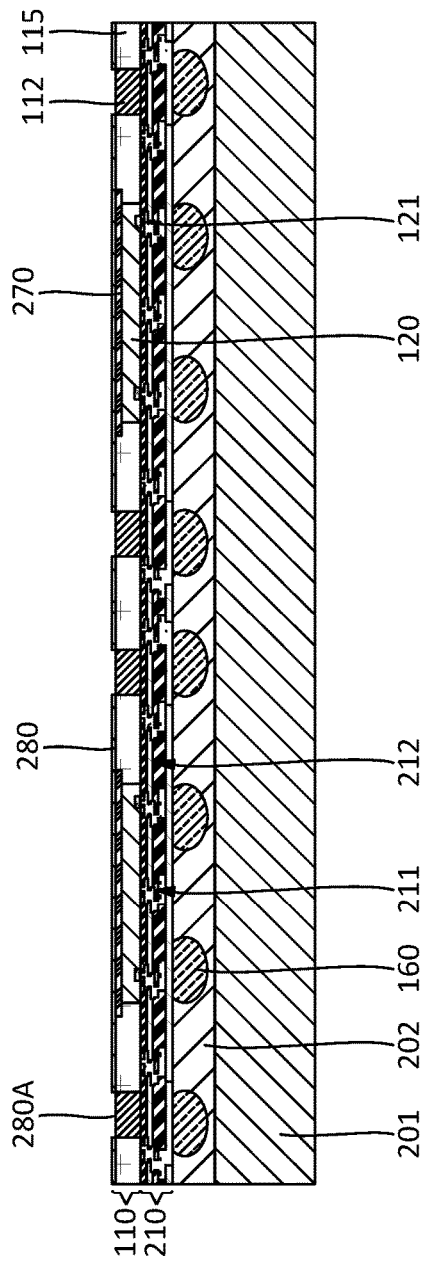
FIG.25A
FIG.25B

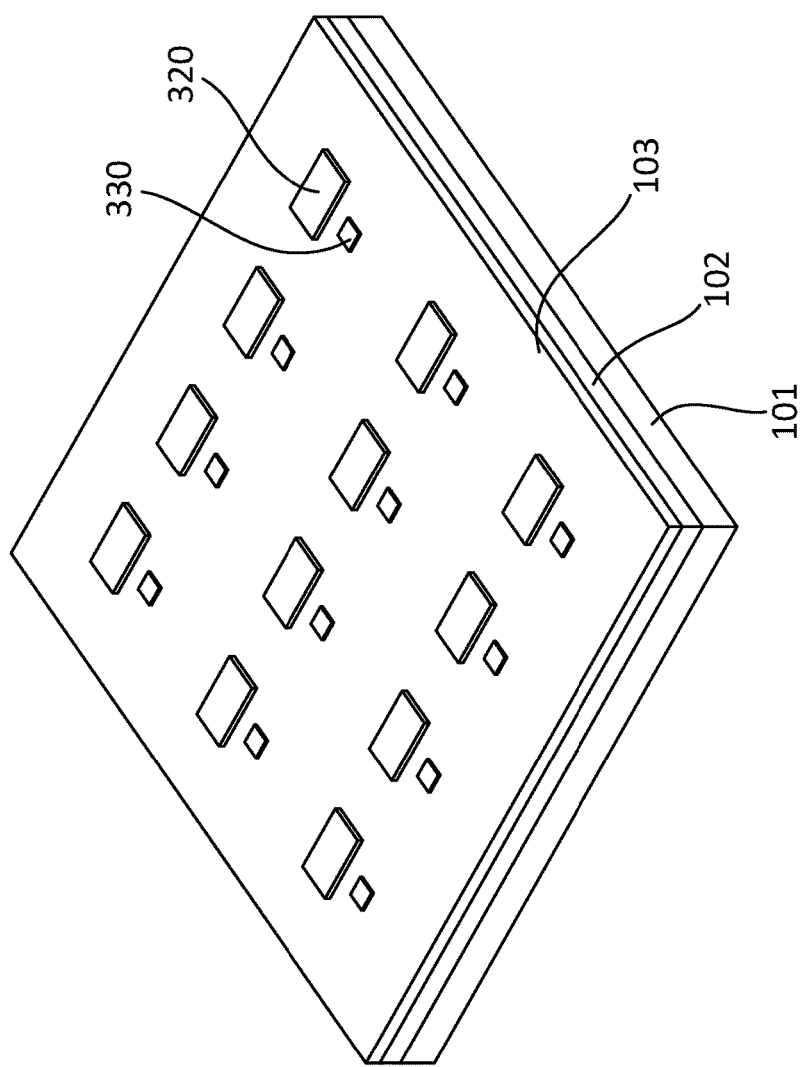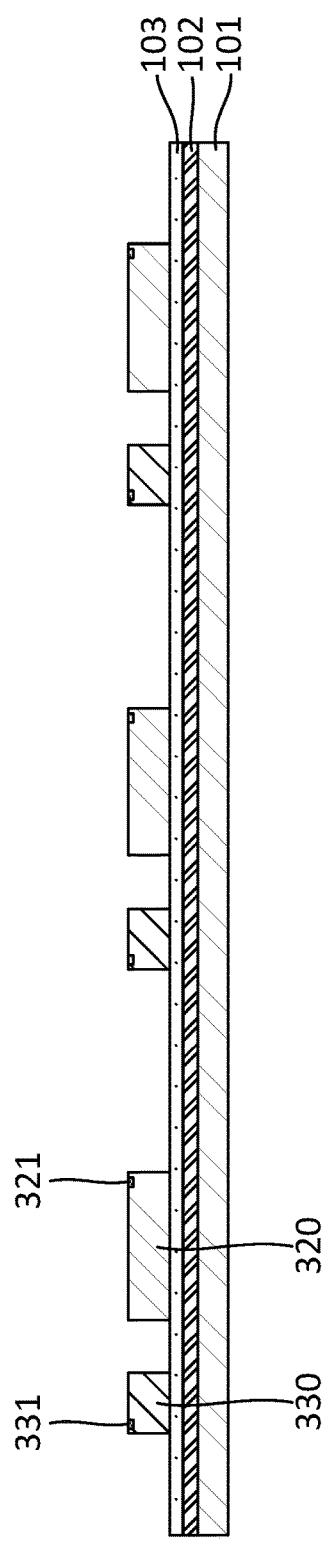
FIG.32A
FIG.32B

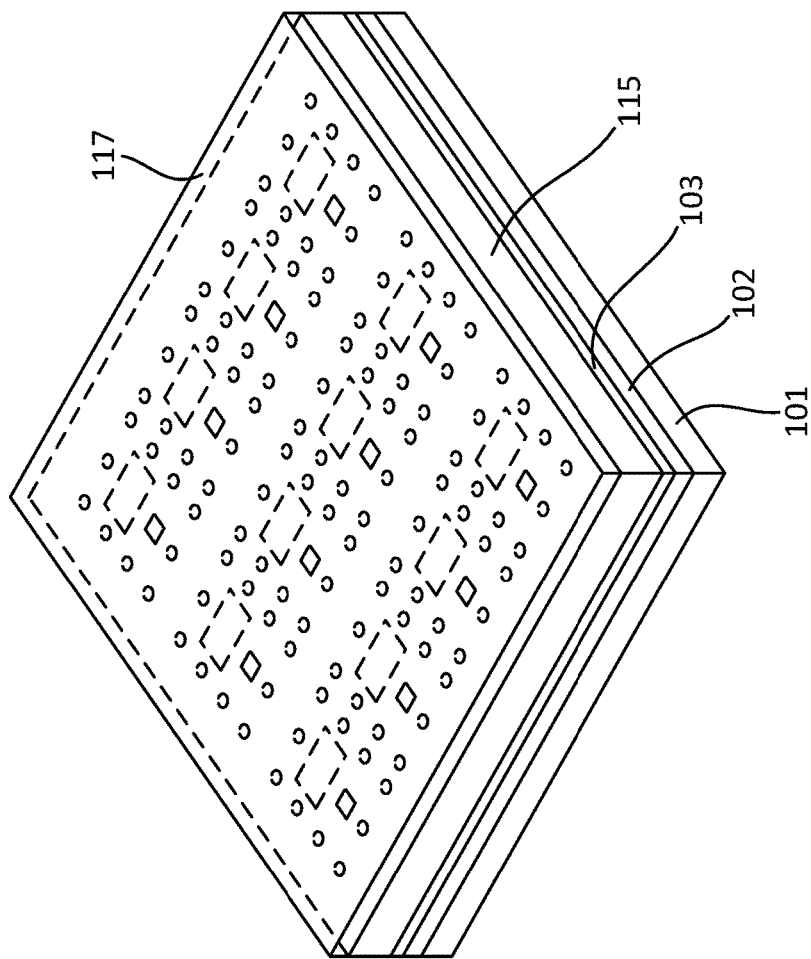
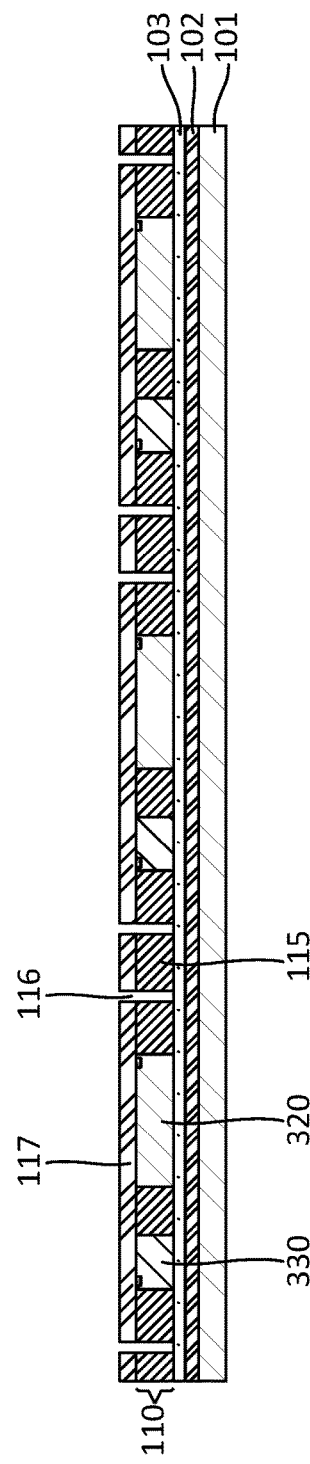
FIG.35A
FIG.35B

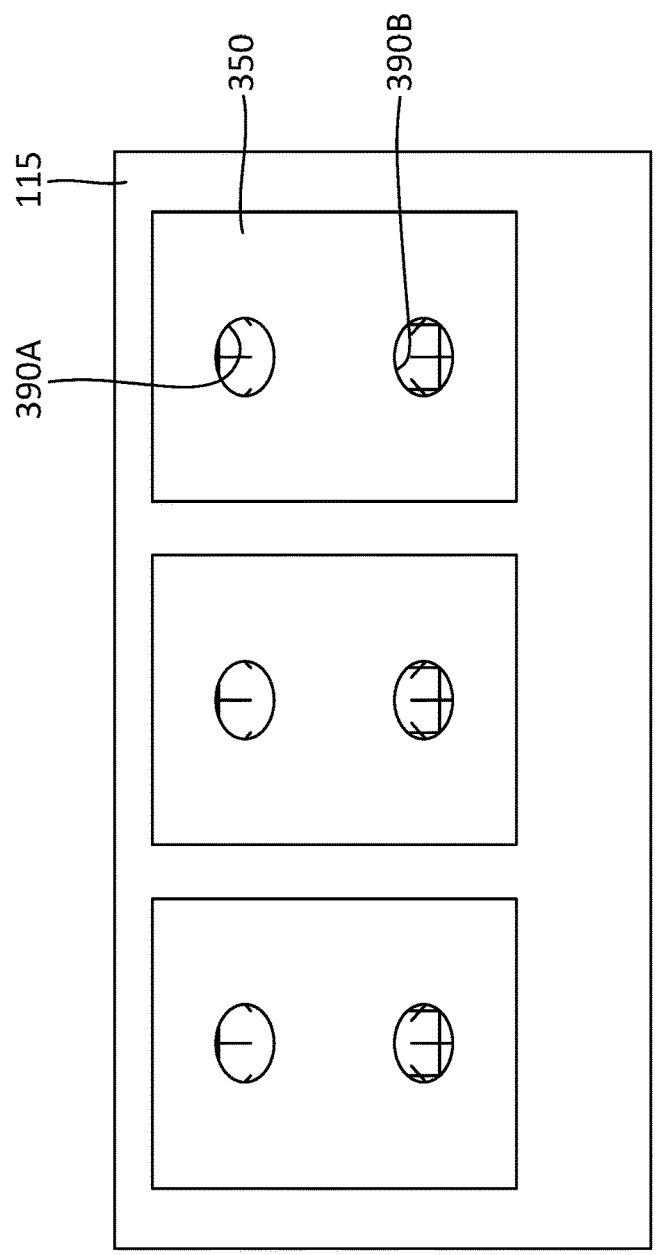
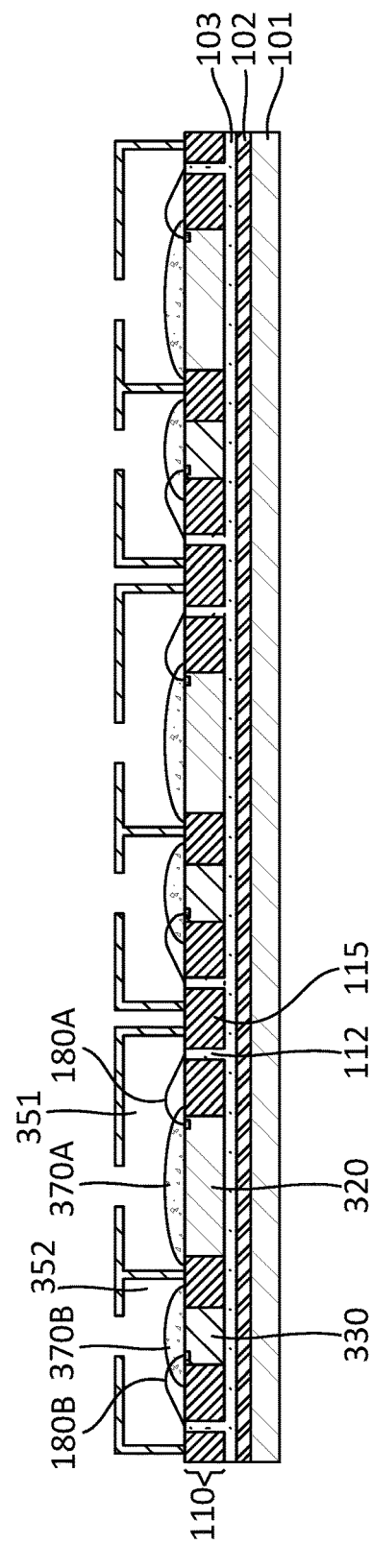
FIG.40A
FIG.40B

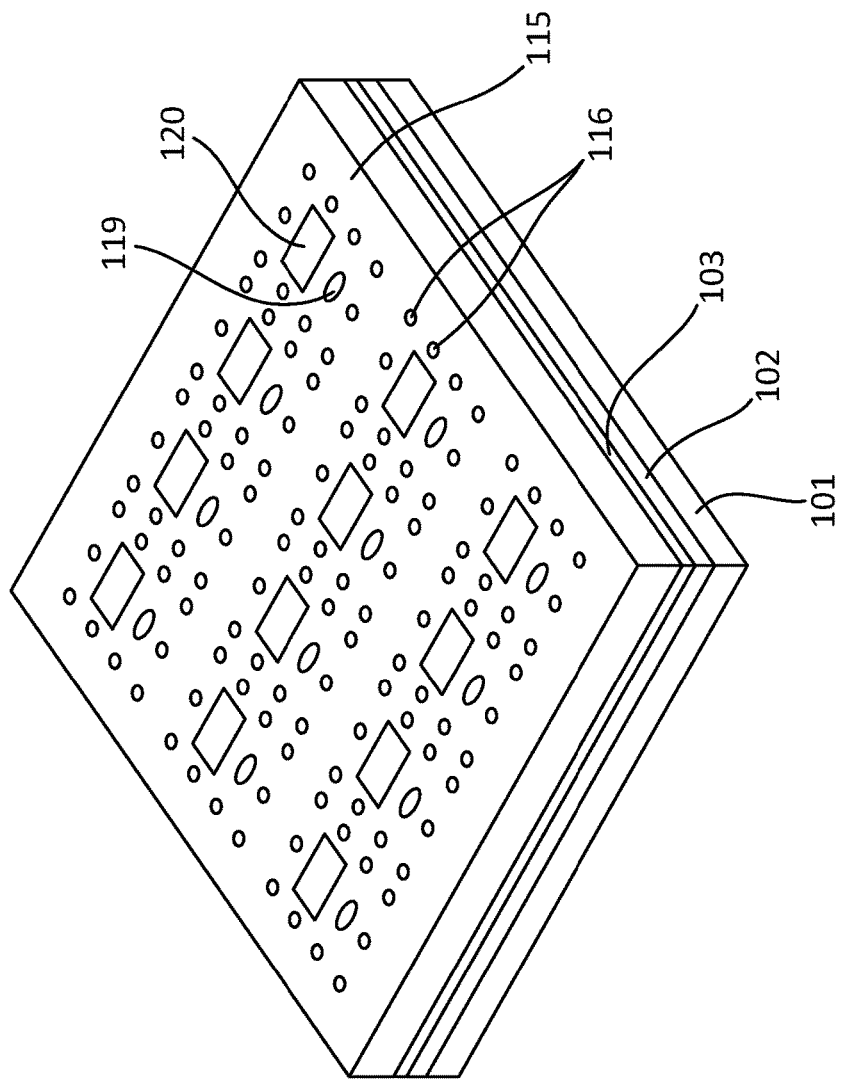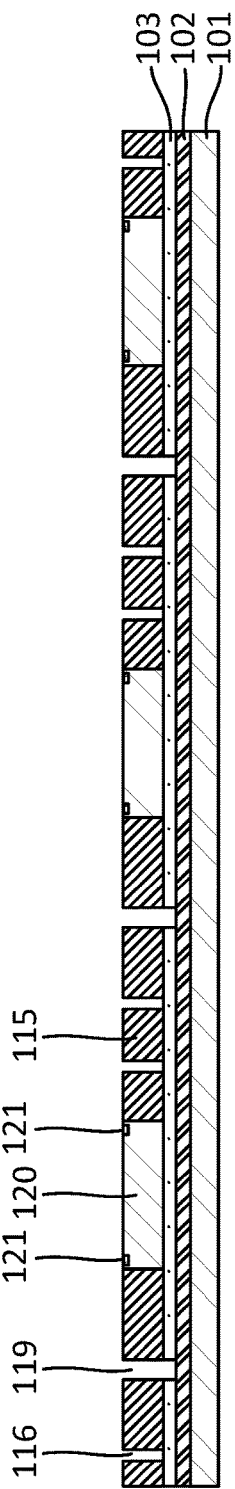
FIG.46A
FIG.46B

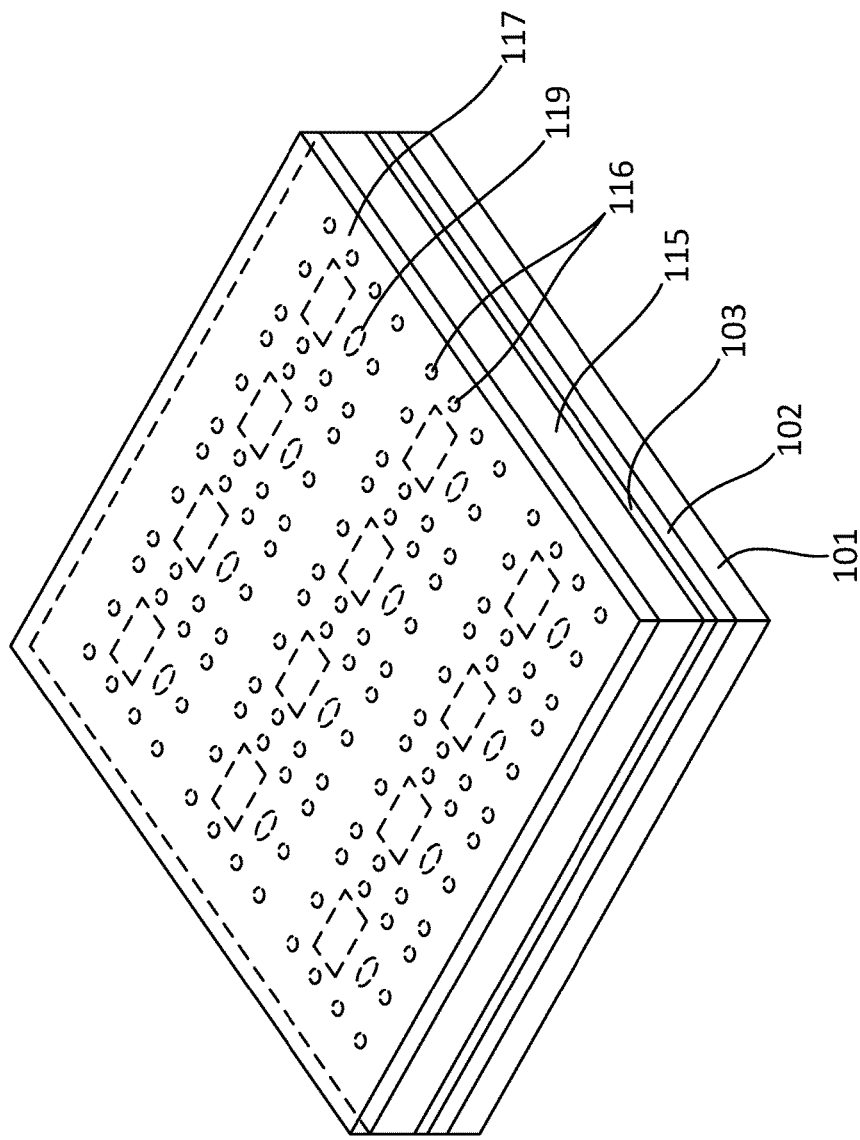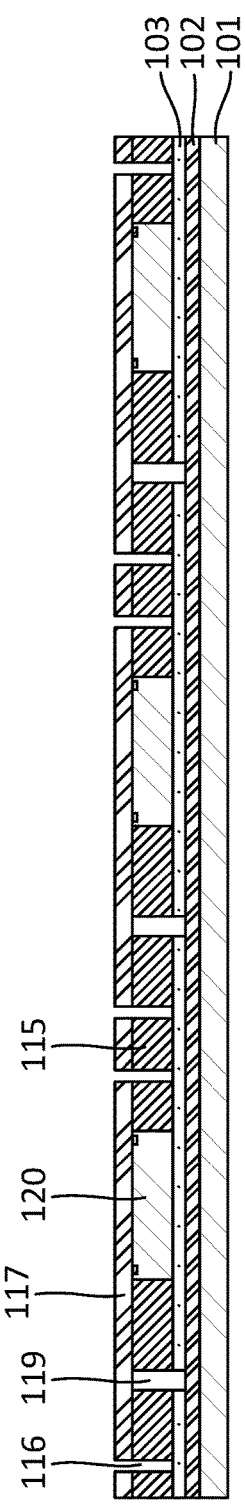
FIG.47A
FIG.47B

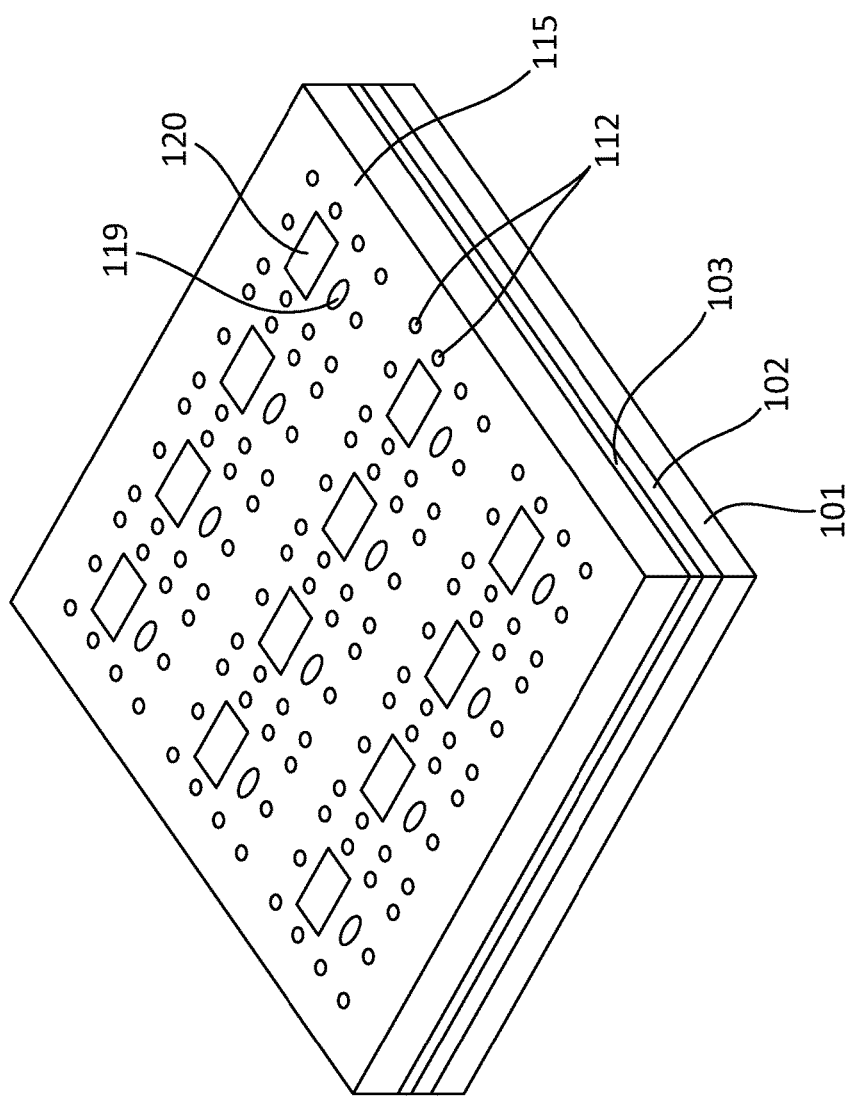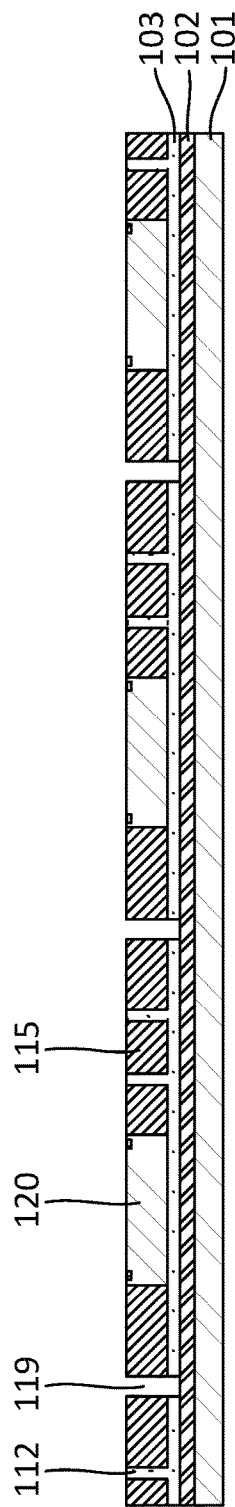
FIG.49A
FIG.49B

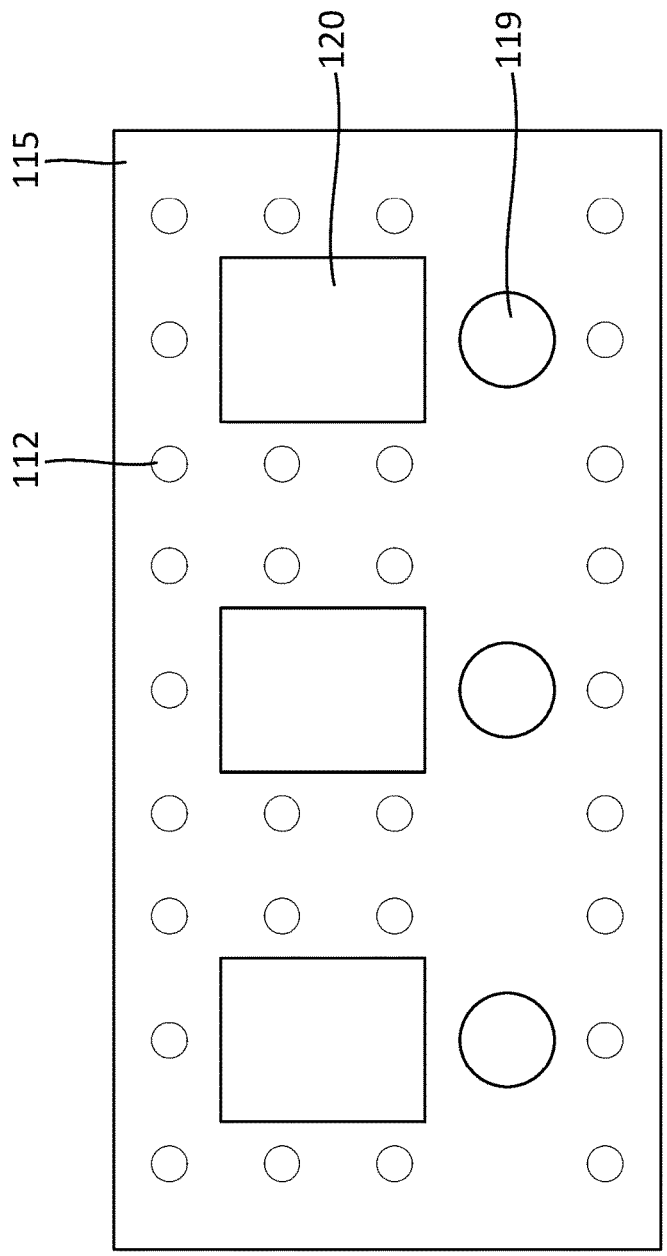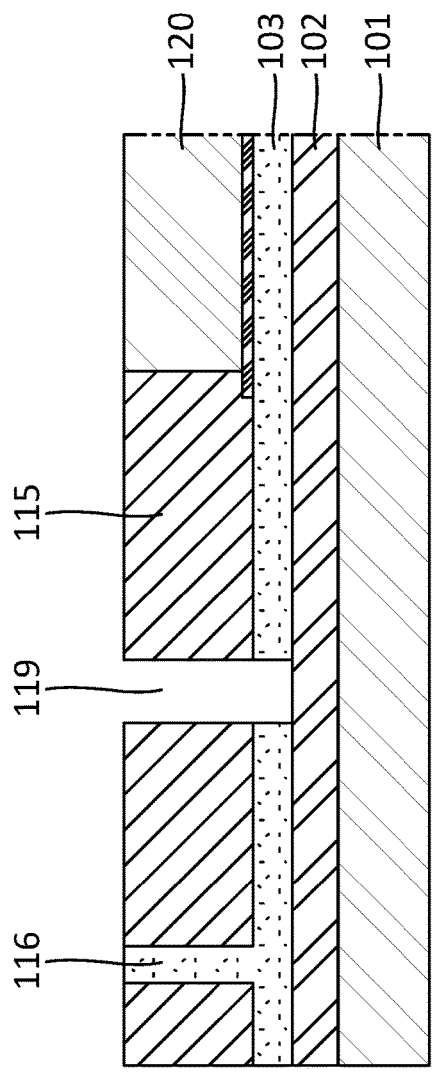
FIG.49C
FIG.49D

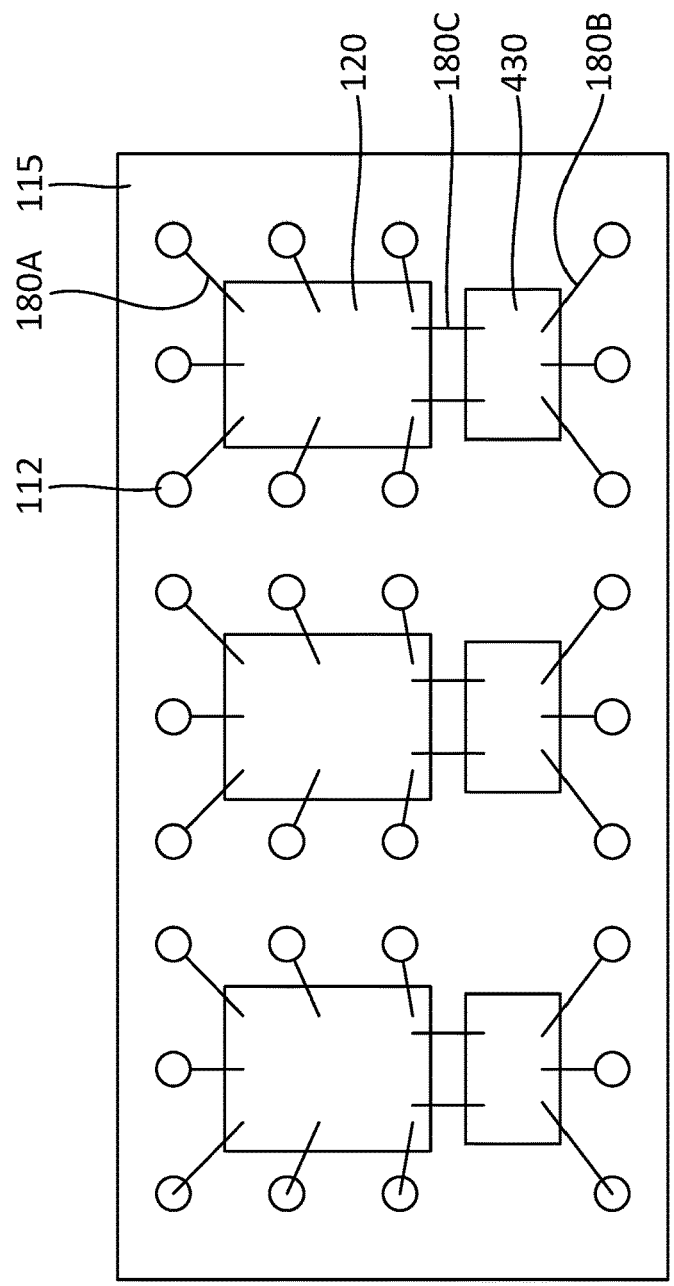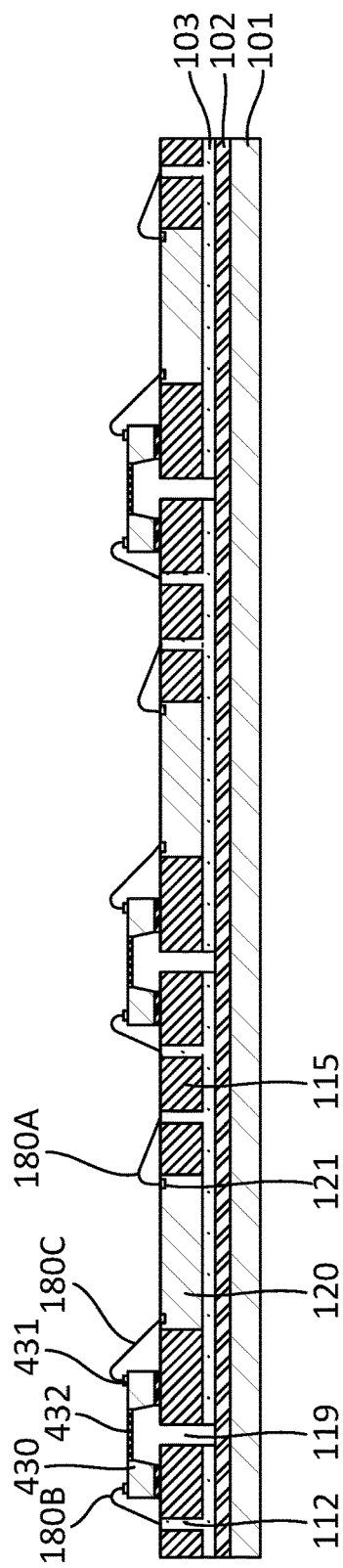
FIG.51A
FIG.51B

SEMICONDUCTOR DEVICES AND RELATED METHODS

CROSS-REFERENCE TO RELATED APPLICATIONS/INCORPORATION BY REFERENCE

This application is a continuation of U.S. patent application Ser. No. 16/505,957, filed Jul. 9, 2019, which is hereby incorporated herein by reference in its entirety.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIG. 2 shows perspective view of an example method for manufacturing an example semiconductor device.

FIGS. 3A and 3B show perspective and cross-sectional view of an example method for manufacturing an example semiconductor device.

FIGS. 6A, 6B and 6C show perspective, cross-sectional and enlarged cross-sectional view of an example method for manufacturing an example semiconductor device.

FIGS. 8A, 8B and 8C show perspective, cross-sectional and enlarged cross-sectional view of an example method for manufacturing an example semiconductor device.

FIGS. 10A and 10B show perspective and cross-sectional view of an example method for manufacturing an example semiconductor device.

FIGS. 21A and 21B show perspective and cross-sectional view of an example method for manufacturing an example semiconductor device.

FIGS. 25A and 25B show perspective and cross-sectional view of an example method for manufacturing an example semiconductor device.

FIGS. 32A and 32B show perspective and cross-sectional view of an example method for manufacturing an example semiconductor device.

FIGS. 35A and 35B show perspective and cross-sectional view of an example method for manufacturing an example semiconductor device.

FIGS. 40A and 40B show top plane and cross-sectional view of an example method for manufacturing an example semiconductor device.

FIGS. 46A, 46B, 46C and 46D show perspective, top plane, cross-sectional and enlarged cross-sectional view of an example method for manufacturing an example semiconductor device.

FIGS. 47A, 47B and 47C show perspective, cross-sectional and enlarged cross-sectional view of an example method for manufacturing an example semiconductor device.

FIGS. 49A, 49B, 49C and 49D show perspective, cross-sectional, top plane and enlarged cross-sectional view of an example method for manufacturing an example semiconductor device.

FIGS. 51A and 51B show perspective and cross-sectional view of an example method for manufacturing an example semiconductor device.

Figure 1:
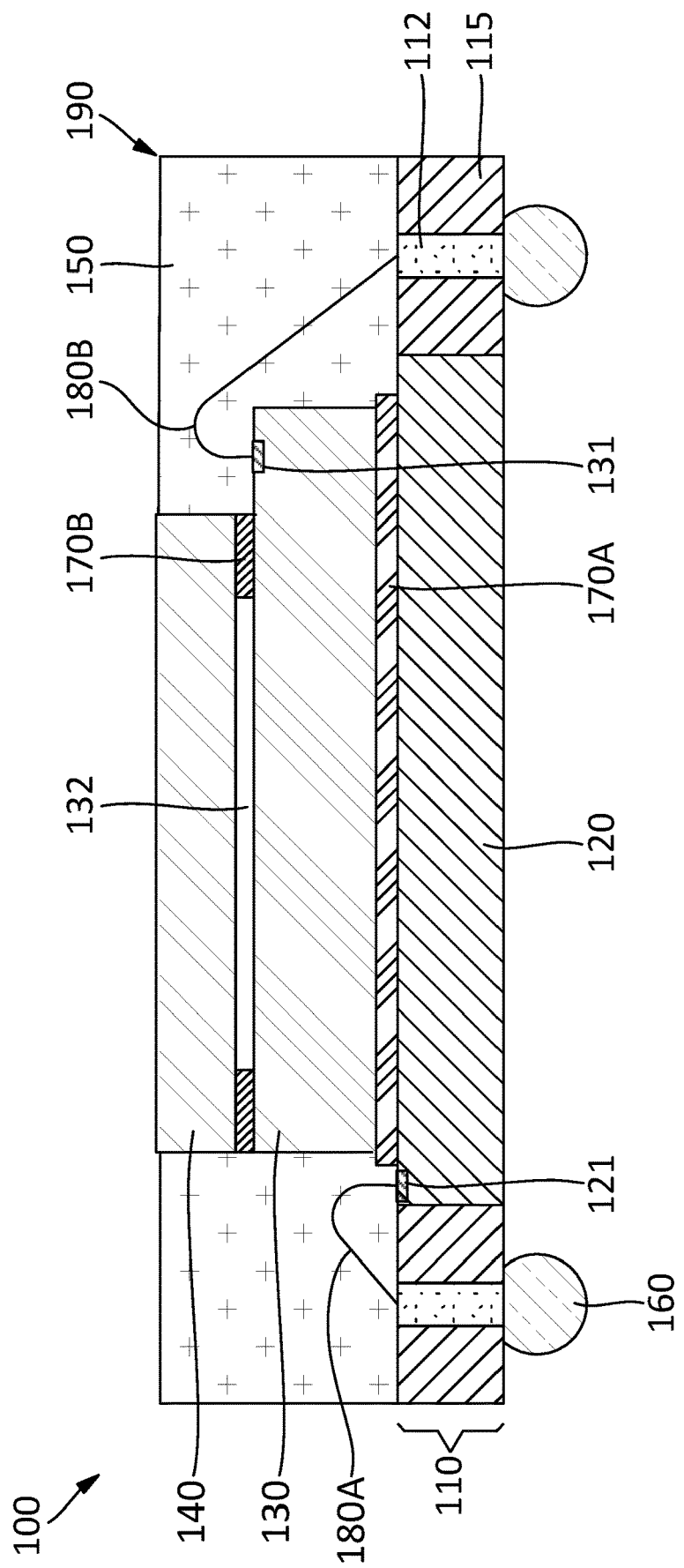
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The term "coplanar" can describe surfaces that, within manufacturing tolerances, extend along or adjacent a same plane. In some examples, surfaces can be coplanar when they extend adjacent the same plane substantially parallel to each other within approximately 10 microns.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device can comprise (a) a first substrate comprising a first substrate top side, a first substrate bottom side, a first substrate sidewall, a first encapsulant extending from the first substrate bottom side to the first substrate top side, and a first substrate interconnect extending from the substrate bottom side to the substrate top side and coated by the first encapsulant, (b) a first electronic component embedded in the first substrate and comprising a first component top side, a first component bottom side, and a first component sidewall coated by the first encapsulant, (c) a second electronic component on the first substrate and comprising a second component top side comprising a second component terminal and a second active region, a second component bottom side coupled to the first substrate top side, and a second component sidewall, (d) a first internal interconnect coupling the second component terminal to the first substrate interconnect, and (e) a cover structure on the first substrate and covering the second component sidewall and the first internal interconnect.

In one example, an electronic device can comprise (a) a first substrate comprising a first substrate top side, a first substrate bottom side, a first substrate sidewall, a first encapsulant extending from the first substrate bottom side to the first substrate top side, a first substrate interconnect extending from the substrate bottom side to the substrate top side and coated by the first encapsulant, and a second substrate interconnect extending from the substrate bottom side to the substrate top side and coated by the first encapsulant (b) a first electronic component coupled to the first substrate and comprising a first component top side exposed from the first encapsulant and comprising a first component terminal and a first active region, a first component bottom side, and a first component sidewall coated by the first encapsulant, (c) a second electronic component coupled to the first substrate and comprising a second component top side exposed from the first encapsulant and comprising a second component terminal and a second active region, a second component bottom side, and a second component sidewall coated by the first encapsulant (d) a first internal interconnect coupling the first component terminal to the first substrate interconnect, (e) a second internal interconnect coupling the second component terminal to the second substrate interconnect, and (f) a cover structure on the first substrate.

In one example, a method can comprise (a) providing a first substrate comprising a first encapsulant extending from a first substrate bottom side to a first substrate top side, and a first substrate interconnect extending from the substrate bottom side to the substrate top side, (b) providing a first electronic component coupled to the first substrate and comprising a first component top side exposed from the substrate top side, a first component bottom side, a first active region, and a first component sidewall between the first component top side and the first component bottom side, (c) providing a second electronic component coupled to the first substrate and comprising, a second component top side exposed from the substrate top side, a second component bottom side, a second active region, and a second component sidewall between the second component top side and the second component bottom side, (d) providing a first internal interconnect coupling the second electronic component to the first substrate interconnect, and (e) providing a cover structure on the first substrate; wherein providing the first substrate can comprise providing the first encapsulant coating the first component sidewall and the first substrate interconnect.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise a substrate 110, electronic components 120 and 130, a cap 140, an cover structure 150, external interconnects 160, adhesives 170A and 1708 and internal interconnects 180A and 1808.

Substrate 110 can comprise an encapsulant 115 and substrate interconnects 112. Electronic component 120 can comprise a terminal 121. Electronic component 130 can comprise a terminal 131 and a MEMS (Micro-Electro Mechanical System) region 132.

Substrate 110, cap 140, cover structure 150, external interconnects 160, adhesives 170A and 1708 and internal interconnects 180A and 1808 can be referred to as a semiconductor package 190, and can provide electronic components 120 and 130 with protection from external elements and/or environmental exposure. Additionally, semiconductor package 190 can provide electrical coupling between an external component and external interconnects 160.

FIGS. 2 to 15 show various drawings of an example method for manufacturing semiconductor device 100. FIG. 2 shows perspective view of an example method for manufacturing an example semiconductor device 100 at an early stage of manufacture.

In the example shown in FIG. 2, a substantially planar carrier 101 can be prepared. Carrier 101 can be referred to as a plate, a board, a wafer, a panel or a strip. Carrier 101 can include, for example, but not limited to, steel, stainless steel, aluminum, copper, glass or a wafer. Carrier 101 can have a thickness in the range from approximately 500 µm (micrometers) to approximately 1500 µm. Carrier 101 can allow handling of multiple components, during attachment of electronic components 120 and 130, encapsulation, formation of an opening in encapsulant 115, and plating and/or formation of interconnections, in an integrated manner. Carrier 101 can be commonly applied to different examples of this disclosure.

Temporary bond layer 102 can be formed on a surface of carrier 101. Temporary bond layer 102 can be formed on the surface of carrier 101 using a coating process, such as spin coating, doctor blade, casting, painting, spray coating, slot die coating, curtain coating, slide coating or knife over edge coating; a printing process, such as screen printing, pad printing, gravure printing, flexographic coating or offset printing; an inkjet printing process with features intermediate between coating and printing; or direct attachment of an adhesive film or an adhesive tape. Temporary bond layer 102 can be referred to as a temporary adhesive film or a temporary adhesive tape. Temporary bond layer 102 can be, for example, a thermally releasable tape (film) or a UV releasable tape (film), and/or can be weakened in its bonding strength or is removed by heat or UV irradiation. In some examples, temporary bond layer 102 can have a weakened bonding strength or can be removed by physical and/or chemical external forces. Temporary bond layer 102 can have a thickness in the range from approximately 50 µm to approximately 150 µm. Temporary bond layer 102 can allow separation of carrier 101 to form external interconnects 160. Temporary bond layer 102 can be commonly applied to different examples of this disclosure.

Conductive layer 103 can be formed on a surface of temporary bond layer 102. Conductive layer 103 can be referred to as a seed layer or a base layer. In some examples, conductive layer 103 can be made of, but not limited to, titanium, tungsten, titanium/tungsten, copper, gold, silver, palladium, or nickel. In some examples, conductive layer 103 can be formed using, but not limited to, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Conductive layer 103 can have a thickness in the range from approximately 500 Å to approximately 3000 Å. Conductive layer 103 can facilitate forming substrate interconnects 112 at a later stage of manufacture. Conductive layer 103 can be commonly applied to different examples of this disclosure.

FIGS. 3A and 3B show perspective and cross-sectional views semiconductor device 100 at a later stage of manufacture. In the example shown in FIGS. 3A and 3B, electronic component 120 can be adhered to conductive layer 103 provided on carrier 101. In some examples, electronic component 120 can be arrayed on or adhered to conductive layer 103 in a matrix configuration having rows and/or columns. In some examples, electronic component 120 can be adhered to conductive layer 103 using an adhesive, an adhesive film or an adhesive tape. Electronic component 120 can have a top side, a bottom side opposite to the top side, and a sidewall connecting the top side and the bottom side. In some examples, the top side can have an active region, and the bottom side can have a non-active region. The bottom side of electronic component 120 can be adhered to conductive layer 103 of carrier 101. The top side of electronic component 120 can comprise at least one terminal 121. In some examples, terminal 121 can comprise or be referred to as a die pad, a bond pad, or a solder bump, or a pillar bump. Terminal 121 can have a width in the range from approximately 2 μm to approximately 80 μm. Electronic component 120 can be referred to as a semiconductor die or a semiconductor chip. In some examples, the active region of electronic component 120 can comprise processing circuitry to process an electrical signal received from electronic component 130. In some examples, the active region of electronic component 120 can comprise an application specific integrated circuit, a logic die, a micro control unit, a memory, a digital signal processor, an analog to digital converter, a network processor, a power management unit, an audio processor, an RF circuit, or a wireless baseband system on chip processor. Electronic component 120 can have a thickness in the range from approximately 50 μm to approximately 200 μm.

Figure 4A:
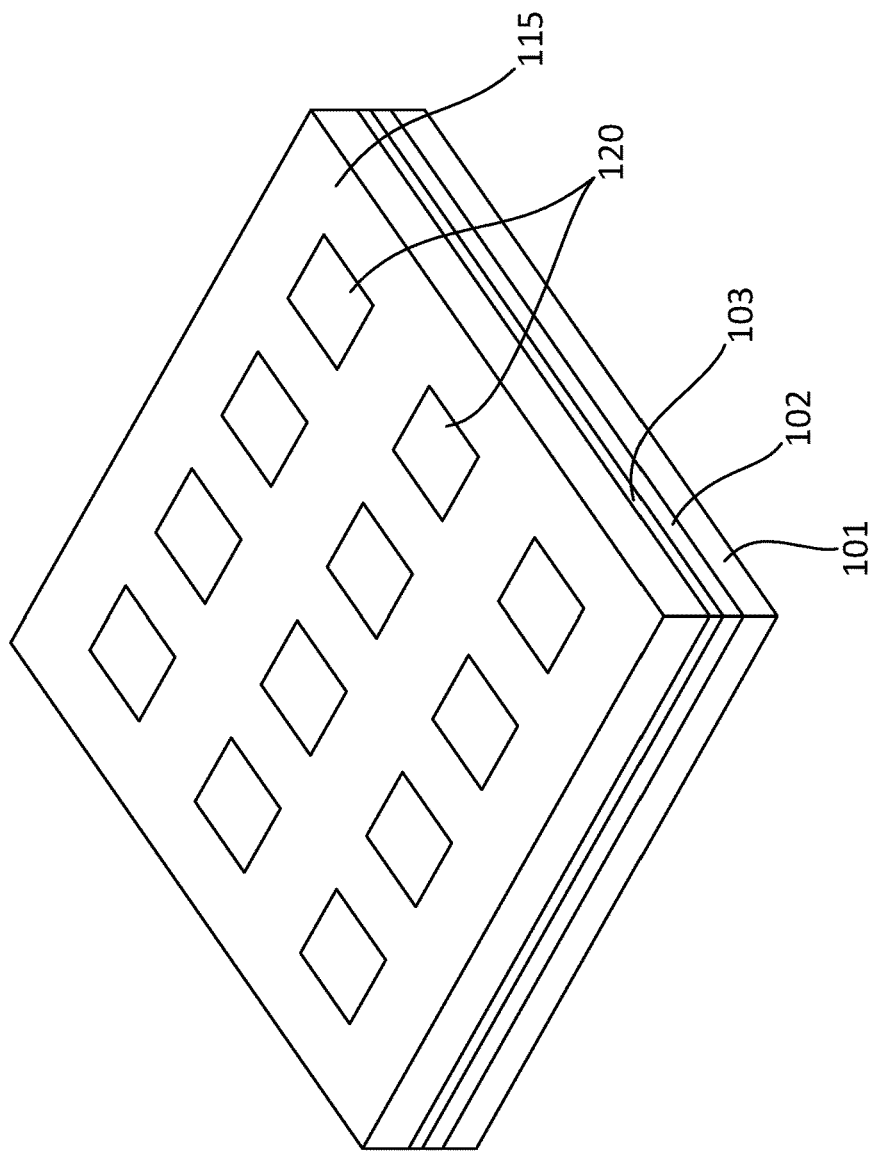
FIGS. 4A and 4B show perspective and cross-sectional view of an example method for manufacturing an example semiconductor device.
Figure 4B:
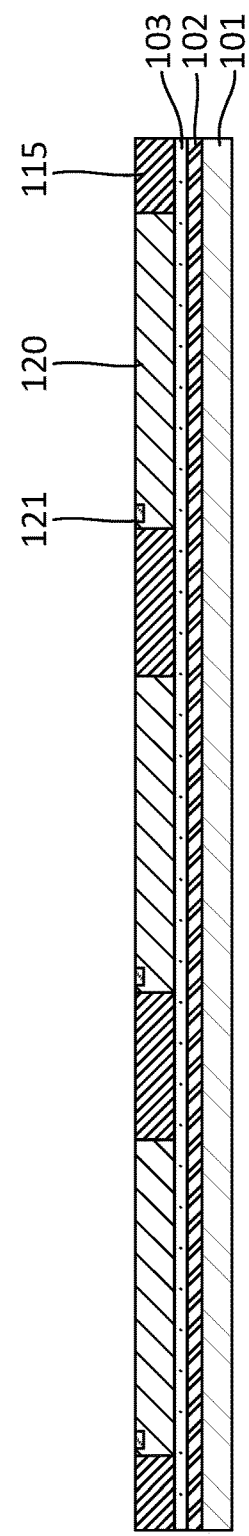
Figure 5A:
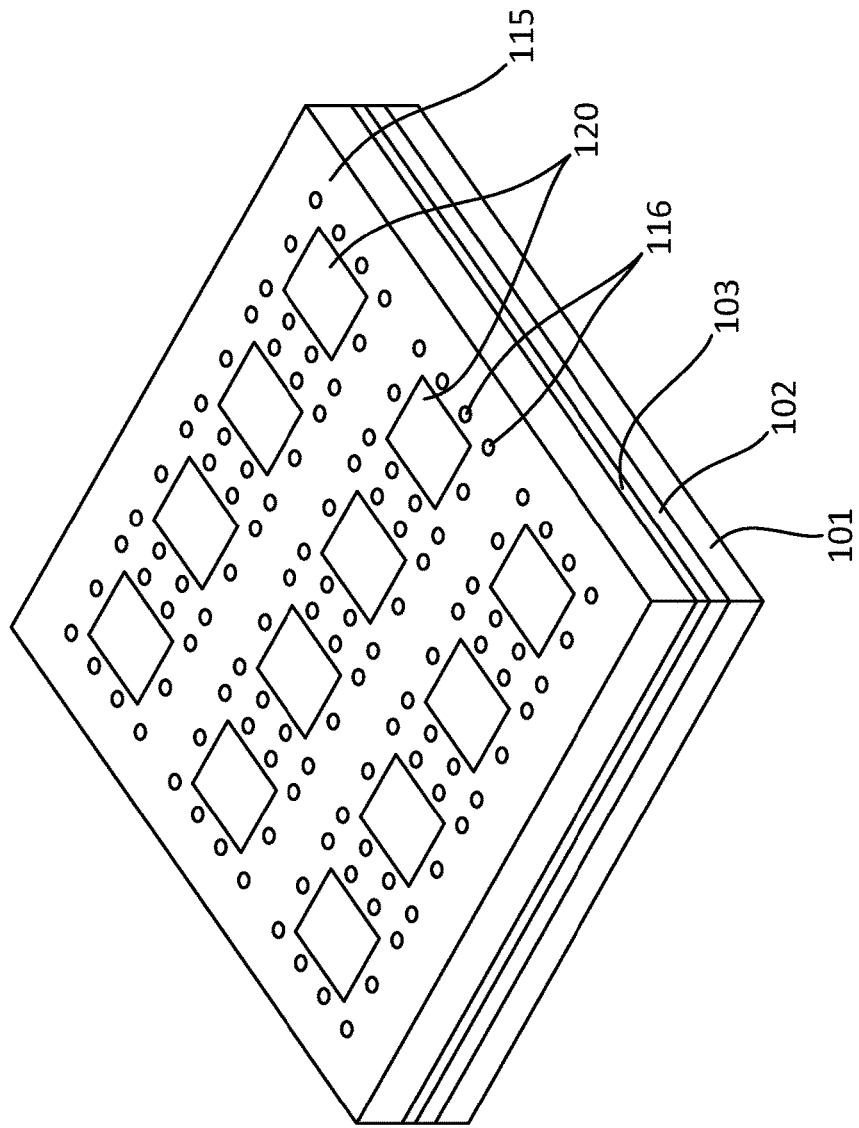
FIGS. 5A, 5B, 5C and 5D show perspective, cross-sectional, top plane and enlarged cross-sectional view of an example method for manufacturing an example semiconductor device.
Figure 5B:
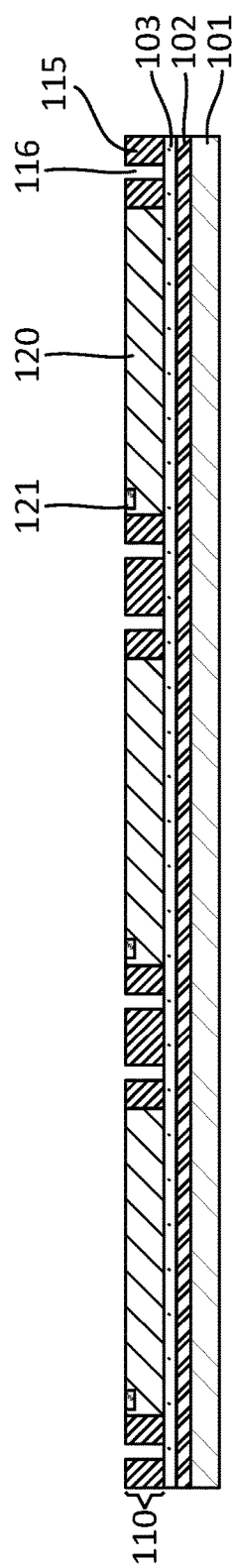
Figure 5C:
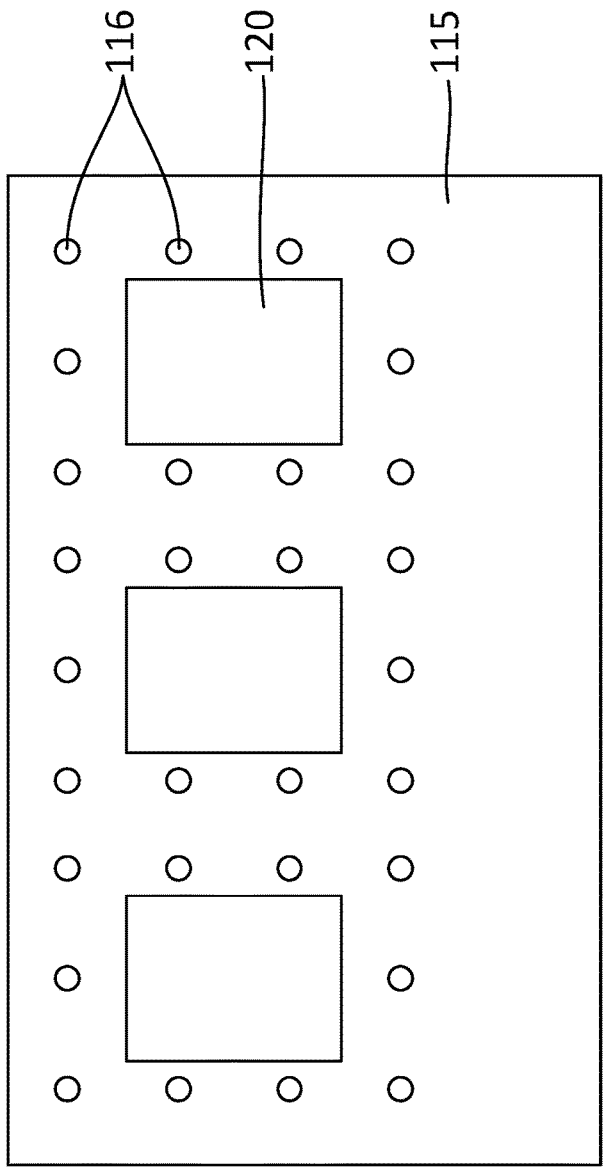
Figure 5D:
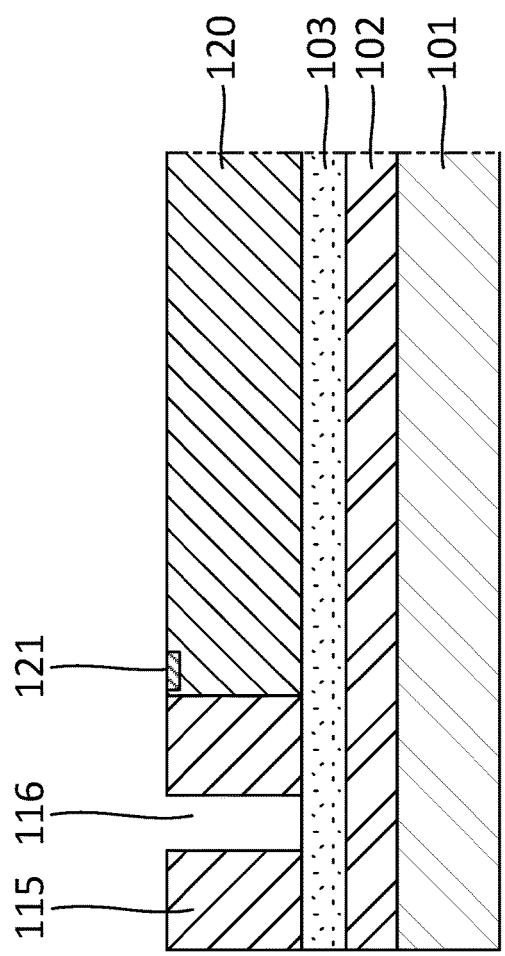

FIGS. 4A and 4B show perspective and cross-sectional view of semiconductor device 100 at a later stage of manufacture. In the example shown in FIGS. 4A and 4B, encapsulant 115 can be formed on surfaces of conductive layer 103 and electronic component 120, such that electronic component 120 is embedded in substrate 110. In some examples, encapsulant 115 can coat or be brought into contact with the sidewall of electronic component 120. In addition, encapsulant 115 can be brought into contact with a surface of conductive layer 103 not overlapping the bottom side of electronic component 120. In some examples, the top side of electronic component 120 can be substantially coplanar with the top side of encapsulant 115, and the top side of electronic component 120 can be exposed through the top side of encapsulant 115. In some examples, the bottom side of electronic component 120 can be substantially coplanar with the bottom side of encapsulant 115, and the bottom side of electronic component 120 can be exposed through the bottom side of encapsulant 115.

In some examples, encapsulant 115 can comprise or be referred to as an epoxy molding compound, a molding layer, or a sealant. In some examples, encapsulant 115 can comprise an organic resin, an inorganic filler, a curing agent, a catalyst, a coupling agent, a colorant, and/or a flame retardant. Molding based on encapsulant 115 can be formed by any of a variety of processes. In some examples, encapsulant 115 can be formed by, but not limited to, film assist molding, compression molding, transfer molding, liquid-phase encapsulant molding, vacuum lamination, or paste printing. Encapsulant 115 can have a thickness in the range from approximately 50 μm to approximately 200 μm. Encapsulant 115 can protect electronic component 120 from external elements and/or environmental exposure. In some examples, encapsulant 115 can comprise or be referred to as a body of substrate 110, such that electronic component 120 can be considered as embedded in substrate 110.

FIGS. 5A, 5B, 5C and 5D show perspective, cross-sectional, top plane and enlarged cross-sectional views of semiconductor device 100 at a later stage of manufacture. In the example shown in FIGS. 5A, 5B, 5C and 5D, openings 116 can be formed in encapsulant 115. In some examples, openings 116 can be formed in regions spaced apart from the sidewall of electronic component 120 while passing through encapsulant 115. In some examples, openings 116 can include a plurality of openings formed around electronic component 120. A surface of conductive layer 103 can be exposed by openings 116. Openings 116 can be referred to as penetration holes or vias, such as through-mold-vias (TMV). In some examples, openings 116 can be formed by, but not limited to, laser drilling, mechanical drilling or/and a chemical etching process. Openings 116 can have a width in the range from approximately 5 μm to approximately 20 μm. Openings 116 can allow formation of substrate interconnects 112.

Figure 6C:
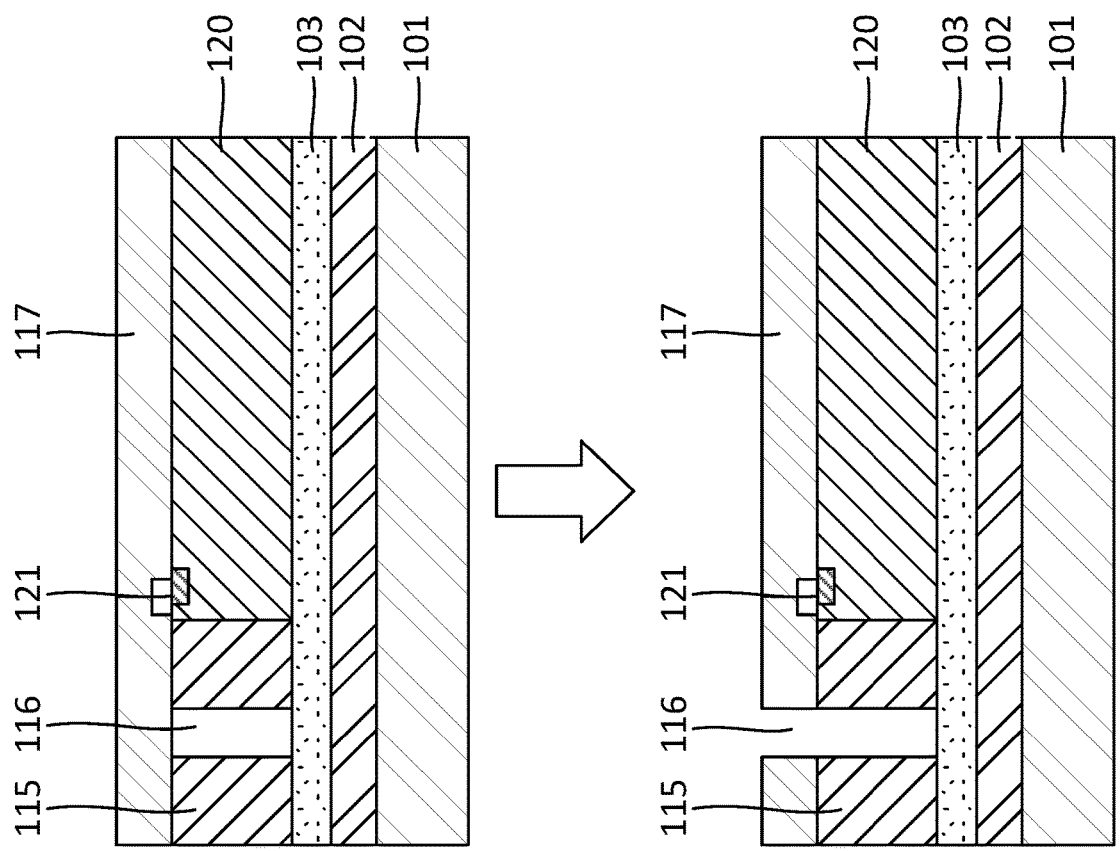

FIGS. 6A, 6B and 6C show perspective, cross-sectional and enlarged cross-sectional views of semiconductor device 100 at a later stage of manufacture. In the example shown in FIGS. 6A, 6B and 6C, photosensitive film 117 can be laminated on the top sides of electronic component 120 and encapsulant 115. In some examples, photosensitive film 117 can be formed on the top sides of electronic component 120 and encapsulant 115 by spin coating, doctor blade, casting, painting, spray coating, slot die coating, curtain coating, or a knife over edge coating. In some examples, photosensitive film 117 can cover openings 116 formed in encapsulant 115. In some examples, openings can be formed in photosensitive film 117 as the result of patterning to expose openings 116. Accordingly, openings of photosensitive film 117 can be connected with openings 116 of encapsulant 115. Photosensitive film 117 can be referred to as a dry film, a dry film resist, a photoresist, or a photoresist film. Photosensitive film 117 can prevent substrate interconnects 112 from being formed on the top sides of electronic component 120 and/or encapsulant 115 during formation of substrate interconnects 112, which will later be described.

Figure 7A:
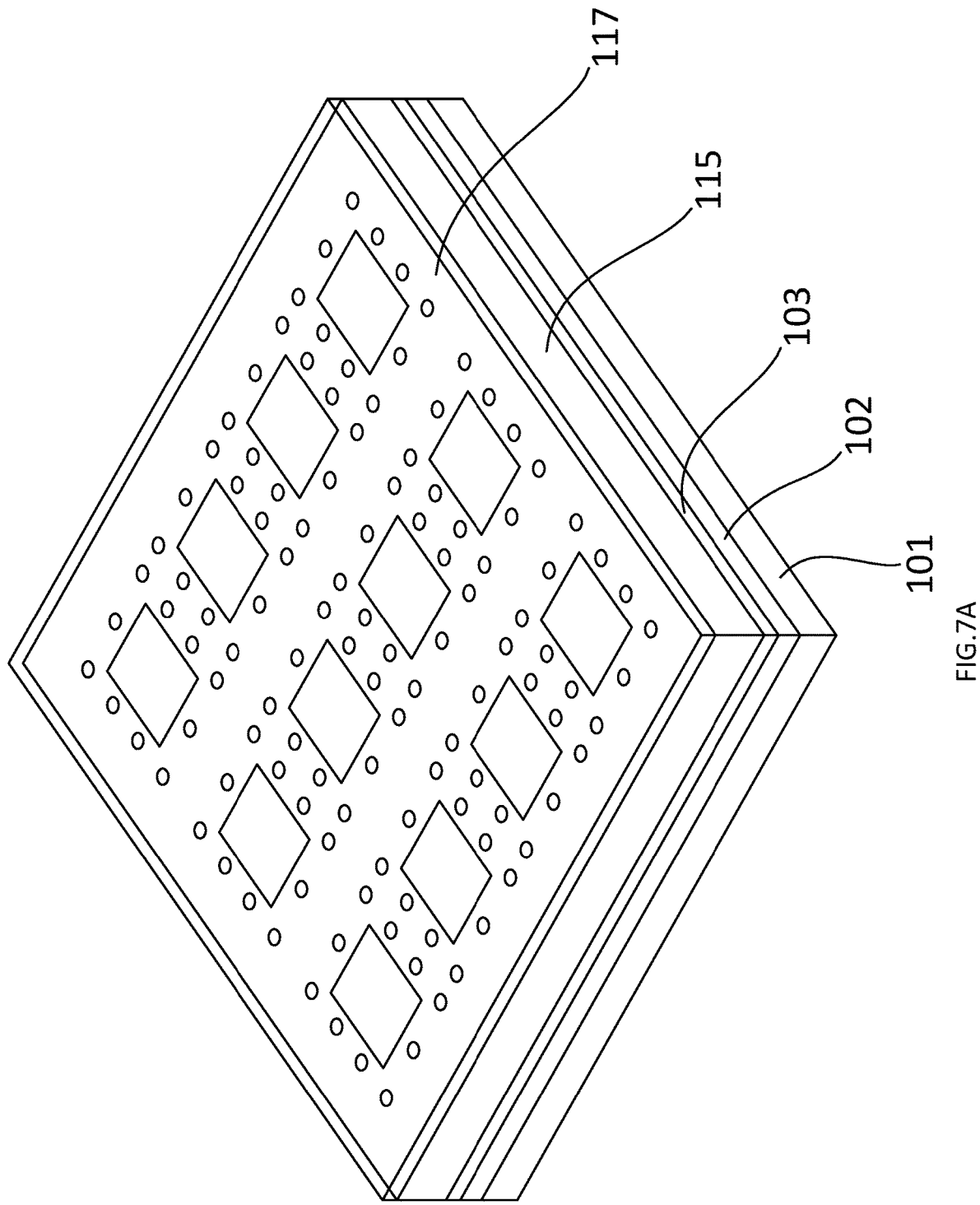
FIGS. 7A, 7B and 7C show perspective, cross-sectional and enlarged cross-sectional view of an example method for manufacturing an example semiconductor device.
Figure 7B:
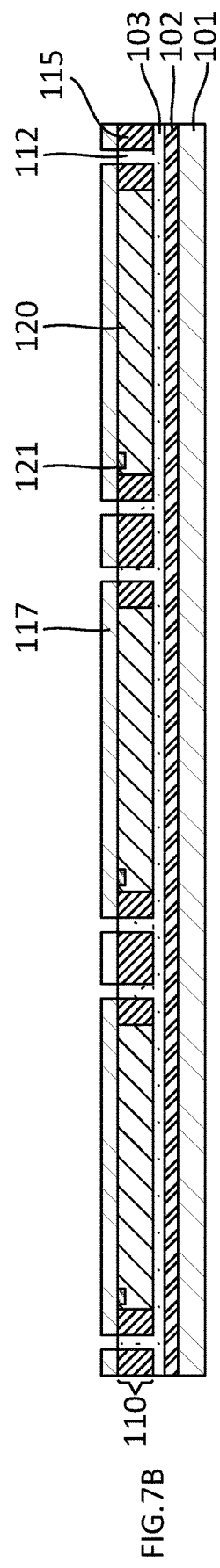
Figure 7C:
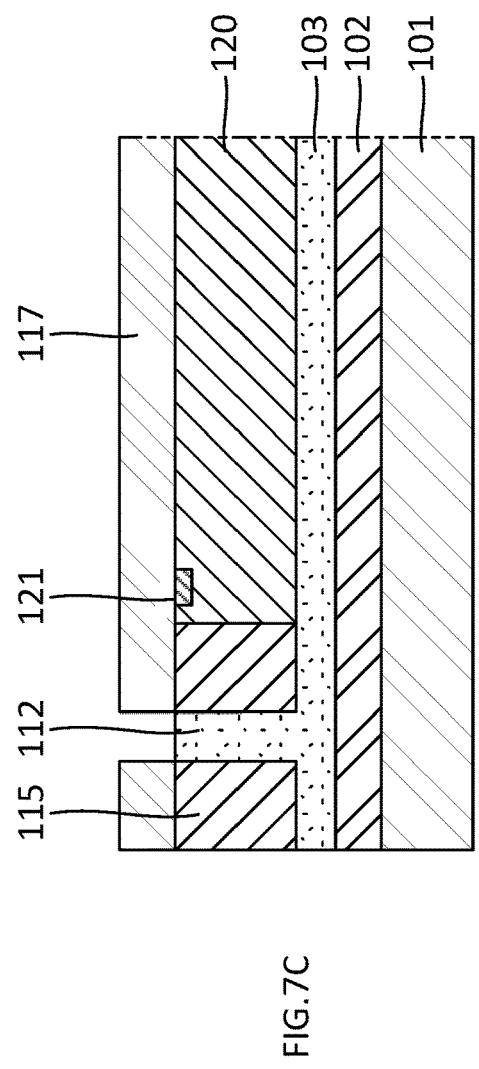

FIGS. 7A, 7B and 7C show perspective, cross-sectional and enlarged cross-sectional views of semiconductor device 100 at a later stage of manufacture. In the example shown in FIGS. 7A, 7B and 7C, substrate interconnects 112 can be formed in openings 116 of encapsulant 115. In some examples, substrate interconnects 112 can be filled in openings 116 of encapsulant 115. In some examples, substrate interconnects 112 can be formed by electroplating through conductive layer 103 to gradually increase the height and/or thickness of substrate interconnects 112. The thickness or height of substrate interconnects 112 can be similar to or the same with the thickness or height of encapsulant 115 at an end stage of electroplating. In some examples, substrate interconnects 112 can be formed by sputtering, electroless plating, PVD, CVD, MOCVD, ALD, LPCVD or PECVD, in addition to and/or instead of electroplating. In some examples, substrate interconnects 112 can be made from copper, gold, silver, palladium, or nickel. Substrate interconnects 112 can be referred to as pillars, posts, vias, TMVs, vertical paths, or conductive paths. Substrate interconnects 112 can have a width in the range from approximately 5 μm to approximately 20 μm and a thickness in the range from approximately 50 μm to approximately 200 μm. As will be later described, substrate interconnects 112 can electrically and mechanically connect internal interconnects 180A and 180B and external interconnects 160 to each other. In some examples, encapsulant 115 and substrate interconnects 112 can be regarded as components of substrate 110.

Figure 8A:
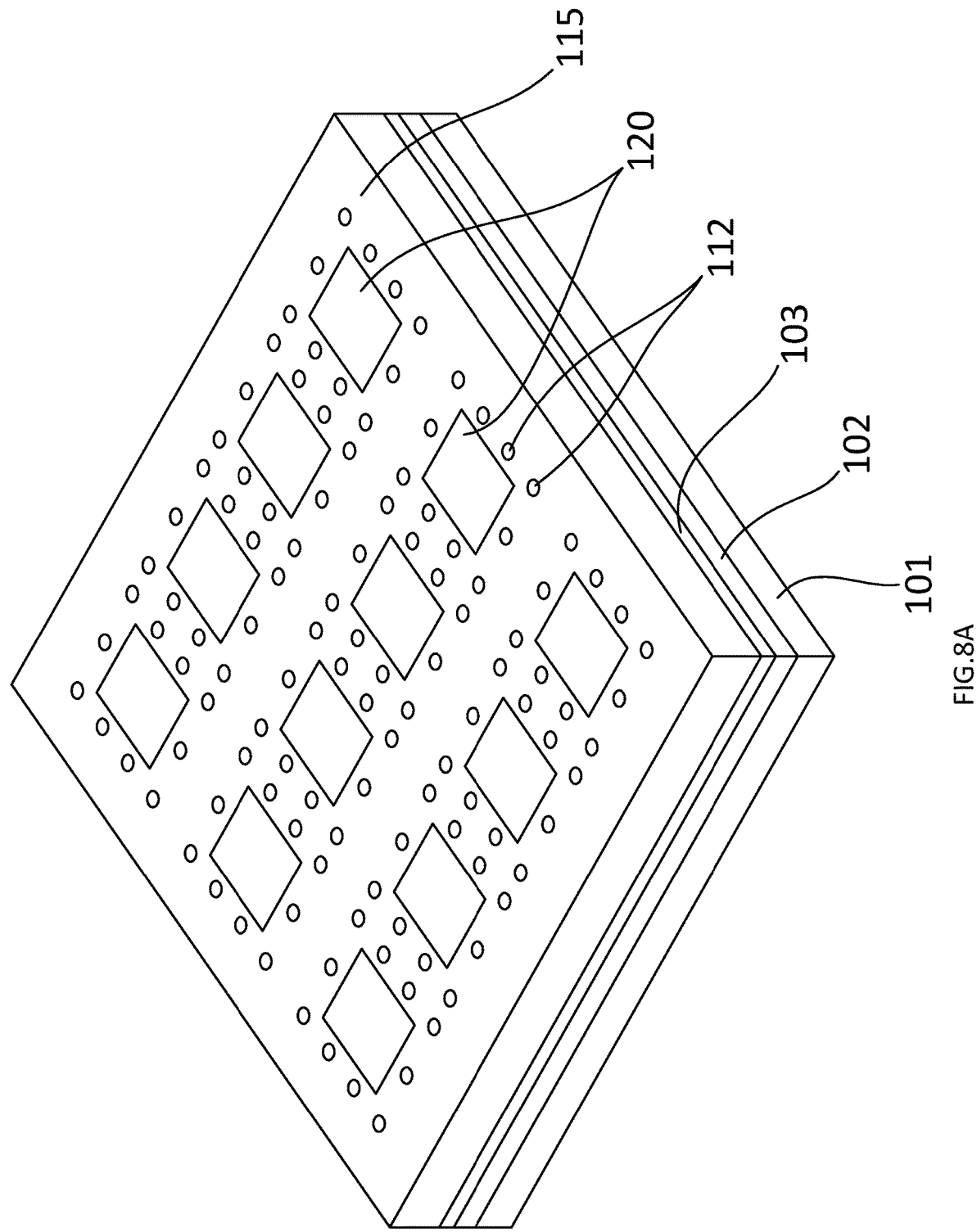

FIGS. 8A, 8B and 8C show perspective, cross-sectional and enlarged cross-sectional views of semiconductor device 100 at a later stage of manufacture. In the example shown in FIGS. 8A, 8B, 8C, photosensitive film 117 can be removed from the top sides of encapsulant 115 and/or electronic component 120. In some examples, photosensitive film 117 can be removed by heat, light, a chemical solution and/or a physical external force. Top sides of substrate interconnects 112 can be made substantially coplanar with the top sides of electronic component 120 and/or encapsulant 115. In some examples, the top sides of substrate interconnects 112 can be exposed through the top side of encapsulant 115, or the sidewalls of substrate interconnects 112 can be coated by encapsulant 115. In some examples, substrate interconnects 112 can extend from the bottom side to the top side of substrate 110.

Substrate 110 can include encapsulant 115 and substrate interconnects 112, and can be configured such that electronic component 120 is embedded in encapsulant 115 and/or in substrate 110, providing reduced thickness for semiconductor device 100. Encapsulant 115 extends from the bottom side to the top side of substrate 110

Figure 9A:
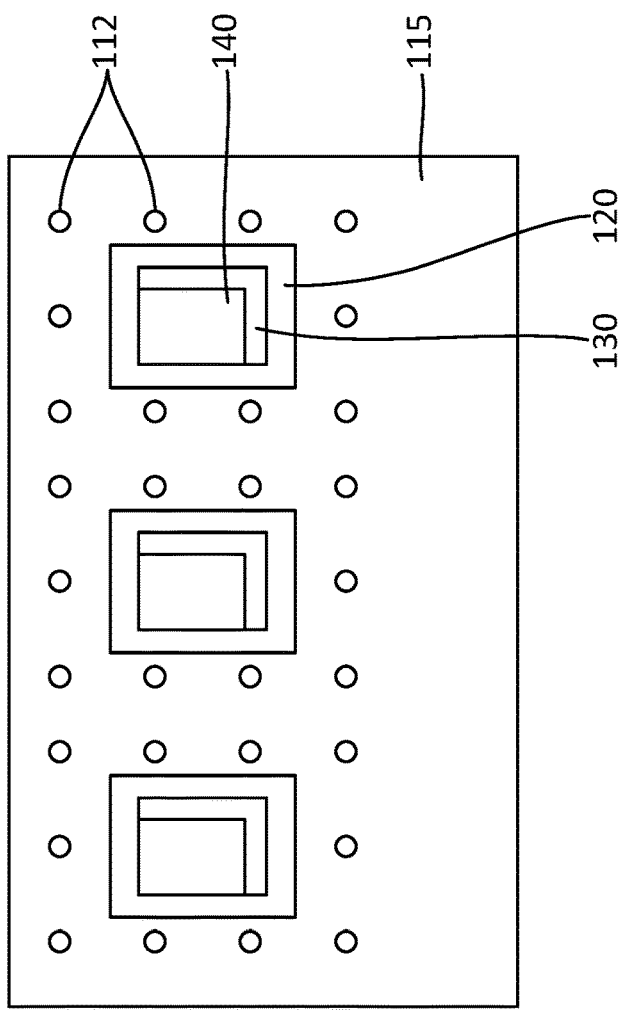
FIGS. 9A and 9B show perspective and cross-sectional view of an example method for manufacturing an example semiconductor device.
Figure 9B:
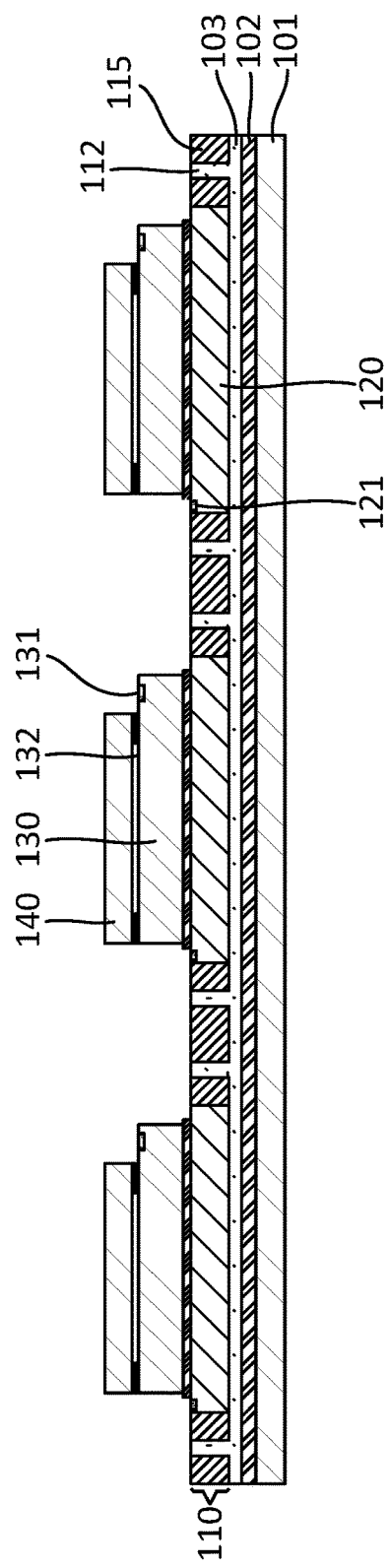

FIGS. 9A and 9B show perspective and cross-sectional views of semiconductor device 100 at a later stage of manufacture. In the example shown in FIGS. 9A and 9B, electronic component 130 can be attached to substrate 110 or to electronic component 120 embedded in substrate 110. In some examples, electronic component 120 can have a larger width than electronic component 130. In such examples, the bottom side of electronic component 130 can be adhered to the top side of electronic component 120 or the top side of substrate 110 using adhesive (170A of FIG. 1). In some examples, electronic component 120 can have a smaller width than electronic component 130. In such examples, a portion of the bottom side of electronic component 130 can be adhered to the top side of electronic component 120 using adhesive 170A, and another portion of the bottom side of electronic component 130 can be adhered to the top side of encapsulant 115 using adhesive 170A. The top side of electronic component 130 can comprise terminal 131. In some examples, terminal 131 can comprise or be referred to as a die pad, a bond pad, a solder bump, or a pillar bump. Terminal 131 can have a width in the range from approximately 2 µm to approximately 80 µm. Electronic component 130 can comprise or be referred to as a MEMS device, a semiconductor die or a semiconductor chip. Electronic component 130 can have a thickness in the range from approximately 200 µm to approximately 300 µm. In some examples, electronic component 130 can comprise an active region on its top side, such as a MEMS or micro-electro-mechanical component on its top side. In some examples, electronic component 130 can further comprise a cap 140 attached to its top side using adhesive (170B of FIG. 1) to protect MEMS region 132. A gap or a space can be provided between the bottom side of cap 140 and the top side or the active region of electronic component 130. Cap 140 can have a smaller width than electronic component 130, and can be attached without overlapping terminal 131 of electronic component 130. Cap 140 can be referred to as a cover or a lid. Cap 140 can be made from silicon, glass, metal or resin. Cap 140 can be translucent, whether transparent or semi-transparent, and/or can have a thickness in the range from approximately 200 µm to approximately 250 µm.

FIGS. 10A and 10B show perspective and cross-sectional views of semiconductor device 100 at a later stage of manufacture. In the example shown in FIGS. 10A and 10B internal interconnect 180A can electrically connect terminal 121 of electronic component 120 with substrate interconnects 112, and internal interconnect 180B can electrically connect terminal 131 of electronic component 130 with substrate interconnects 112. In some examples, internal interconnects 180A and 180B can electrically connect electronic component 120 and electronic component 130 to each other. In some examples, internal interconnects 180A and 180B can be referred to as wires or bonding wires. In some examples, internal interconnects 180A and 180B can have a loop height in the range from approximately 30 µm to approximately 70 µm and a diameter in the range from approximately 15 µm to approximately 25 µm. In some examples, internal interconnects 180A and 180B can be made from gold, copper or aluminum. In some examples, internal interconnect 180A can electrically connect electronic component 120 and substrate interconnects 112 to allow electrical connection of electronic component 120 to an external component. In some examples, internal interconnect 180B can electrically connect electronic component 130 and substrate interconnects 112 to allow electrical connection of electronic component 130 to an external component. In some examples, internal interconnect 180A or 180B can electrically connect electronic component 120 and electronic component 130 to each other, receiving and transmitting electrical signals from/to each other.

Figure 11:
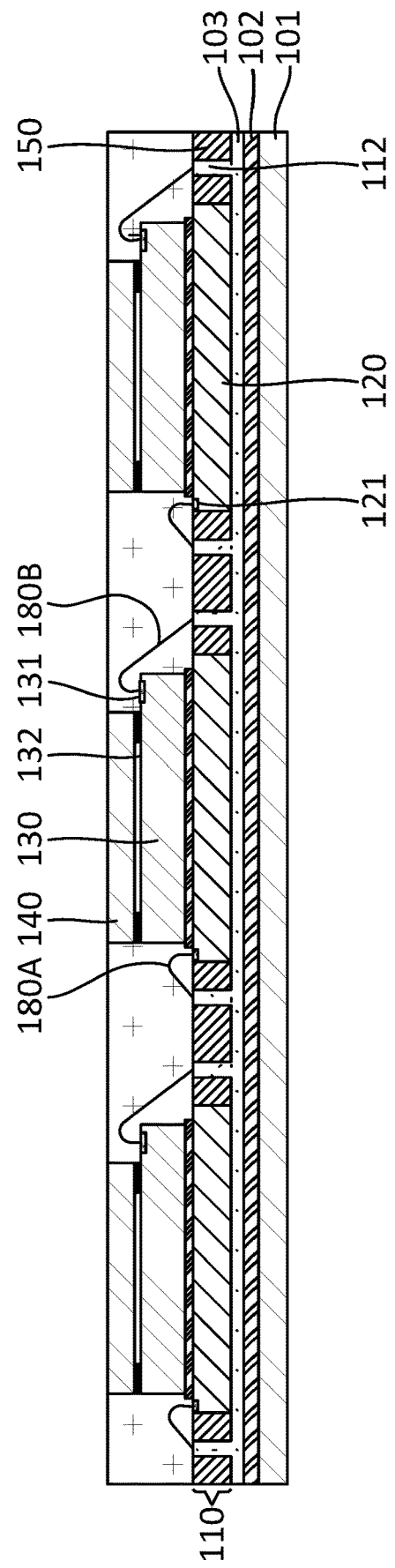
FIG. 11 shows cross-sectional view of an example method for manufacturing an example semiconductor device.

FIG. 11 shows cross-sectional view of semiconductor device 100 at a later stage of manufacture. In the example shown in FIG. 11, cover structure 150 can cover or coat electronic components 120 or 130 positioned on substrate 110, and internal interconnects 180A and 180B. In some examples, cover structure 150 comprises a cover encapsulant or cover molding layer, and substrate encapsulant comprises a substrate molding layer, where the cover molding layer coats the substrate molding layer. In some examples, cover structure 150 coats the sidewall of electronic component 130. In some examples, cover structure 150 covers the sidewall of cap 140, but can leave the top side of cap 140 exposed. In some examples, cover structure 150 coats the top side of electronic component 120 and the top side of electronic component 130 at least partially. In some examples, cover structure 150 can be brought into contact with substrate encapsulant 115 and substrate interconnects 112. In addition, in some examples, cover structure 150 can encapsulate the sidewalls and top sides of electronic components 120 and 130, except for bottom sides of electronic components 120 and 130, and can encapsulate internal interconnects 180A and 180B. In some examples, cover structure 150 may not encapsulate the top side of cap 140. Here, the top side of cap 140 can be exposed through cover structure 150 accordingly. In some examples adhesive 170A can be located between the bottom side of electronic component 130 and the top side of substrate 110 or the top side of electronic component 120 as can be seen in FIG. 1, and cover structure 150 comprises an encapsulant that coats a sidewall of adhesive 170 and a portion of the top side of adhesive 170 that extends beyond a footprint of electronic component 130.

Cover structure 150 can have a thickness in the range from approximately 450 µm to approximately 500 µm. Cover structure 150 can provide electronic components 120 and 130 and internal interconnects 180A and 180 with protection from external elements and/or environmental exposure. In some examples, cover structure 150 can be formed using similar encapsulant materials or processes as those described for encapsulant 115 of substrate 110.

Figure 12:
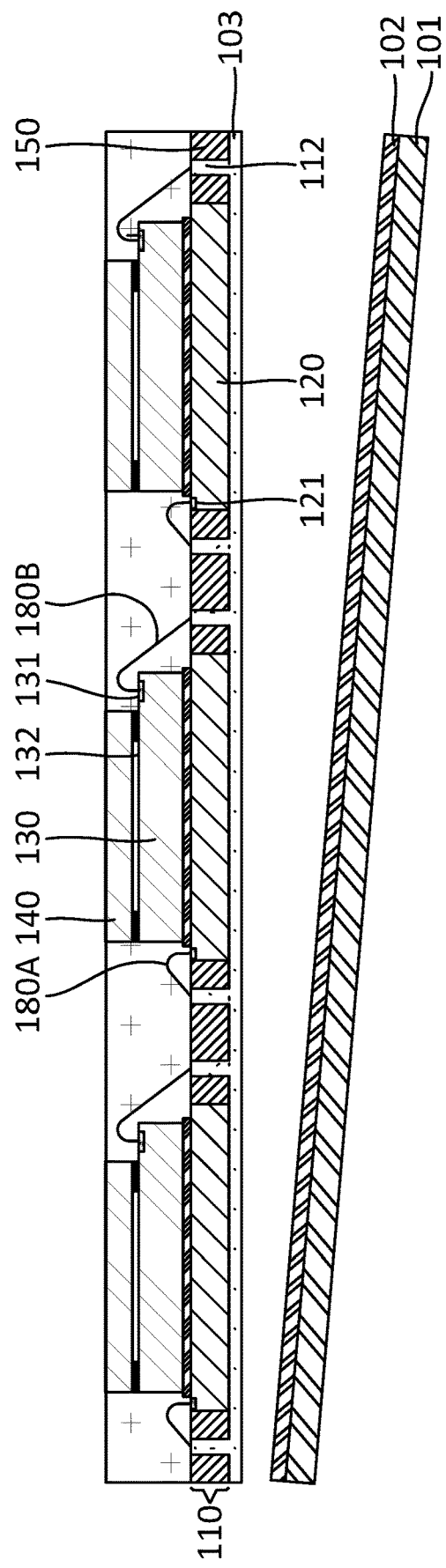
FIG. 12 shows cross-sectional view of an example method for manufacturing an example semiconductor device.

FIG. 12 shows cross-sectional view of semiconductor device 100 at a later stage of manufacture. In the example shown in FIG. 12, carrier 101 can be separated from conductive layer 103. In some examples, temporary bond layer 102 can be separated from conductive layer 103 in a state in which it is attached to carrier 101. In some examples, heat, light, a chemical solution and/or a physical external force can be provided, thereby removing or reducing a bonding strength of temporary bond layer 102. Accordingly, conductive layer 103 can be exposed.

Figure 13:
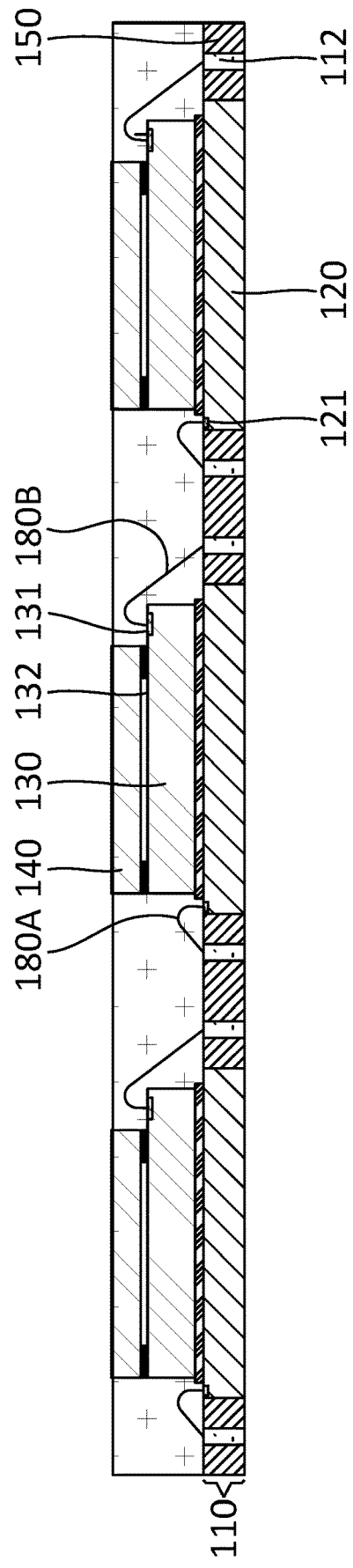
FIG. 13 shows cross-sectional view of an example method for manufacturing an example semiconductor device.

FIG. 13 shows cross-sectional view of semiconductor device 100 at a later stage of manufacture. In the example shown in FIG. 13, conductive layer 103 can be removed. In some examples, conductive layer 103 can be removed by mechanical grinding and/or chemical etching. Accordingly, the bottom sides of electronic component 120, substrate interconnects 112 and substrate encapsulant 115 can be exposed. In some examples, the bottom sides of electronic component 120, substrate interconnects 112 and substrate encapsulant 115 can be made substantially coplanar. In some examples, the bottom sides of electronic component 120 and substrate interconnects 112 can be exposed through the bottom side of encapsulant 115.

Figure 14:
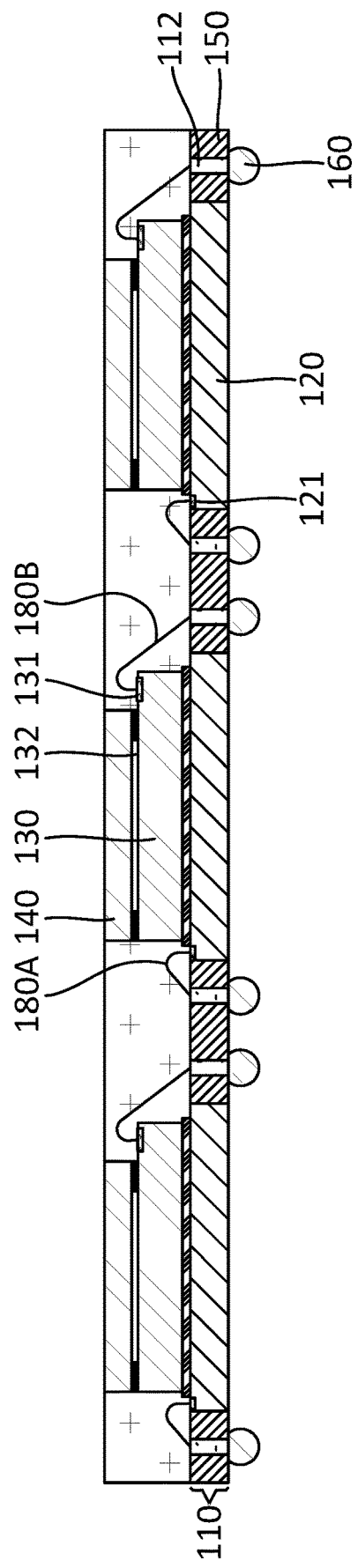
FIG. 14 shows cross-sectional view of an example method for manufacturing an example semiconductor device.

FIG. 14 shows cross-sectional view of semiconductor device 100 at a later stage of manufacture. In the example shown in FIG. 14, external interconnects 160 can be provided at bottom sides of substrate interconnects 112. External interconnect 160 can comprise or be connected to substrate interconnects 112 through a low melting point material. In some examples, external interconnects 160 can comprise of be referred to as solder balls, solder pads, or pad platings. In some examples, external interconnects 160 can be made from, but not limited to, Sn, Ag, Pb, Cu, Sn—Pb, Sn37-Pb, Sn95-Pb, Sn—Pb—Ag, Sn—Cu, Sn—Ag, Sn—Au, Sn—Bi or Sn—Ag—Cu. External interconnect 160 can have a thickness in the range from approximately 50 μm to approximately 150 μm. External interconnect 160 can allow mounting of semiconductor package 190 to an external device.

Figure 15:
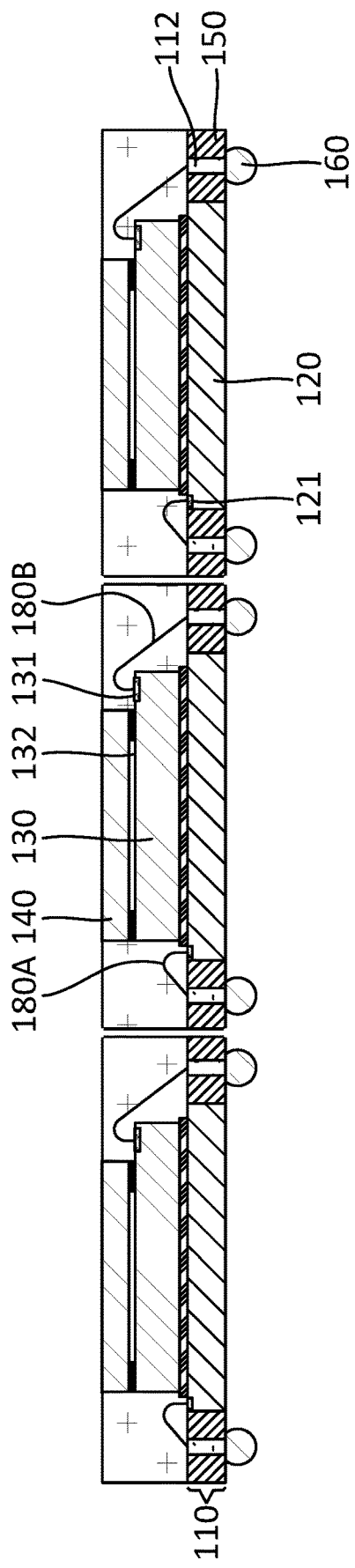
FIG. 15 shows cross-sectional view of an example method for manufacturing an example semiconductor device.

FIG. 15 shows cross-sectional view of semiconductor device 100 at a later stage of manufacture. In the example shown in FIG. 15, semiconductor device 100 can be singulated into discrete semiconductor devices. In some examples, semiconductor device 100 can be singulated into discrete semiconductor devices by a diamond blade or laser beam. In some examples, the sidewalls of substrate encapsulant 115 and cover structure 150 can be made substantially coplanar.

When singulated, semiconductor device 100 can correspond to the depiction shown in FIG. 1. As can be appreciated there, substrate interconnect 112 is represented as a conductive vertical via that extends from top to bottom of substrate 110, with its sidewall coated or directly contacted by encapsulant 115. In some examples, substrate interconnect 112 can be applied as a via structure that comprises a conductive via and a dielectric casing around the sidewall of the conductive via, where the sidewall of the dielectric casing can be coated by encapsulant 115 of substrate 110. In some examples such via structure can comprise a PCB insert, with the dielectric casing defined by one or more laminate layers having, for instance, inorganic or fiberglass strands. In some examples, such via structure can comprise a pre-molded insert, with the dielectric casing defined by a molding compound distinct from encapsulant 115.

Semiconductor device 100 having reduced dimensions can be achieved by the manufacturing method described. In some examples, as the thickness and width of semiconductor device 100 can be reduced by such manufacturing method, semiconductor device 100 can be suitably applied to a wearable device.

Figure 16:
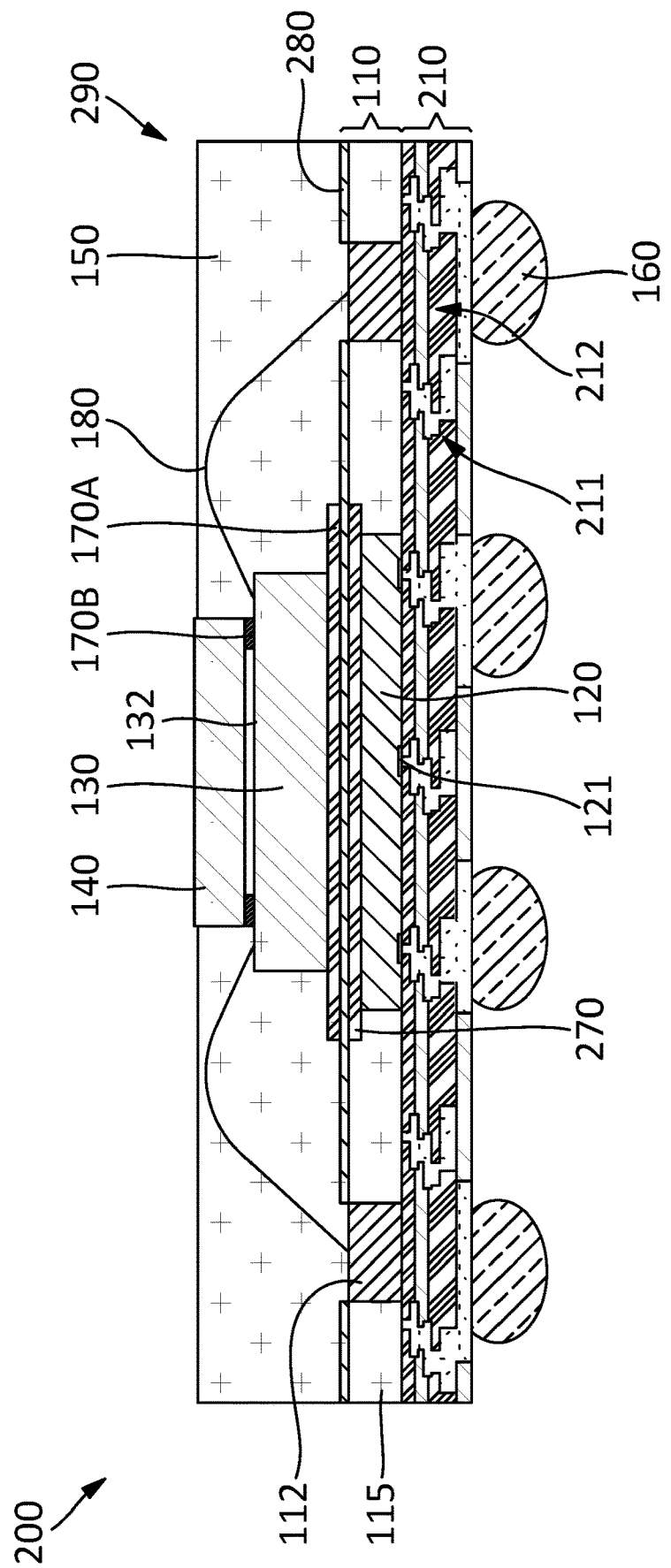
FIG. 16 shows a cross-sectional view of an example semiconductor device.

FIG. 16 shows a cross-sectional view of an example semiconductor device 200. In the example shown in FIG. 16, semiconductor device 200 can comprise substrates 110 and 210, electronic components 120 and 130, cap 140, cover structure 150, external interconnects 160, adhesives 170A and 170B and internal interconnects 180. In addition, semiconductor device 200 can comprise an adhesive 270 and/or an interface film 280.

Substrate 210 can comprise conductive structures 211 and dielectric structures 212. Adhesive 270 can be interposed between electronic component 120 and electronic component 130. Interface film 280 can be interposed between substrate 110 and cover structure 150.

Substrates 110 and 210, cap 140, cover structure 150, external interconnects 160, adhesives 170A, 170B and 270, internal interconnects 180 and interface film 280 can be collectively referred to as a semiconductor package 290, and/or can provide electronic components 120 and 130 with protection from external elements and/or environmental exposure. In addition, semiconductor package 290 can provide electrical coupling between an external component and external interconnects 160.

Figure 17:
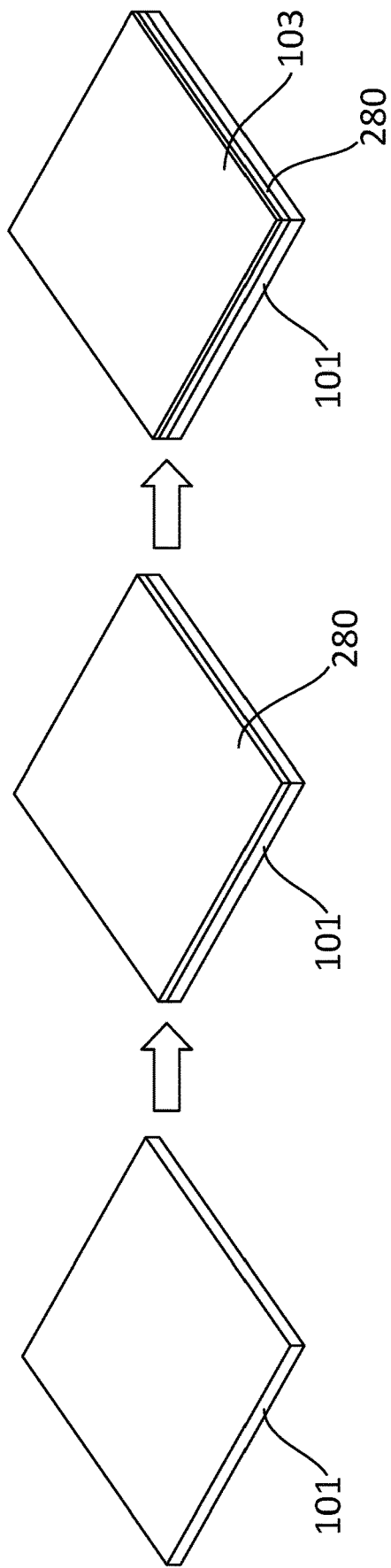
FIG. 17 shows perspective view of an example method for manufacturing an example semiconductor device.

FIGS. 17 to 30 show various drawings of an example method for manufacturing semiconductor device 200. FIG. 17 shows perspective view of an example method for manufacturing semiconductor device 200 at an early stage of manufacture.

In the example shown in FIG. 17, a substantially planar carrier 101 can be prepared. In addition, interface film 280 can be formed on a surface of carrier 101. Interface film 280 can be formed on the surface of carrier 101 using a coating process, such as spin coating, doctor blade, casting, painting, spray coating, slot die coating, curtain coating, slide coating or knife over edge coating; a printing process, such as screen printing, pad printing, gravure printing, flexographic coating or offset printing; an inkjet printing process with features intermediate between coating and printing; or direct attachment of an adhesive film or an adhesive tape. Interface film 280 can have a thickness in the range from approximately 50 μm to approximately 150 μm. Interface film 280 can be removed during the manufacture of semiconductor device 200. Alternatively, as described above, interface film 280 can be interposed between substrate 110 and cover structure 150 and can remain between substrate 110 and cover structure 150. Conductive layer 103 can be further formed on a surface of interface film 280.

Figure 18A:
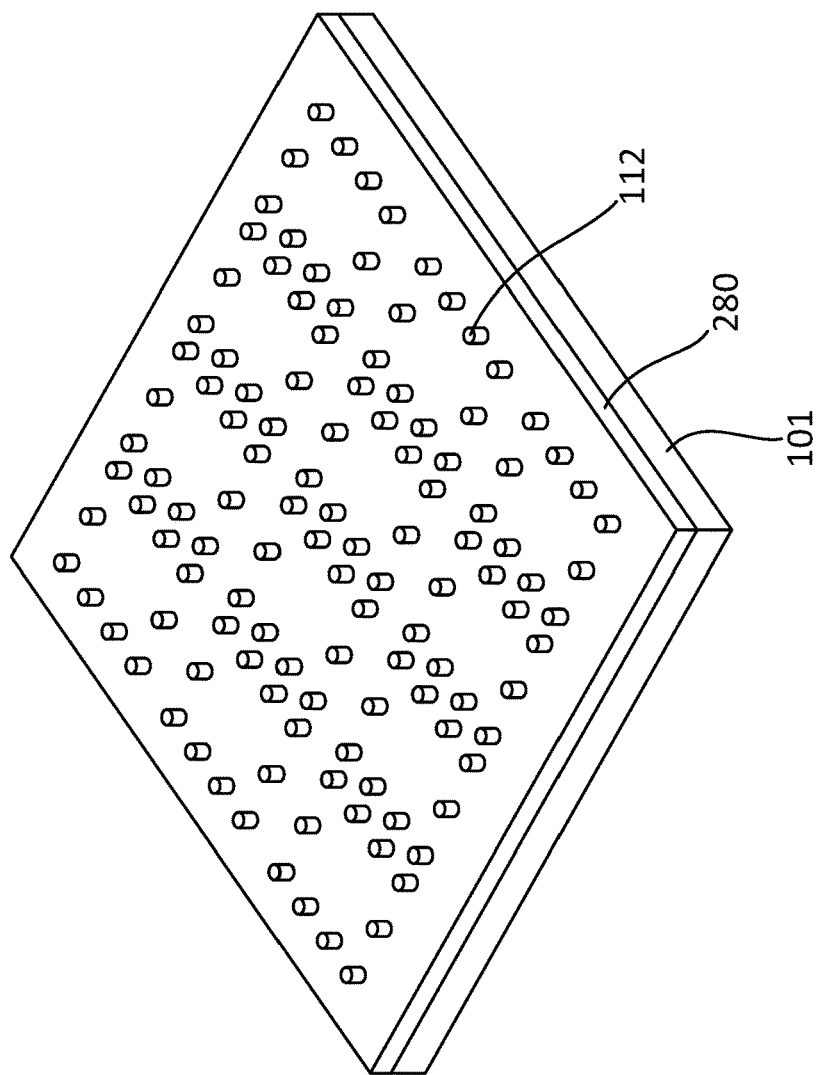
FIGS. 18A and 18B show perspective and cross-sectional view of an example method for manufacturing an example semiconductor device.
Figure 18B:
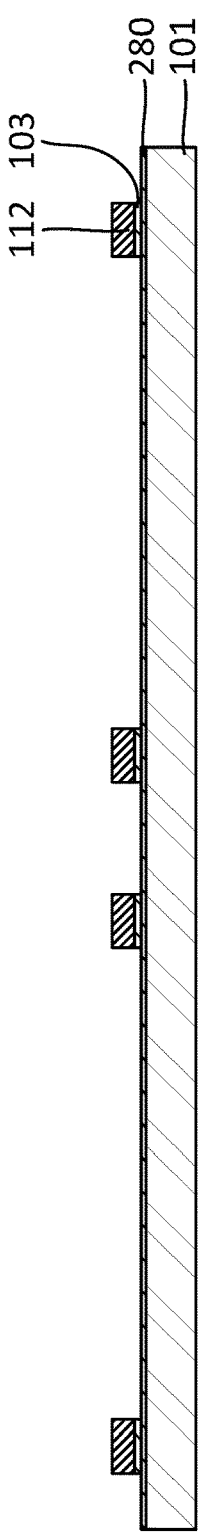

FIGS. 18A and 18B show perspective and cross-sectional view of semiconductor device 200 at a later stage of manufacture. In the example shown in FIGS. 18A and 18B, substrate interconnects 112 can be formed on conductive layer 103 provided on a top surface of carrier 101. In some examples, substrate interconnects 112 can be formed on conductive layer 103 in a matrix configuration having rows and/or columns. In some examples, substrate interconnects 112 can be formed by, but not limited to, electroplating, electroless plating, sputtering, PVD, CVD, MOCVD, ALD, LPCVD or PECVD. In some examples, substrate interconnects 112 can be made from copper, gold, silver, palladium, or nickel. Substrate interconnects 112 can be referred to as pillars, posts, vias, or conductive paths. In some examples, substrate interconnects 112 can electrically and mechanically connect internal interconnects 180, which will later be described, and substrate 210 to each other.

Figure 19A:
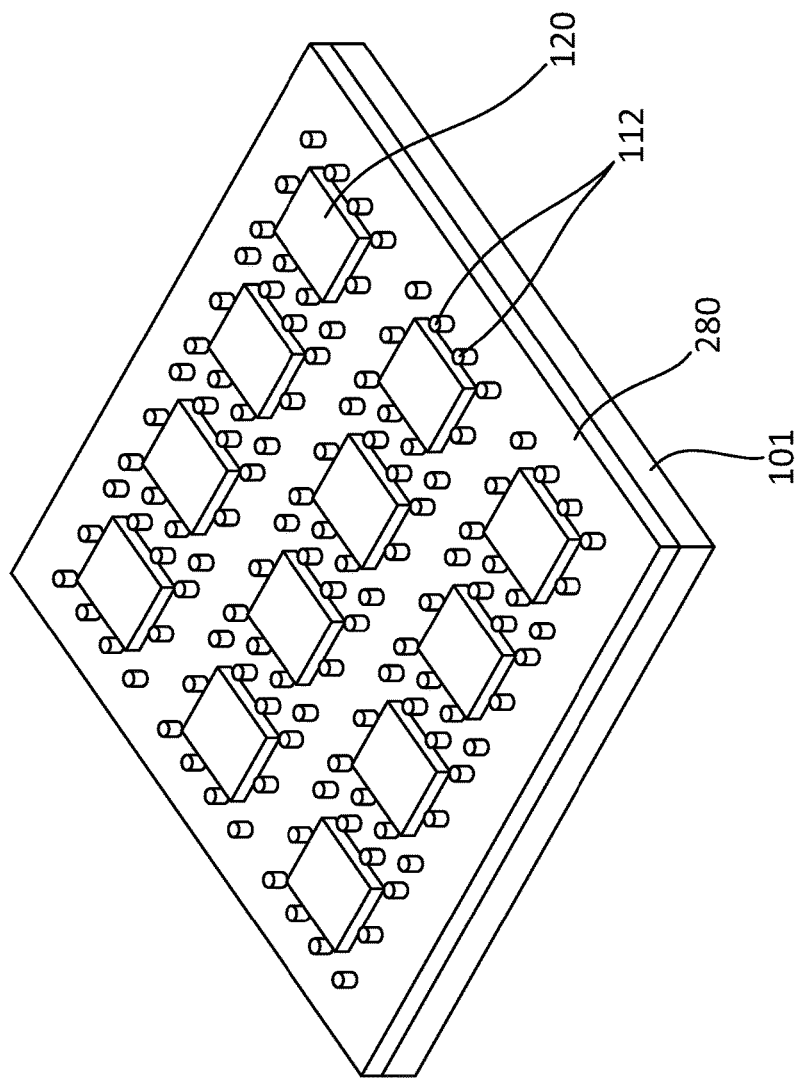
FIGS. 19A and 19B show perspective and cross-sectional view of an example method for manufacturing an example semiconductor device.
Figure 19B:
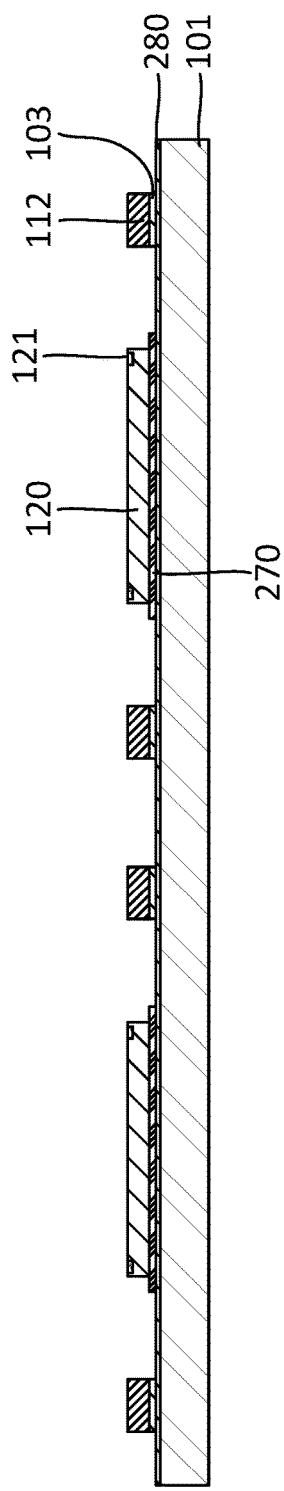

FIGS. 19A and 19B show perspective and cross-sectional view of semiconductor device 200 at a later stage of manufacture. In the example shown in FIGS. 18A and 18B, conductive layer 103 of regions not overlapping substrate interconnects 112 can be removed. The removing of conductive layer 103 can be performed by, for example, but not limited to, soft etching using substrate interconnects 112 as masks. Accordingly, conductive layer 103 of regions overlapping substrate interconnects 112 may remain. In some examples, electronic component 120 can be adhered onto interface film 280 over an empty region between substrate interconnects 112. In some examples, electronic component 120 can be adhered to interface film 280 using adhesive 270. The bottom side of electronic component 120 can be adhered to interface film 280 using adhesive 270.

Figure 20A:
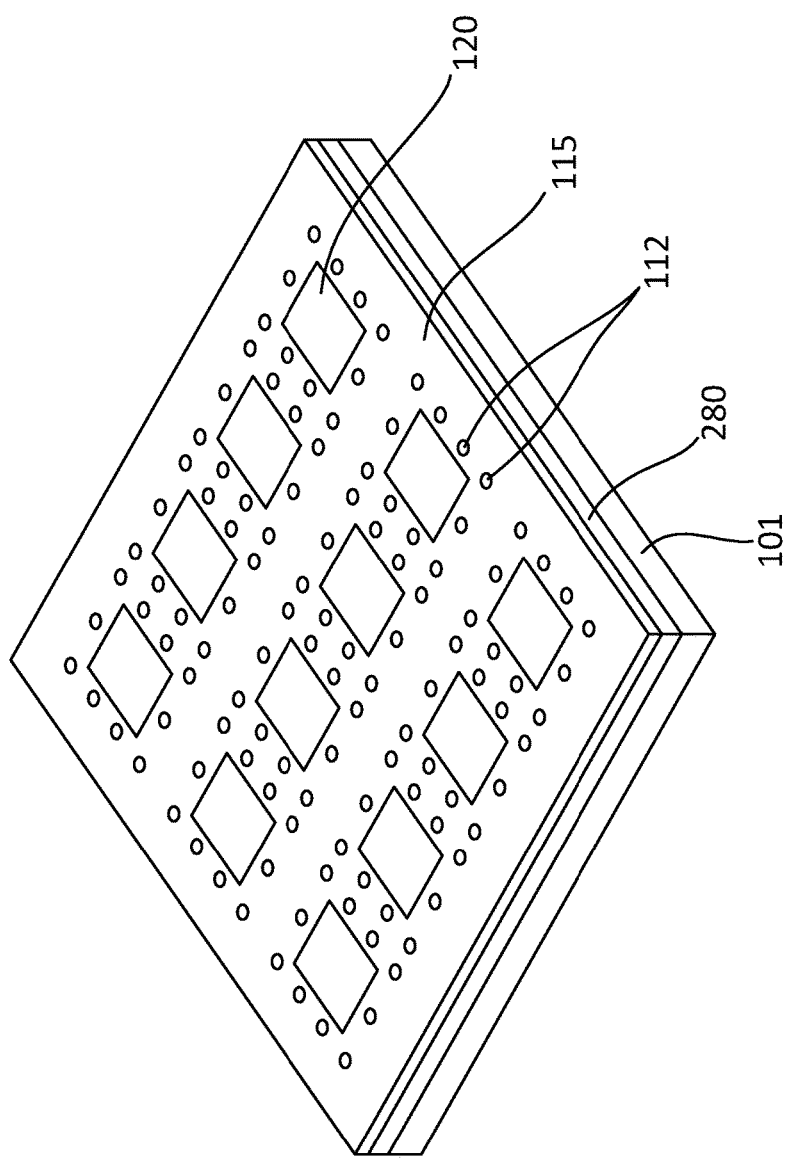
FIGS. 20A and 20B show perspective and cross-sectional view of an example method for manufacturing an example semiconductor device.
Figure 20B:
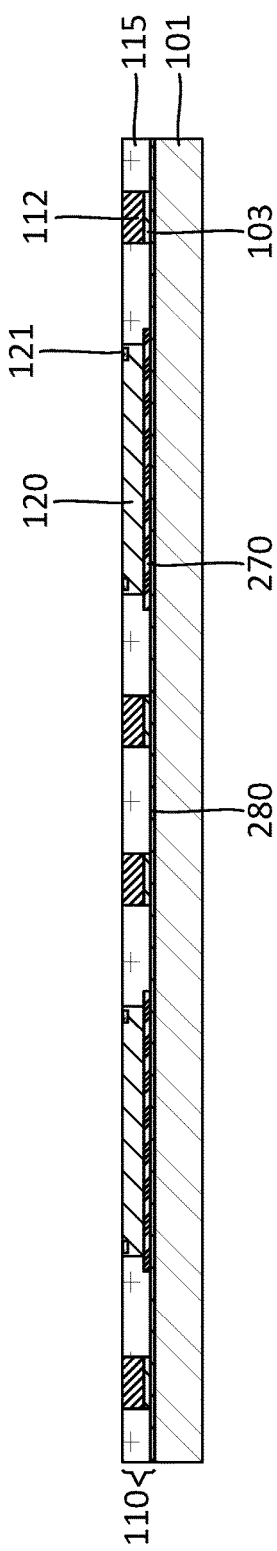

FIGS. 20A and 20B show perspective and cross-sectional view of semiconductor device 200 at a later stage of manufacture. In the example shown in FIGS. 20A and 20B, encapsulant 115 can be formed on sidewalls of substrate interconnects 112 and electronic component 120. In some examples, encapsulant 115 can be brought into contact with sidewalls of substrate interconnects 112 and electronic component 120. In addition, encapsulant 115 can be brought into contact with a surface of interface film 280 not overlapping bottom sides of substrate interconnects 112 and electronic component 120. In addition, the top sides of substrate interconnects 112 and electronic component 120 can be made substantially coplanar with the top side of encapsulant 115. The top sides of substrate interconnects 112 and electronic component 120 can be exposed through the top side of encapsulant 115. In some examples, substrate 110 can comprise embedded electronic component 120 and substrate interconnects 112.

FIGS. 21A and 21B show perspective and cross-sectional view of semiconductor device 200 at a later stage of manufacture. In the example shown in FIGS. 21A and 21B, substrate 210 can be formed on top sides of substrate 110 and electronic component 120. In some examples, substrate 210 can comprise conductive structures 211 and dielectric structures 212. Conductive structures 211 can comprise one or more conductive layers or paths. Conductive structures 211 can be electrically connected to terminal 121 of electronic component 120 and/or substrate interconnects 112 of substrate 110. Dielectric structures 212 can comprise one or more dielectric layers. Dielectric structures 212 can cover conductive structures 211, thereby protecting conductive structures 211 from external elements.

In some examples, conductive structures 211 can be referred to as a redistribution layer (RDL), a wiring pattern or a circuit pattern. In some examples, conductive structures 211 can be made from, for example, but not limited to, copper, aluminum, gold, silver, or nickel. Conductive structures 211 can be formed by, for example, but not limited to, sputtering, electroless plating, electroplating, PVD, CVD, MODVD, ALD, LPCVD or PECVD. Conductive structures 211 can have a thickness and width in ranges from approximately 2 μm to approximately 10 μm. Some of conductive structures 211 can be electrically connected to terminal 121 of electronic component 120. Some of conductive structures 211 can be electrically connected to substrate interconnects 112. Some of conductive structures 211 can be electrically connected to terminal 121 of electronic component 120 and substrate interconnects 112, thereby electrically connecting terminal 121 of electronic component 120 and substrate interconnects 112 to each other. In some examples, dielectric structures 212 can comprise or be referred to as a passivation layer, an insulation layer or a protection layer. Dielectric structures 212 can be made from, for example, but not limited to, Si3N4, SiO2, SiON, PI, BCB, PBO, BT, epoxy resin, phenol resin, silicon resin, or acrylate polymer. In addition, dielectric structures 212 can be formed by, for example, but not limited to, PVD, CVD, MOCVD, ALD, LPCVD, PECVD, printing, spin coating, spray coating, sintering or thermal oxidation. In some examples, dielectric structures 212 can cover top sides of electronic component 120, substrate encapsulant 115 and substrate interconnects 112, but terminal 121 of electronic component 120 and substrate interconnects 112 can be exposed through patterning. Dielectric structures 212 can have a thickness in the range from approximately 10 μm to approximately 15 μm. In some examples, some regions of conductive structures 211 can be exposed through dielectric structures 212.

Substrate 210 is presented here as a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Substrates in other examples of this disclosure can also comprise an RDL substrate.

In other examples, substrate 210 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrate can be formed through a semi-additive or modified-semi-additive process. Substrates in other examples of this disclosure can also comprise a pre-formed substrate.

Figure 22A:
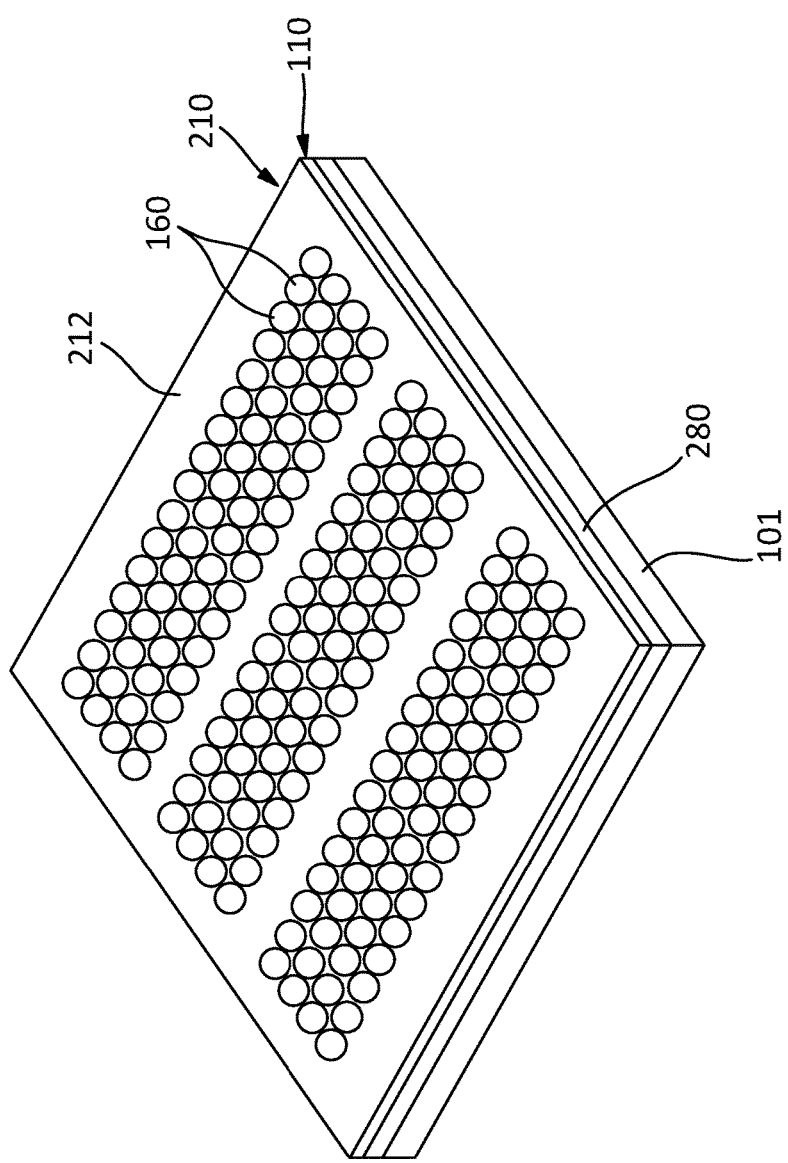
FIGS. 22A and 22B show perspective and cross-sectional view of an example method for manufacturing an example semiconductor device.
Figure 22B:
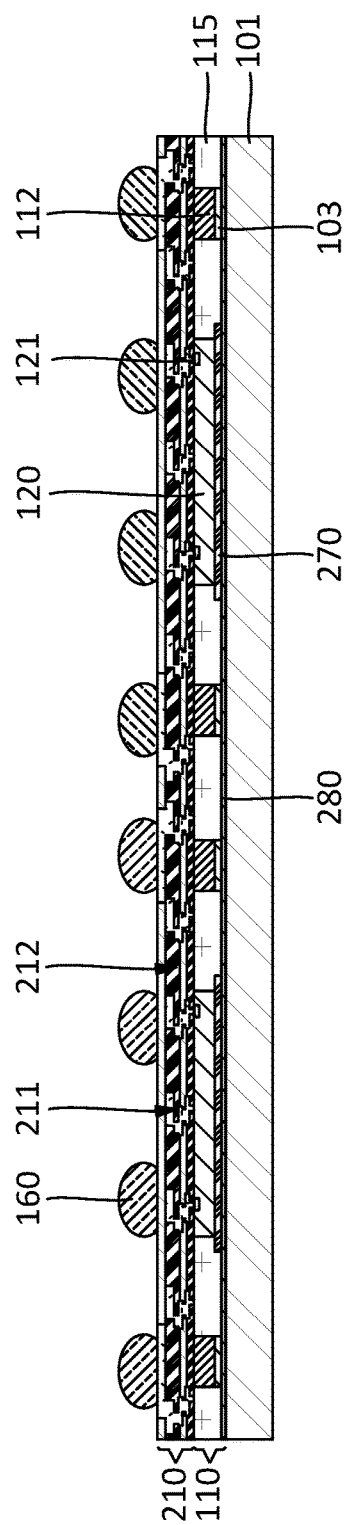

FIGS. 22A and 22B show perspective and cross-sectional view of semiconductor device 200 at a later stage of manufacture. In the example shown in FIGS. 22A and 22B, external interconnects 160 can be formed on substrate 210. In some examples, external interconnects 160 can be formed on conductive structures 211 exposed through dielectric structures 212 of substrate 210. In some examples, UBMs (Under Bump Metallizations) can be formed on conductive structures 211 exposed through dielectric structures 212, and external interconnects 160 can be formed the UBMs.

Figure 23A:
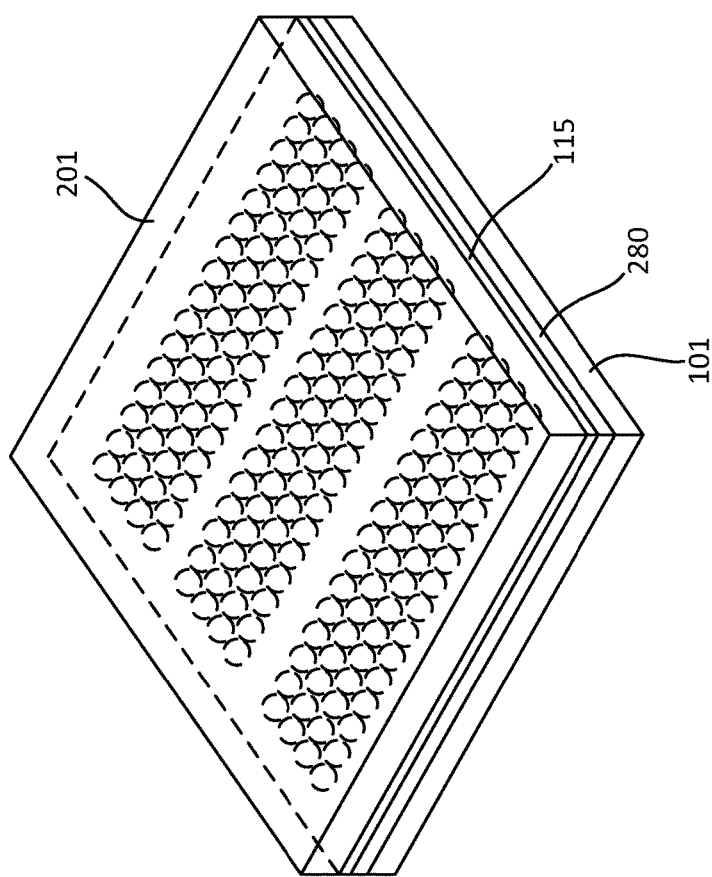
FIGS. 23A and 23B show perspective and cross-sectional view of an example method for manufacturing an example semiconductor device.
Figure 23B:
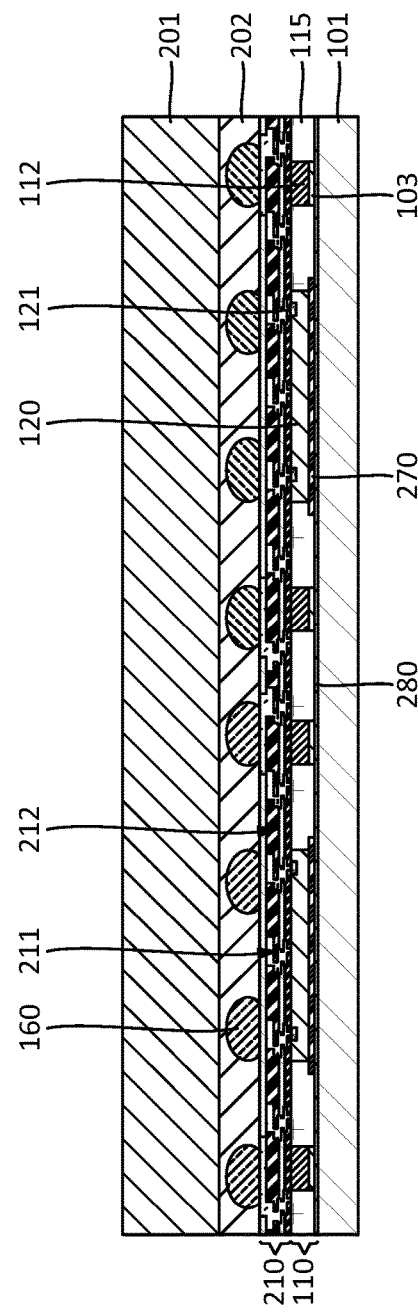

FIGS. 23A and 23B show perspective and cross-sectional view of semiconductor device 200 at a later stage of manufacture. In the example shown in FIGS. 23A and 23B, a carrier 201 can be attached to substrate 210 and external interconnects 160. In some examples, a temporary bond layer 202 can be attached to a bottom side of carrier 201 and can also be attached to substrate 210 and external interconnects 160. Temporary bond layer 202 can surround external interconnects 160 and can be temporarily attached to dielectric structures 212 of substrate 210 not overlapping external interconnects 160 and/or conductive structures 211. Temporary bond layer 202 can be separated from substrate 210 and external interconnects 160 by heat, light, a chemical solution and/or a physical external force at a subsequent stage. Carrier 201 can have a thickness in the range from approximately 500 μm to approximately 1500 μm, and temporary bond layer 202 can have a thickness in the range from approximately 50 μm to approximately 150 μm. In some examples, shapes, materials and/or manufacturing methods of carrier 201 and temporary bond layer 202 can be similar to or the same with those of carrier 101 and temporary bond layer 102 having been described above.

Figure 24A:
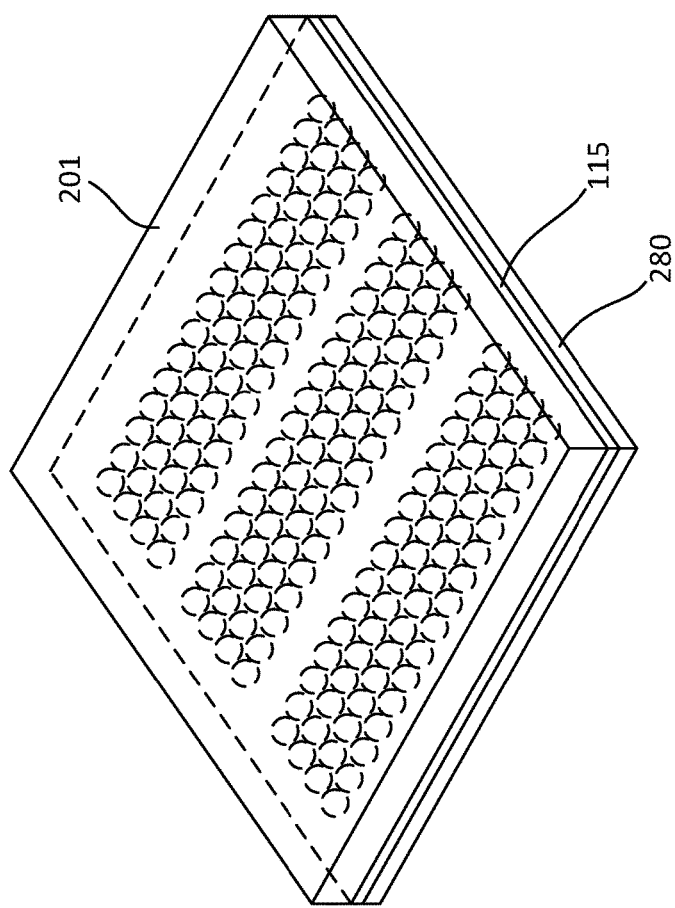
FIGS. 24A and 24B show perspective and cross-sectional view of an example method for manufacturing an example semiconductor device.
Figure 24B:
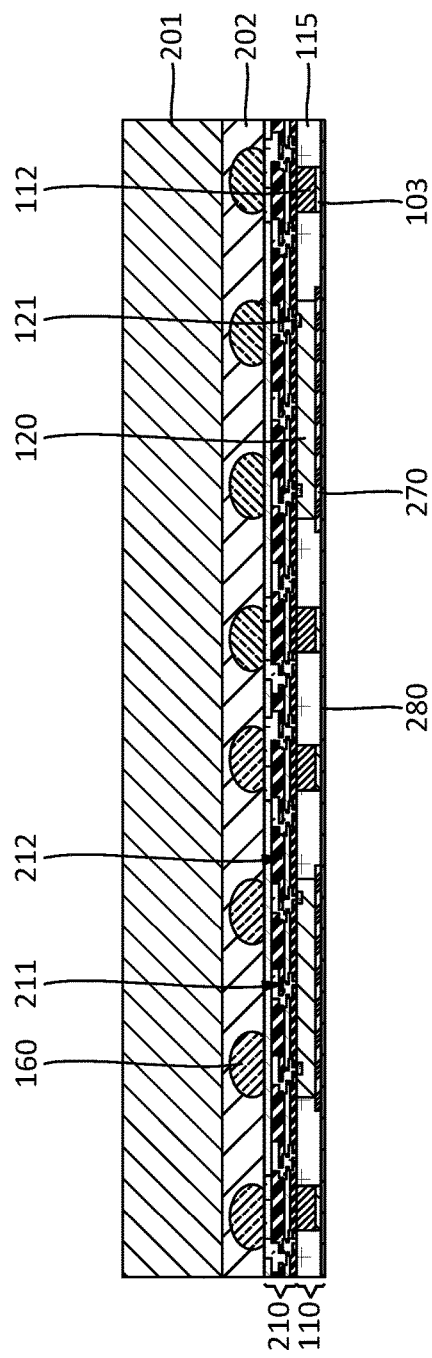

FIGS. 24A and 24B show perspective and cross-sectional view of semiconductor device 200 at a later stage of manufacture. In the example shown in FIGS. 24A and 24B, carrier 101 can be separated from interface film 280. In some examples, interface film 280 can remain and only carrier 101 can be removed. In some examples, interface film 280 can be maintained at a state in which it is adhered to encapsulant 115, conductive layer 103 and an adhesive layer 270. Accordingly, conductive layer 103 and adhesive layer 270 remain be protected without being exposed during the manufacture of semiconductor device 200. In some examples, interface film 280 can be removed.

FIGS. 25A and 25B show perspective and cross-sectional view of semiconductor device 200 at a later stage of manufacture. The orientation of the assembly has been flipped from the previous stage. In the example shown in FIGS. 25A and 25B, openings 280A can be formed in interface film 280. Openings 280A can be formed in regions of interface film 280 corresponding to substrate interconnects 112. Accordingly, top sides of substrate interconnects 112 can be exposed through openings 280A of interface film 280. Openings 280A can be formed by laser drilling, mechanical drilling or/and a chemical etching process.

Figure 26A:
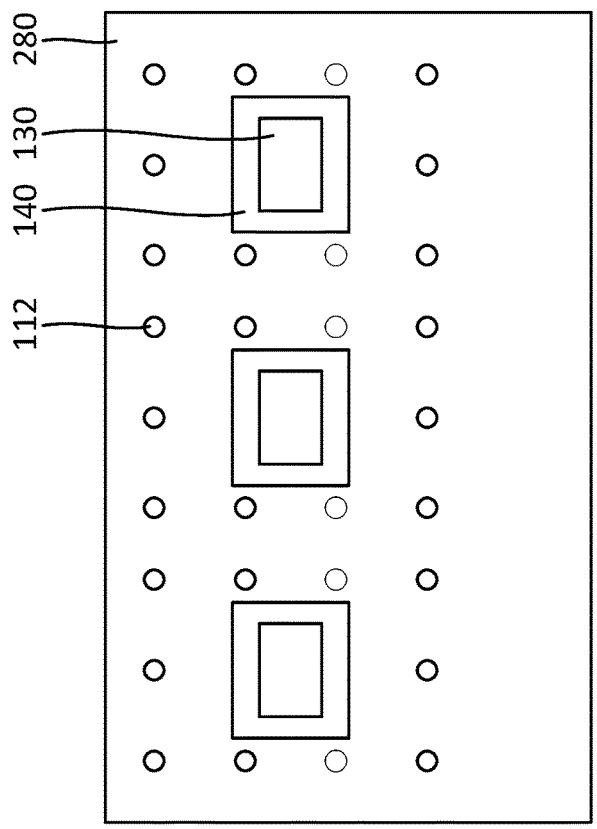
FIGS. 26A and 26B show top plane and cross-sectional view of an example method for manufacturing an example semiconductor device.
Figure 26B:
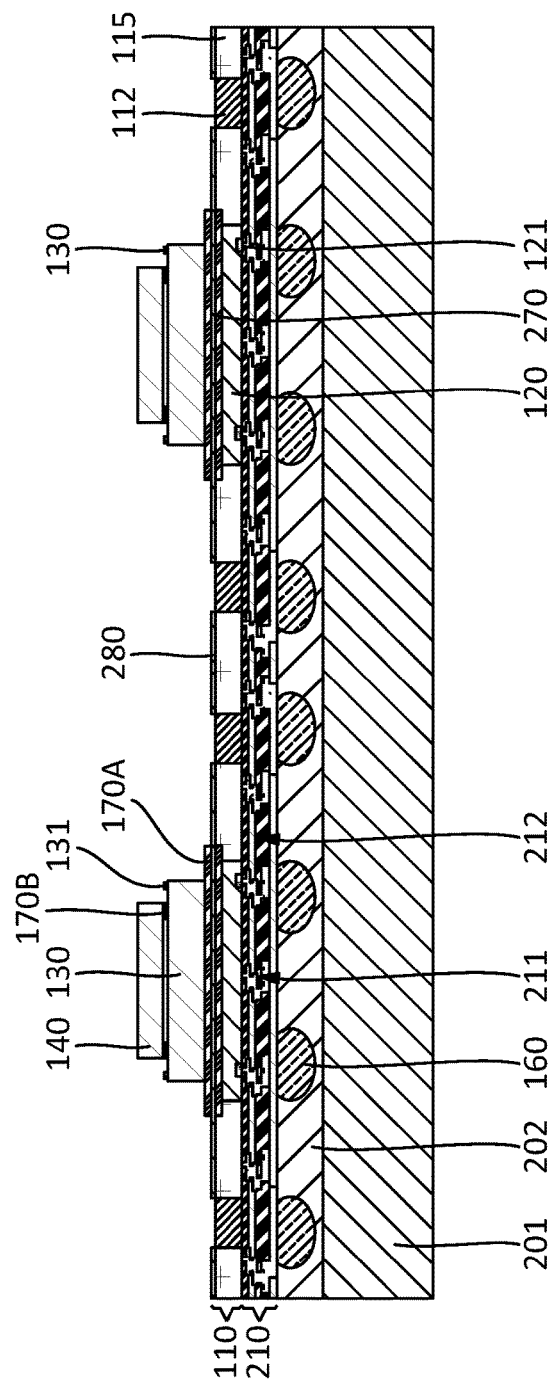

FIGS. 26A and 26B show top plane and cross-sectional view of semiconductor device 200 at a later stage of manufacture. In some examples, electronic component 130 can be attached to substrate 110. Electronic component 130 can comprise cap 140 as previously described (FIG. 9). In some examples, electronic component 130 can be attached using adhesive (170 of FIG. 16). In some examples, electronic component 130 can be attached onto a region of interface film 280 corresponding to electronic component 120 using adhesive 170. In some examples, electronic component 130 can have a smaller width than electronic component 120. In some examples, electronic component 130 can have a larger width than electronic component 120. In some examples, electronic component 130 is attached such that its active region faces upward. In some examples, the active region of electronic component 120 can face downward towards substrate 210.

Figure 27A:
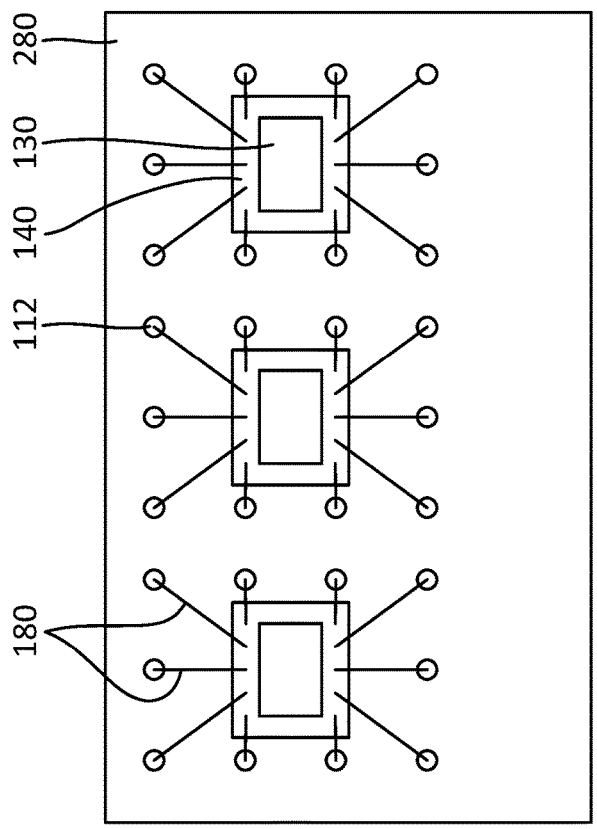
FIGS. 27A and 27B show top plane and cross-sectional view of an example method for manufacturing an example semiconductor device.
Figure 27B:
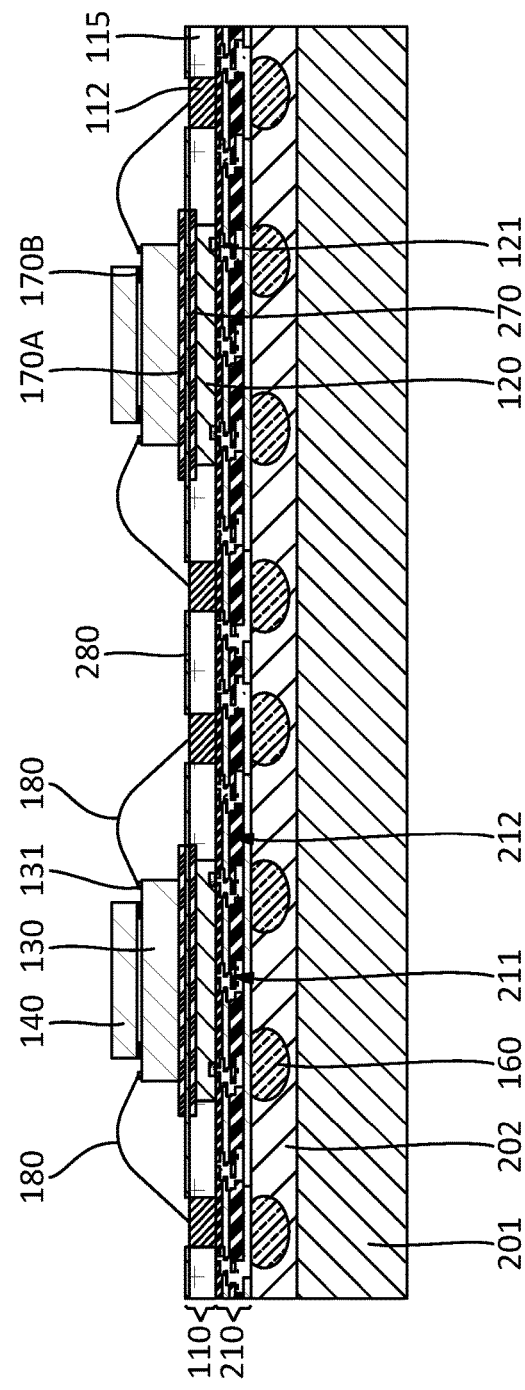

FIGS. 27A and 27B show top plane and cross-sectional view of semiconductor device 200 at a later stage of manufacture. In the example shown in FIGS. 27A and 27B, internal interconnects 180 can electrically connect electronic component 130 and substrate interconnects 112. In some examples, internal interconnects 180 can be referred to as wires or bonding wires. In some examples, internal interconnects 180 can have a loop height in the range from approximately 30 μm to approximately 70 μm and a diameter in the range from approximately 15 μm to approximately 25 μm. In some examples, internal interconnects 180 can be made from gold, copper or aluminum. In some examples, internal interconnects 180 can allow electrical connection of electronic component 130 to an external component.

Figure 28:
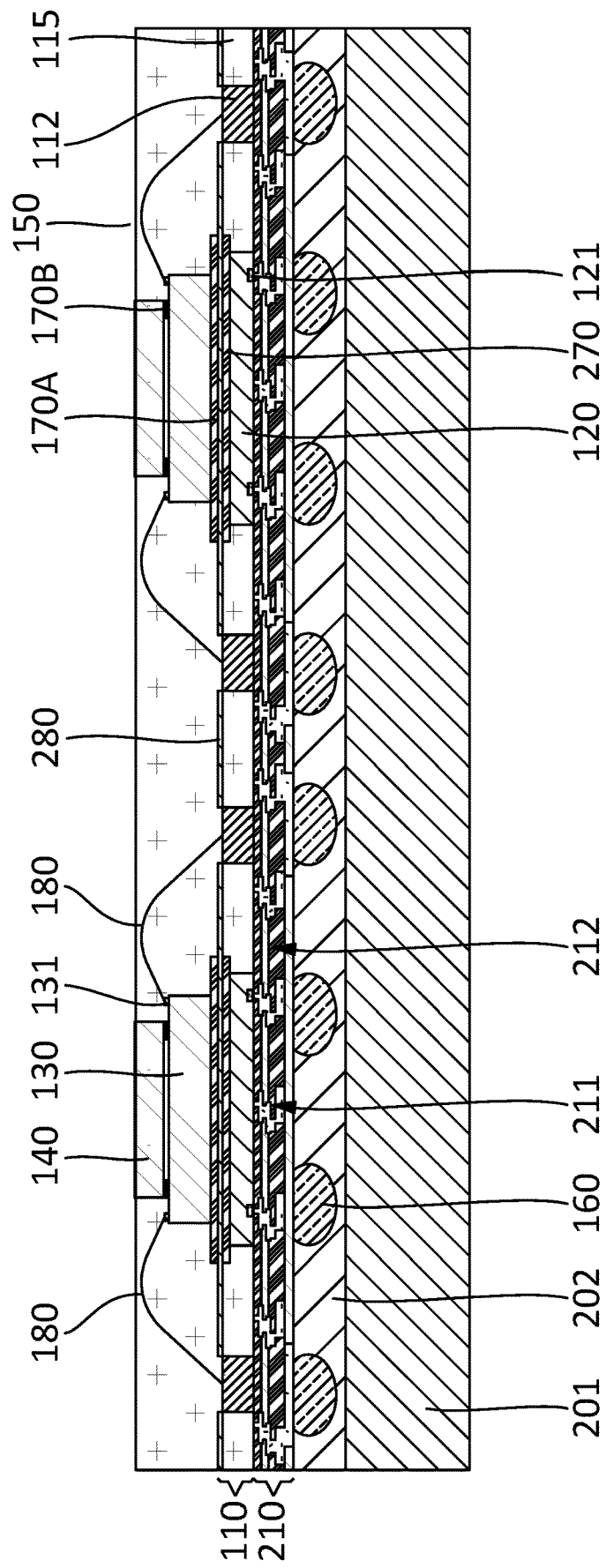
FIG. 28 shows cross-sectional view of an example method for manufacturing an example semiconductor device.

FIG. 28 shows cross-sectional view of semiconductor device 200 at a later stage of manufacture. In the example shown in FIG. 28, cover structure 150 can encapsulate electronic component 130 and internal interconnects 180 positioned on interface film 280. In some examples, cover structure 150 can be brought into contact with interface film 280 and substrate interconnects 112. In addition, in some examples, cover structure 150 can encapsulate the sidewall and top side of electronic component 130, except for a bottom side of electronic component 130, and can encapsulate internal interconnects 180. In some examples, cover structure 150 may not encapsulate a top side of cap 140. The top side of cap 140 can be exposed through cover structure 150.

Figure 29:
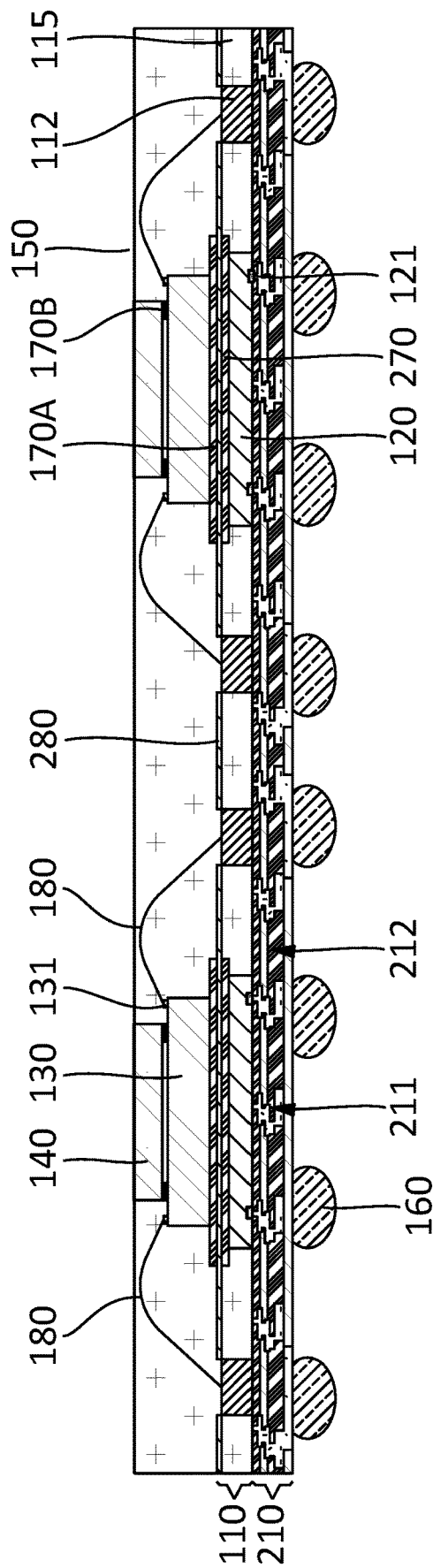
FIG. 29 shows cross-sectional view of an example method for manufacturing an example semiconductor device.

FIG. 29 shows cross-sectional view of semiconductor device 200 at a later stage of manufacture. In the example shown in FIG. 29, carrier 201 can be separated to expose from substrate 210 and external interconnects 160. In some examples, temporary bond layer 202 can be separated from substrate 210 and external interconnects 160 while attached to carrier 201. In some examples, heat, light, a chemical solution and/or a physical external force can be provided, thereby removing or reducing a bonding strength of temporary bond layer 202.

Figure 30:
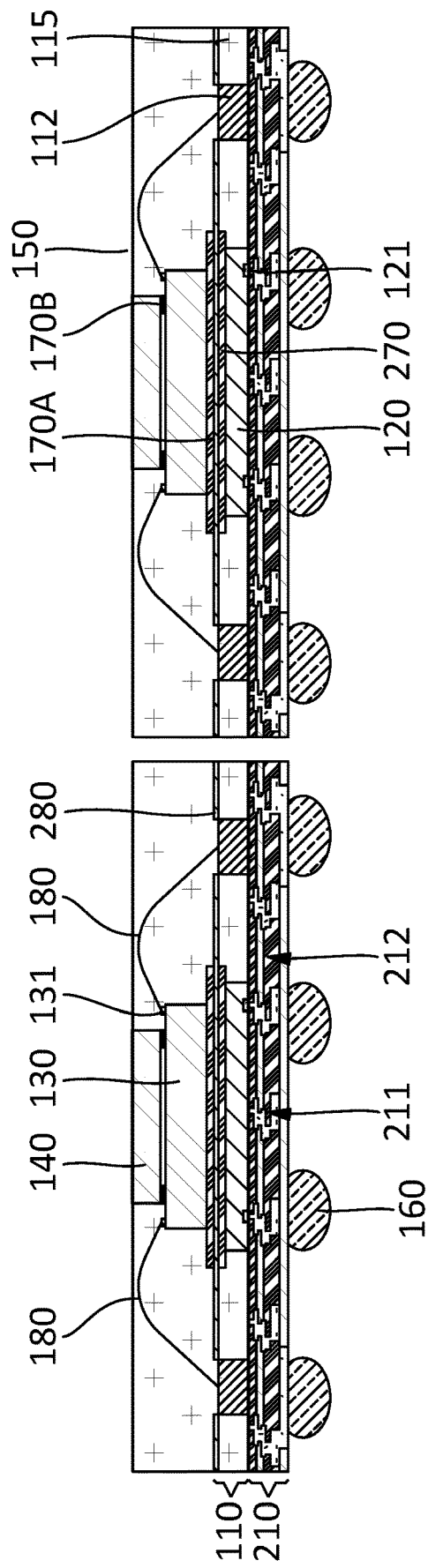
FIG. 30 shows cross-sectional view of an example method for manufacturing an example semiconductor device.

FIG. 30 shows cross-sectional view of semiconductor device 200 at a later stage of manufacture. In the example shown in FIG. 30, semiconductor device 200 can be singulated into discrete semiconductor devices. In some examples, semiconductor device 200 can be separated into discrete semiconductor devices by a diamond blade or laser beam. As the result of sawing or singulation, the sidewalls of substrate encapsulant 115, substrate conductive structures 211, dielectric structures 212, or cover structure 150 can be substantially coplanar.

When singulated, semiconductor device 200 can correspond to the depiction shown in FIG. 16. As can be appreciated there, the top side of substrate 210 is coupled to the bottom side of substrate 110, and external interconnects 160 are coupled to the bottom side of substrate 210. Conductive structure 211 comprises conductors (traces, vias, pads) that extend between or through the one or more layers of dielectric structure 212 to define conductive paths between the top side to the bottom side of substrate 210. In some examples, a conductor of conductive structure 211 can be exposed at the top side of substrate 210, and can be coupled to terminal 121 of electronic component 120, where terminal 121 is exposed from encapsulant 115 at the bottom side of substrate 110. In some examples, a conductor of conductive structure 211 can be exposed at the top side of substrate 210, and can be coupled to substrate interconnect 112, where substrate interconnect 112 is exposed from encapsulant 115 at the bottom side of substrate 110. In some examples, substrate 210 can be an RDL substrate, where the top side or top dielectric layer of dielectric structure 212 can be conformal to a contour of the bottom side of substrate 110. In some examples, substrate 110 comprises adhesive 270 on the top side of electronic component 120, between electronic component 120 and electronic component 130. In some examples, the top side of adhesive 270 can be exposed from encapsulant 115 of substrate 110. In some examples, encapsulant 115 of substrate 110 can coat a sidewall of adhesive 270, or a portion of the bottom side of adhesive 270 that extends beyond a footprint of electronic component 120.

Semiconductor device 200 having reduced dimensions can be achieved by the manufacturing method described. In some examples, as the thickness and width of semiconductor device 200 can be reduced by such manufacturing method, semiconductor device 200 can be suitably applied to a wearable device.

Figure 31:
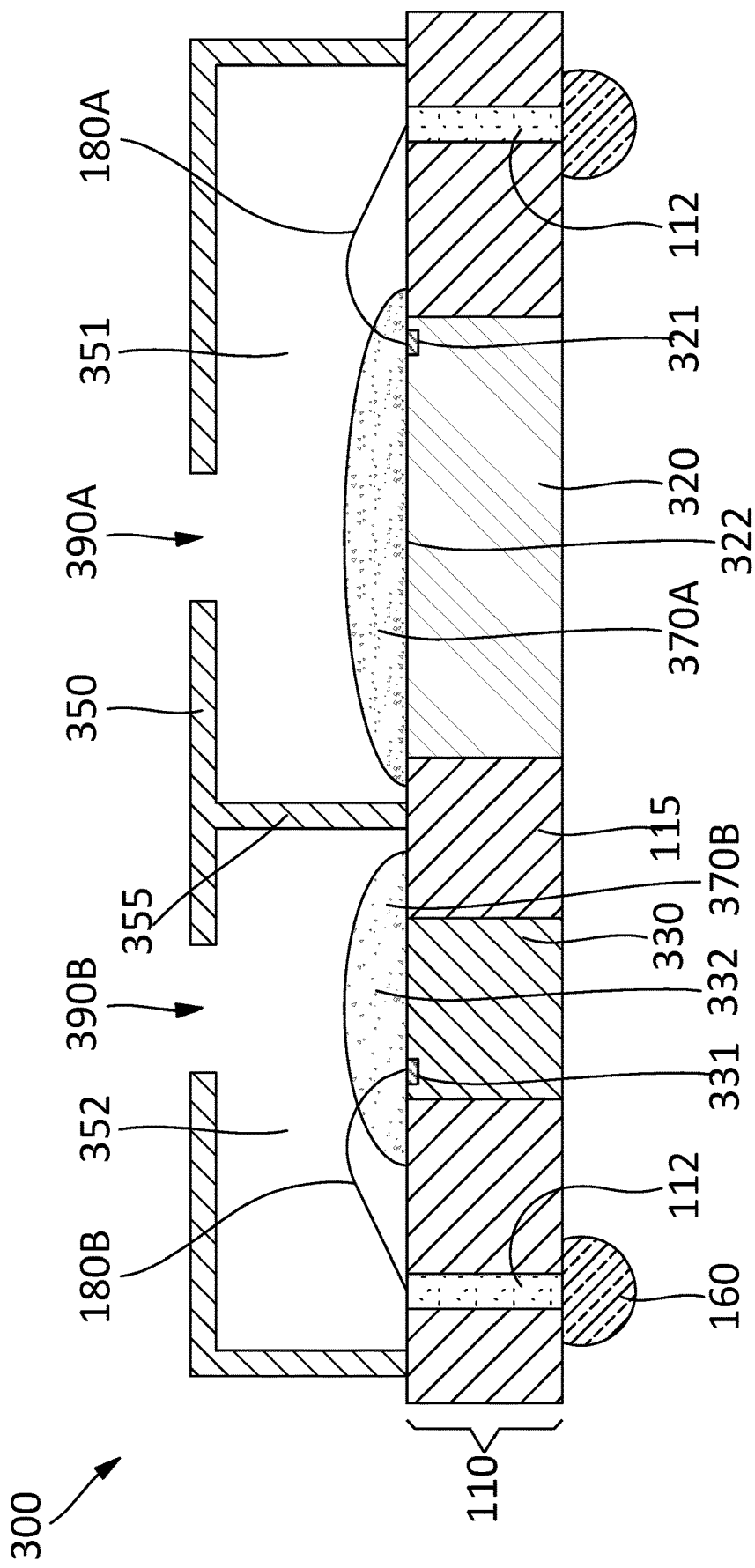
FIG. 31 shows a cross-sectional view of an example semiconductor device.

FIG. 31 shows cross-sectional view of semiconductor device. In the example shown in FIG. 31, semiconductor device 300 can comprise a substrate 110, electronic components 320 and 330, cover structure 350, and protective layers 370A and 370B.

Substrate 110 as presented with respect to semiconductor device 300 can be similar to substrate 110 as previously described with respect to semiconductor devices 100 and 200, but comprises embedded electronic components 320 and 332. Electronic component 320 can comprise a terminal 321 and a MEMS region 322. Electronic component 330 can comprise a terminal 331. Cover structure 350 can comprise compartments 351 and 352 and apertures 390A and 390B.

FIGS. 32 to 44 show various drawings of an example method for manufacturing semiconductor device 300. FIGS. 32A and 32B show perspective and cross-sectional view of semiconductor device 300 at an early stage of manufacture.

In the example shown in FIGS. 32A and 32B, a pair of electronic components 320 and 330 can be adhered in parallel to conductive layer 103 provided in a carrier 101. In some examples, pairs of electronic components 320 and 330 can be arrayed on or adhered to conductive layer 103 in a matrix configuration having rows and/or columns. In some examples, electronic components 320 and 330 can be adhered to conductive layer 103 using an adhesive, an adhesive film or an adhesive tape. Each of electronic components 320 and 330 can have a top side, a bottom side opposite to the top side, and a sidewall connecting the top side and the bottom side. In some examples, the top sides can have an active region, and the bottom sides can have a non-active region. The bottom sides of electronic components 320 and 330 can be adhered to conductive layer 103 of carrier 101. The top side of each of electronic components 320 and 330 can comprise at least one terminal 321, 331. Terminals 321 and 331 can comprise or be referred to as die pads, bond pads, solder bumps, or pillar bumps. Each of terminals 321 and 331 can have a width in the range from approximately 2 µm to approximately 80 µm. Electronic components 320 and 330 can be referred to as semiconductor dies or semiconductor chips. In addition, in some examples, each of electronic components 320 and/or 330 can comprise at least one of a MEMS component, a radiation emitting component such as a light emitting diode or a laser, a sensor or receiver component such as an optical sensor, a photodetector, or other reflection sensor, an application specific integrated circuit, a logic die, a micro control unit, a memory, a digital signal processor, a network processor, a power management unit, an audio processor, an RF circuit, or a wireless baseband system on chip processor. In an example, electronic component 320 can be an optical sensor and electronic component 330 can be a light emitting diode. In an example, electronic component 320 can comprise an emitter, such as a laser, and electronic component 330 can comprise a reflection sensor, such as a photodetector, for a LIDAR (Light Detection And Ranging) system. Electronic components 320 and 330 can have a thickness in the range from approximately 50 µm to approximately 200 µm.

Figure 33A:
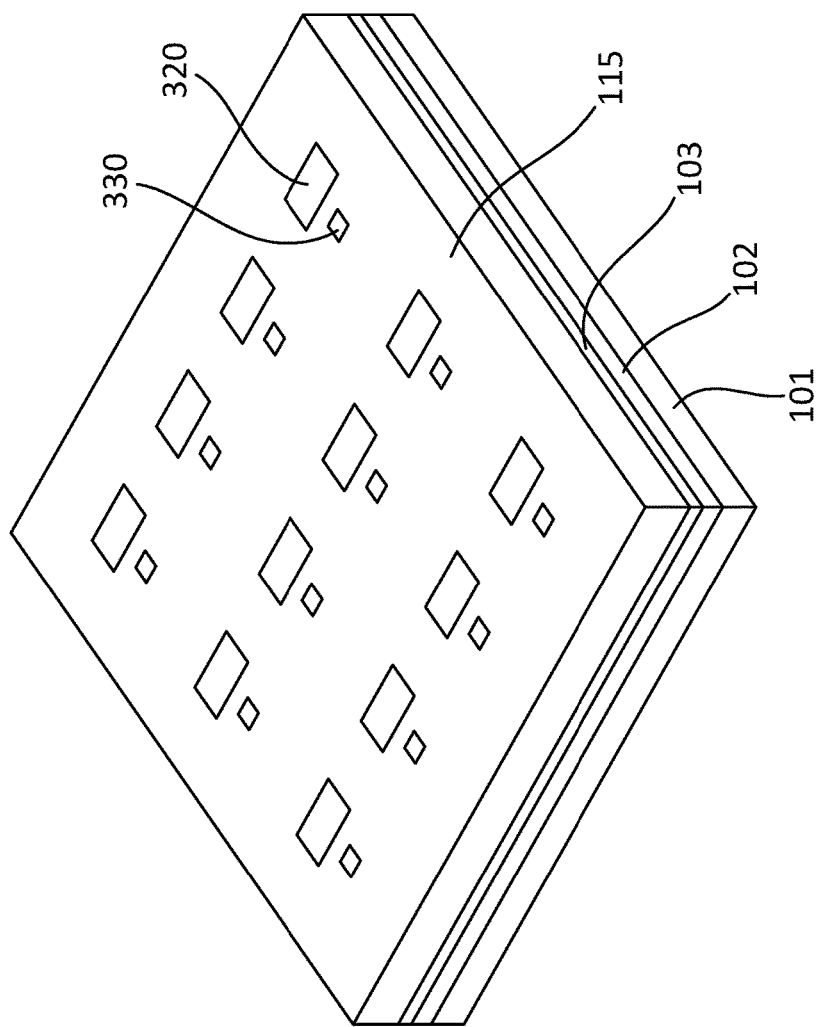
FIGS. 33A and 33B show perspective and cross-sectional view of an example method for manufacturing an example semiconductor device.
Figure 33B:
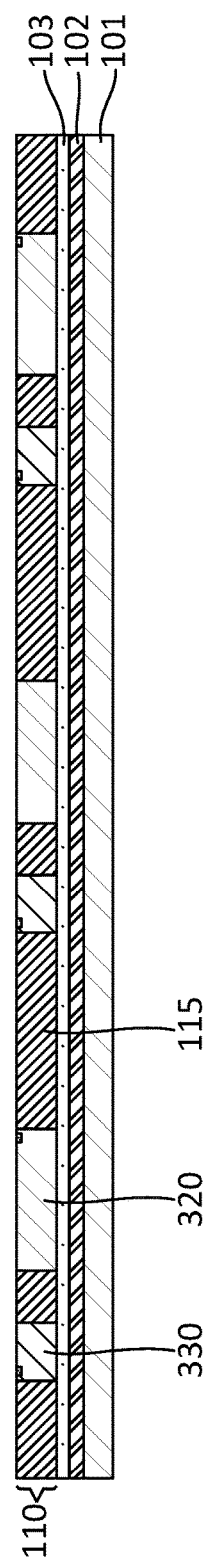

FIGS. 33A and 33B show perspective and cross-sectional view of semiconductor device 300 at a later stage of manufacture. In the example shown in FIGS. 33A and 33B, encapsulant 115 can be formed on surfaces of conductive layer 103 and electronic components 320 and 330. In some examples, encapsulant 115 can be brought into contact with sidewalls of electronic components 320 and 330. In addition, encapsulant 115 can be brought into contact with a surface of conductive layer 103 not overlapping the bottom sides of electronic components 320 and 330. In addition, the top sides of electronic components 320 and 330 can be substantially coplanar with the top side of encapsulant 115. Electronic components 320 and 330 can be horizontally embedded in encapsulant 115, and the top sides of electronic components 320 and 330 can be exposed through the top side of encapsulant 115.

Figure 34A:
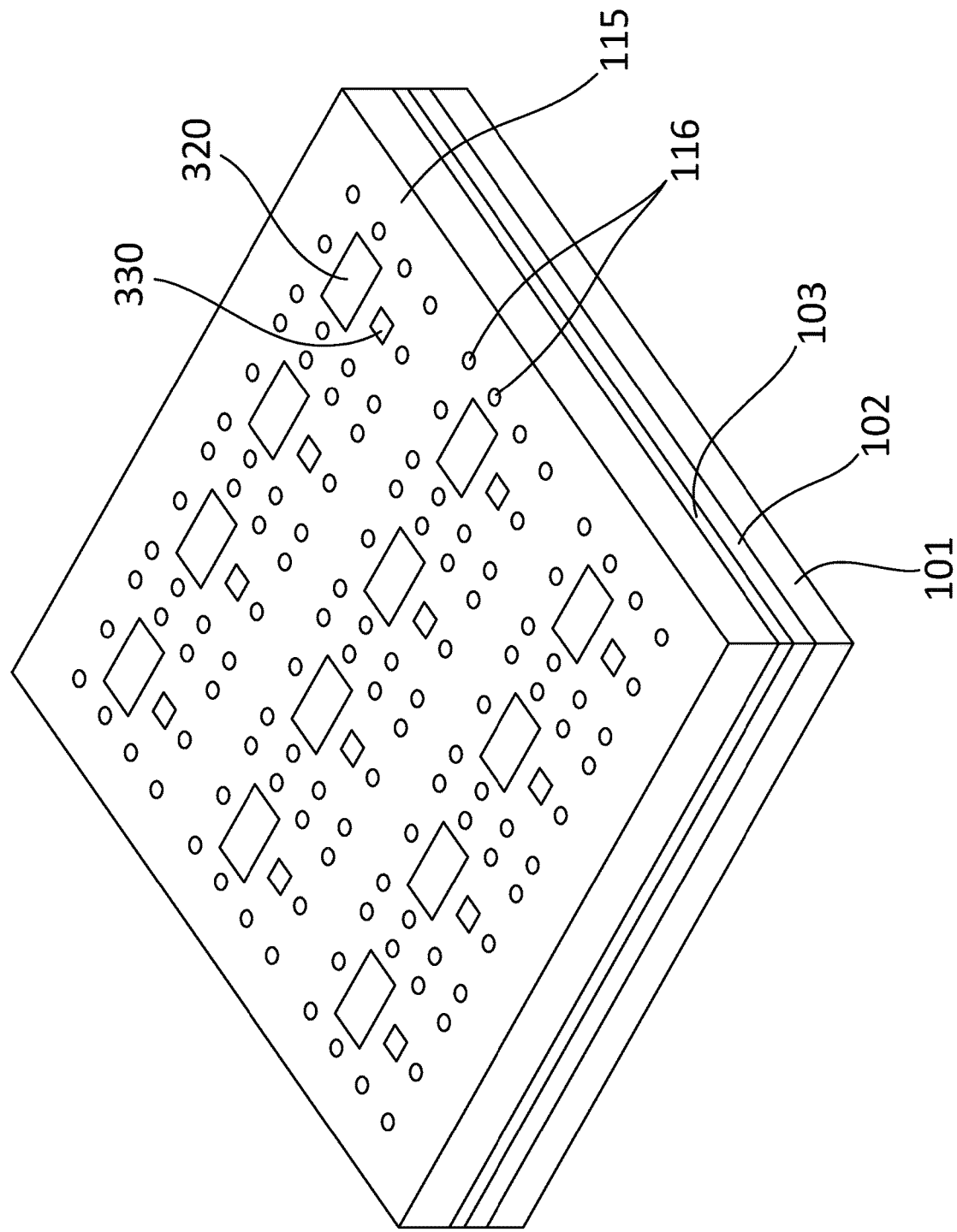
FIGS. 34A, 34B and 34C show perspective, cross-sectional and top plane view of an example method for manufacturing an example semiconductor device.
Figure 34B:
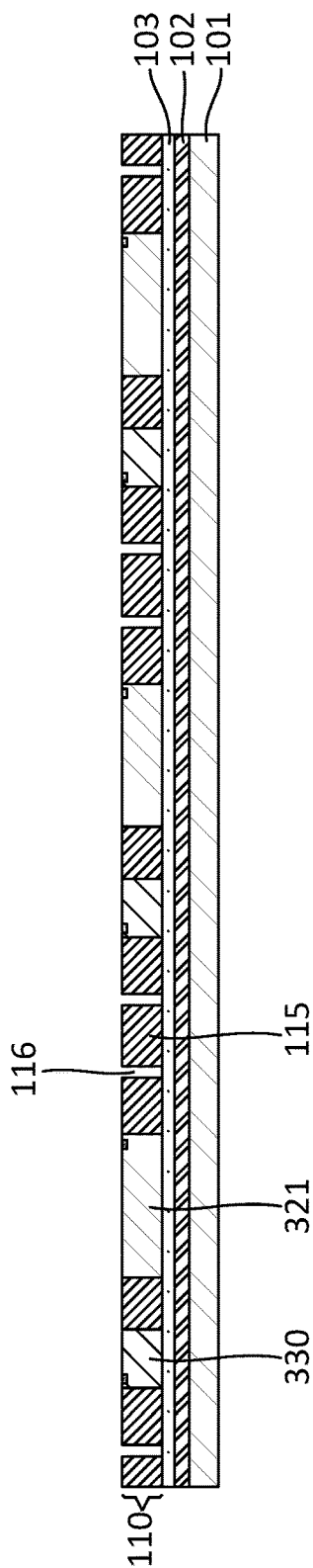
Figure 34C:
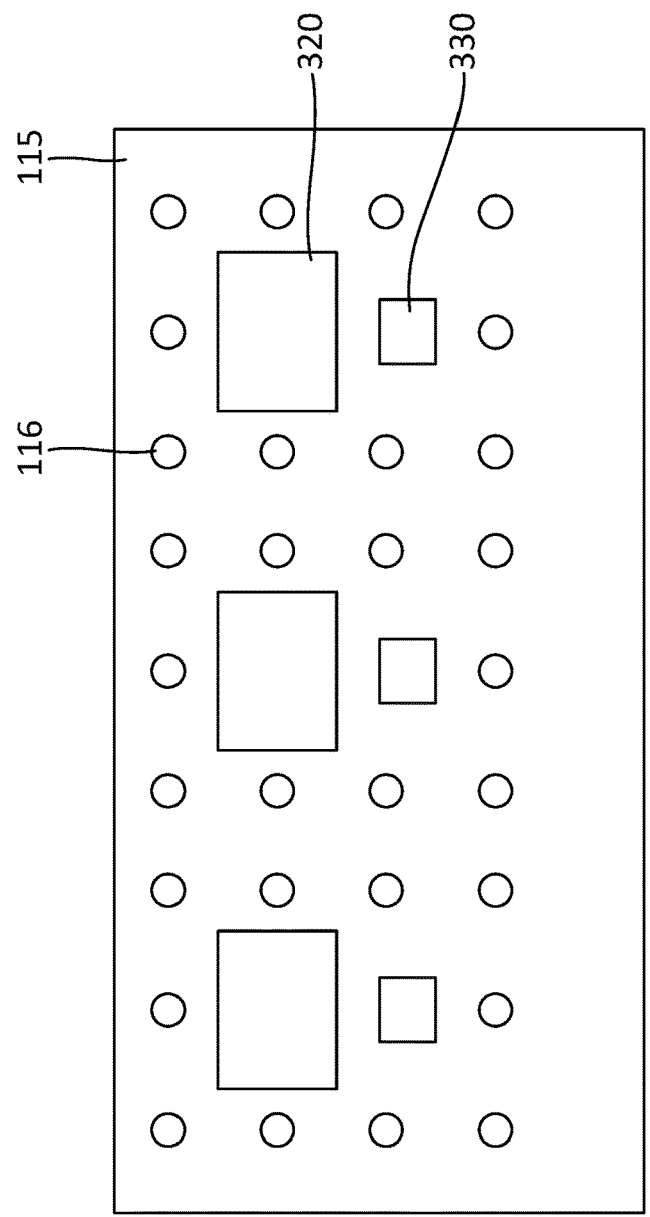

FIGS. 34A, 34B and 34C show perspective, cross-sectional and top plane view of semiconductor device 300 at a later stage of manufacture. In the example shown in FIGS. 34A and 34B, openings 116 can be formed in encapsulant 115. In some examples, openings 116 can be formed in regions spaced apart from sidewalls of each of electronic components 320 and 330 while passing through encapsulant 115. In some examples, openings 116 can include a plurality of openings formed around electronic components 320 and 330.

FIGS. 35A and 35B show perspective and cross-sectional view of semiconductor device 300 at a later stage of manufacture. In the example shown in FIGS. 35A and 35B, photosensitive film 117 can be laminated on the top sides of electronic components 320 and 330 and encapsulant 115 and then patterned. In some examples, photosensitive film 117 can close openings 116 formed in encapsulant 115, but openings 116 can be opened by a patterning process. Accordingly, openings of photosensitive film 117 can be connected with openings 116 of encapsulant 115.

Figure 36A:
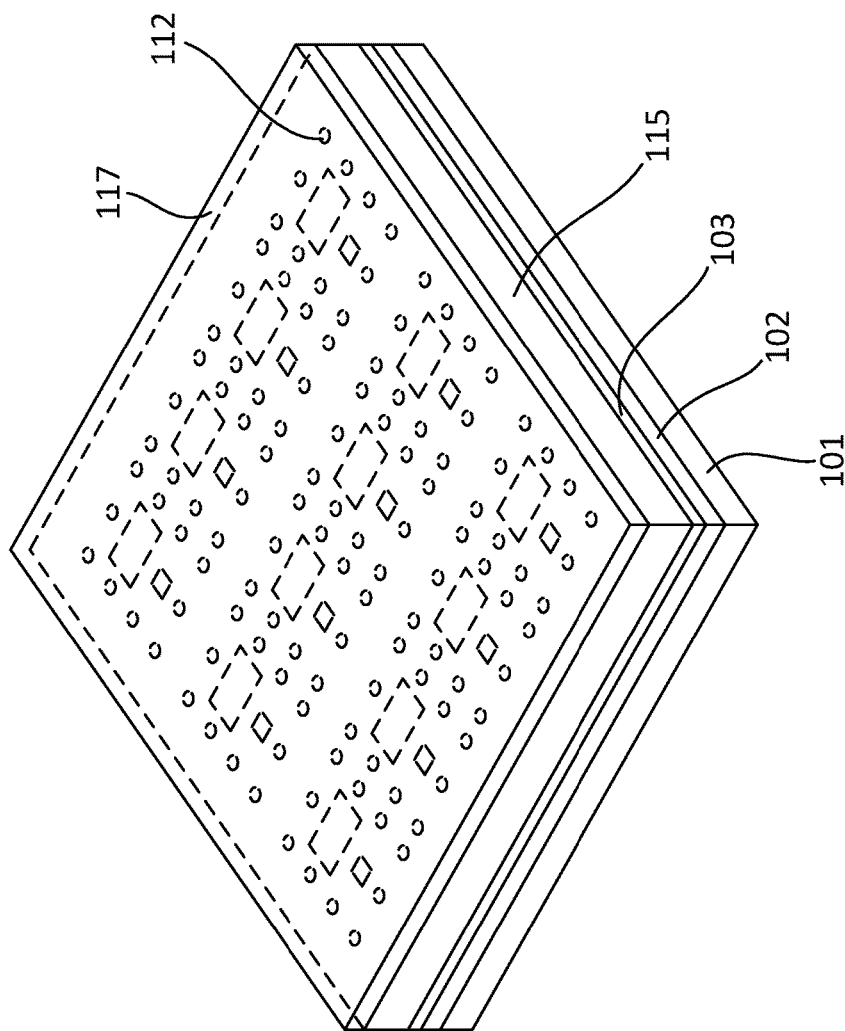
FIGS. 36A and 36B show perspective and cross-sectional view of an example method for manufacturing an example semiconductor device.
Figure 36B:
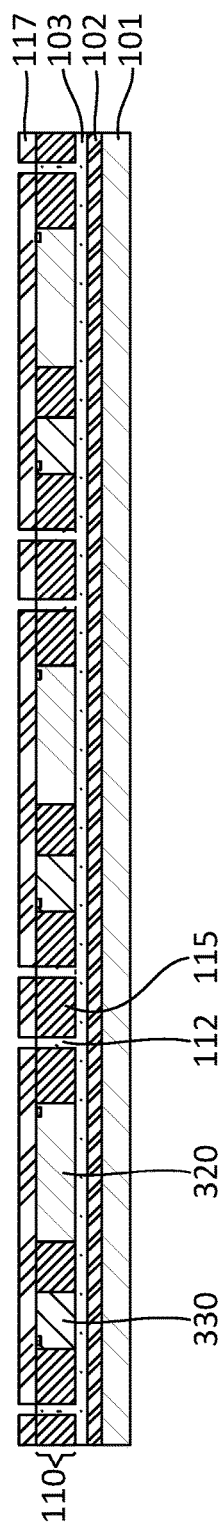

FIGS. 36A and 36B show perspective and cross-sectional view of semiconductor device 300 at a later stage of manufacture. In the example shown in FIGS. 36A and 36B, substrate interconnects 112 can be formed in openings 116 of encapsulant 115. In some examples, substrate interconnects 112 can be filled in openings 116 of encapsulant 115.

Figure 37A:
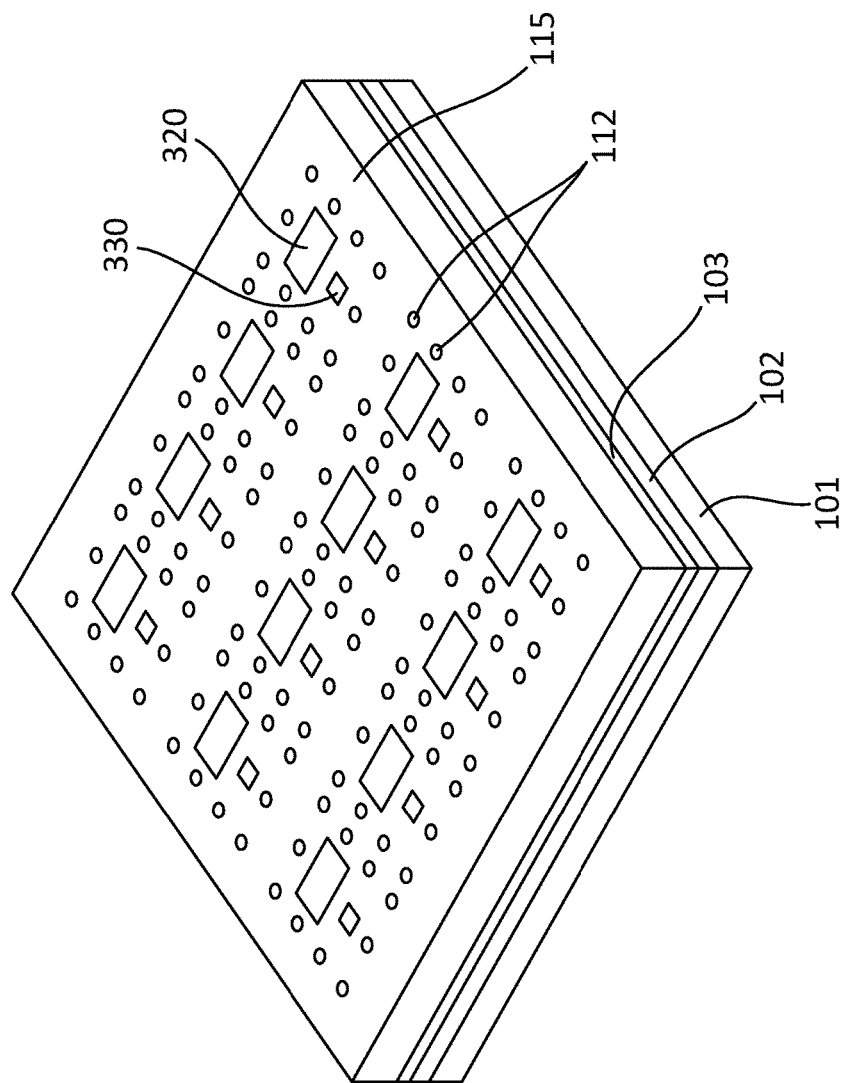
FIGS. 37A and 37B show perspective and cross-sectional view of an example method for manufacturing an example semiconductor device.
Figure 37B:
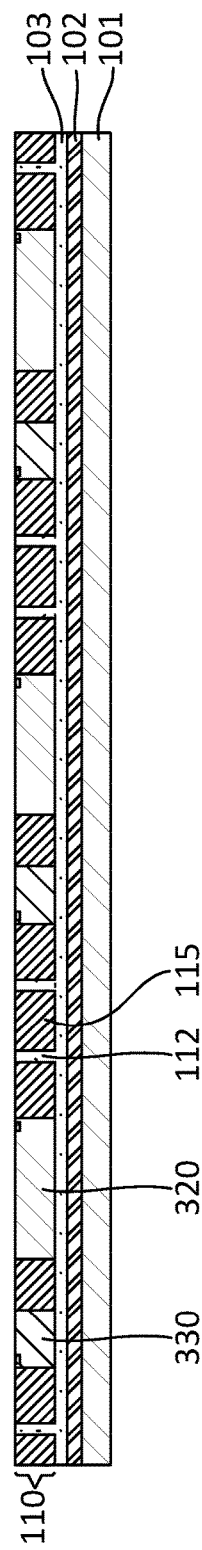

FIGS. 37A and 37B show perspective and cross-sectional view of semiconductor device 300 at a later stage of manufacture. In the example shown in FIGS. 37A and 37B, photosensitive film 117 can be removed from the top sides of encapsulant 115 and/or electronic components 320 and 330. In some examples, the top sides of substrate interconnects 112 can be substantially coplanar with the top sides of electronic components 320 and 330 and encapsulant 115. In some examples, the top sides of substrate interconnects 112 can be exposed through the top side of encapsulant 115.

Substrate 110 can include encapsulant 115 and substrate interconnects 112, and can be configured such that pairs of electronic components 320 and 330 are embedded in parallel in encapsulant 115 and/or in substrate 110, providing reduced thickness for semiconductor device 300.

Figure 38A:
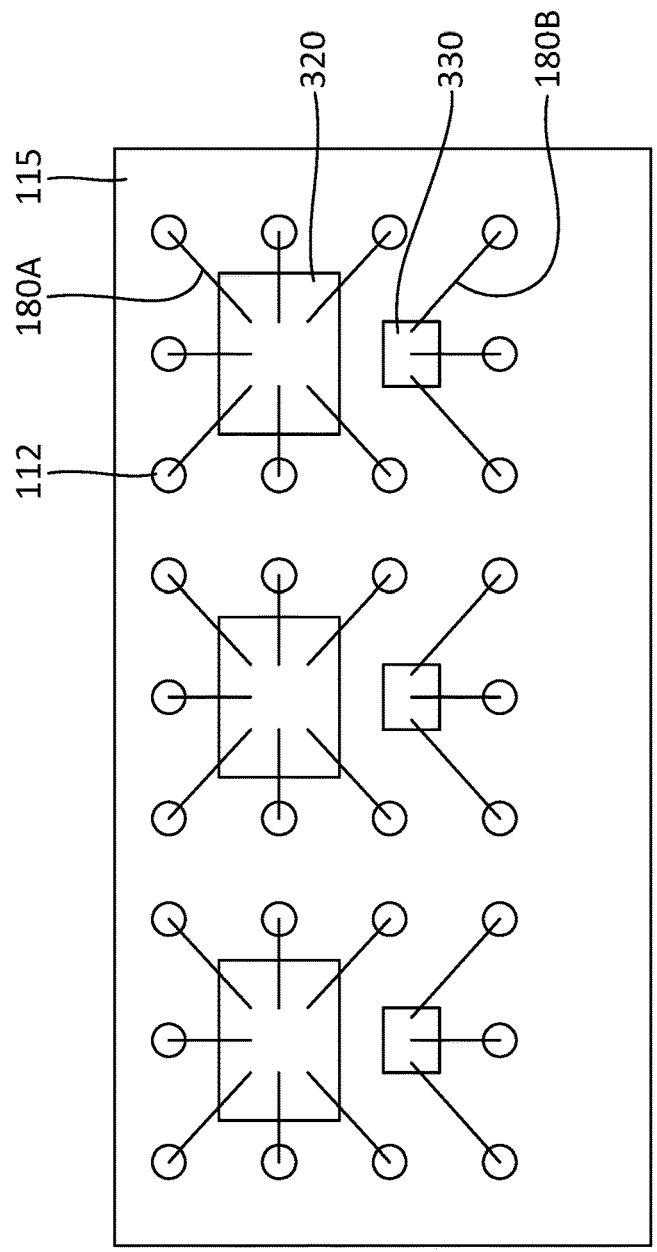
FIGS. 38A and 38B show top plane and cross-sectional view of an example method for manufacturing an example semiconductor device.
Figure 38B:
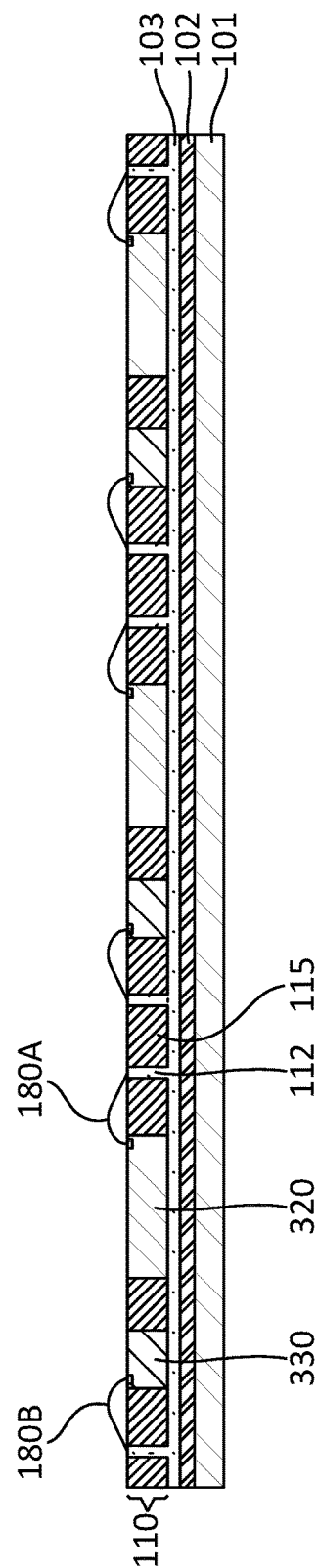

FIGS. 38A and 38B show top plane and cross-sectional view of semiconductor device 300 at a later stage of manufacture. In the example shown in FIGS. 38A and 38B, internal interconnect 180A can electrically connect terminal 321 of electronic component 320 and an adjacent substrate interconnect 112, and internal interconnect 180B can electrically connect terminal 331 of electronic component 330 and an adjacent substrate interconnect 112. In some examples, internal interconnect 180A can allow electronic component 320 to be electrically connected to an external component. In some examples, internal interconnect 180B can allow electronic component 330 to be electrically connected to an external component.

Figure 39A:
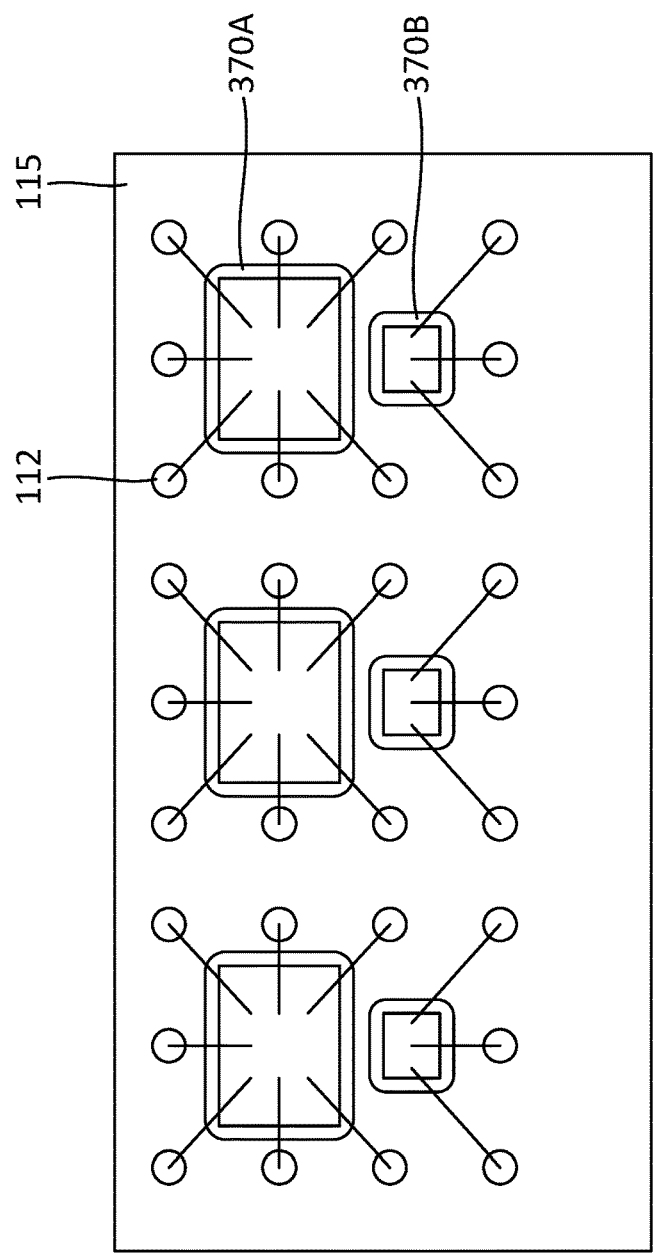
FIGS. 39A and 39B show top plane and cross-sectional view of an example method for manufacturing an example semiconductor device.
Figure 39B:
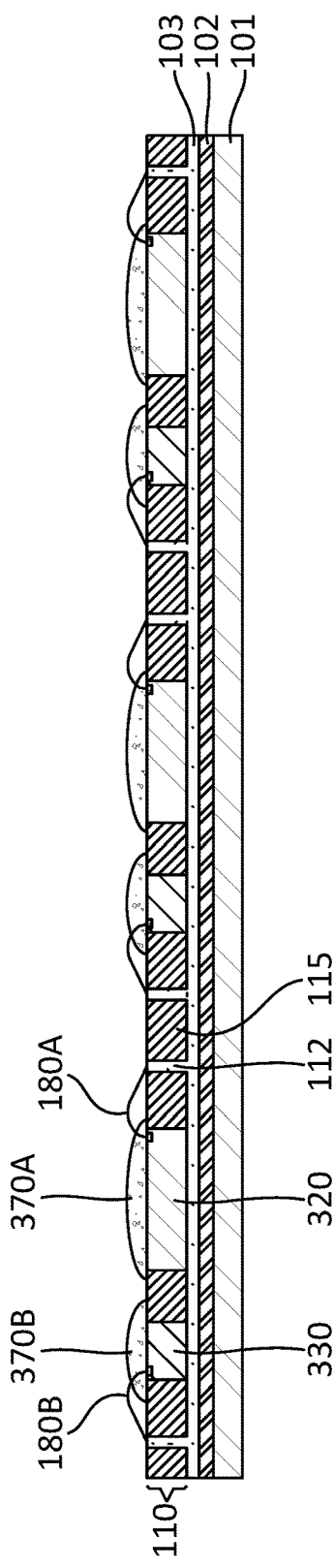

FIGS. 39A and 39B show top plane and cross-sectional view of semiconductor device 300 at a later stage of manufacture. In the example shown in FIGS. 39A and 39B, protective layers 370A and 370B can cover electronic components 320 and 330. In some examples, protective layers 370A and 370B can cover the entire top sides of electronic components 320 and 330 and can also cover some regions of encapsulant 115 around electronic components 320 and 330 and some regions of internal interconnects 180A and 180B. In some examples, some regions of internal interconnects 180A and 180B can be exposed from protective layers 370A and 370B. Protective layers 370A and 370B can be made from translucent materials, whether transparent or semi-transparent to radiation such as light. In some examples, each of protective layers 370A and 370B can comprise or be referred to as an insulator, a dielectric, a protection layer, a translucent layer, or a FOW (Film Over Wire or Film On Wire).

In some examples, protective layers 370A and 370B can be derived from liquid-phase insulators. In some examples, a constant amount of liquid-phase insulator can be applied to the top side of each of electronic components 320 and 330. Here, the liquid-phase insulator can cover some regions of internal interconnects 180A and 180B. The liquid-phase insulator can exist in a liquid phase when it is in a packing material. However, once the liquid-phase insulator is applied to top sides of electronic components 320 and 330, like in this disclosure, it can turn into a solid-phase insulator. In some examples, after being applied to top sides of electronic components 320 and 330, the liquid-phase insulator can be in a liquid phase at room temperature and can turn into a solid-phase insulator when it is heated to a temperature higher than a reference temperature and then cooled. Each of protective layers 370A and 370B can have a round section (e.g., an upper boundary) having a radius of curvature because of manufacturing characteristics. Protective layers 370A and 370B can have a thickness in the range from approximately 50 μm to approximately 100 μm. Protective layers 370A and 370B can prevent the top sides of electronic components 320 and 330 from being corroded or damaged.

FIGS. 40A and 40B show top plane and cross-sectional view of semiconductor device 300 at a later stage of manufacture. In the example shown in FIGS. 40A and 40B, cover structure 350 can be attached to substrate 110.

Cover structure 350 can comprise compartment 351 over and surrounding electronic component 320 and internal interconnect 180A. Compartment 351 comprises aperture 390A that extends through a top side of cover structure 350 and that allows light or radiation to be incident on electronic component 320. Cover structure 350 can comprise compartment 352 over and surrounding electronic component 330 and internal interconnect 180B. Compartment 352 comprises aperture 390B that extends through a top side of cover structure 350 and that allows radiation such as light to be emitted from electronic component 330. In some examples, apertures 390A or 390B can comprise a translucent material, or a translucent material can be located on or under apertures 390A or 390B. In some examples, each of apertures 390A and 390B can be shaped as a circle, or can have a diameter or breadth in the range from approximately 400 μm to approximately 600 μm. Cover structure 350 can comprise divisor wall 355 that divides compartment 351 and compartment 352 from each other, and that can restrict radiation of electronic component 330 at compartment 352 from being directly incident on electronic component 320 or compartment 351. Cover structure 350 can be referred to as a lid, a cap, or a cover. In some examples, cover structure 350 can be pre-fabricated using a metal, plastic, laminate substrate, or ceramic, and can be bonded or adhered to encapsulant 115 of substrate 110. Cover structure 350 can have a height in the range from approximately 400 μm to approximately 600 μm. Cover structure 350 generally can protect electronic components 320 and 330 and internal interconnects 180A and 180B from external elements and/or environmental exposure. In addition, compartments 351 and 352 of cover structure 350 can prevent the radiation emitted from, for example, electronic component 330, from being incident into adjacent electronic component 320.

Figure 41:
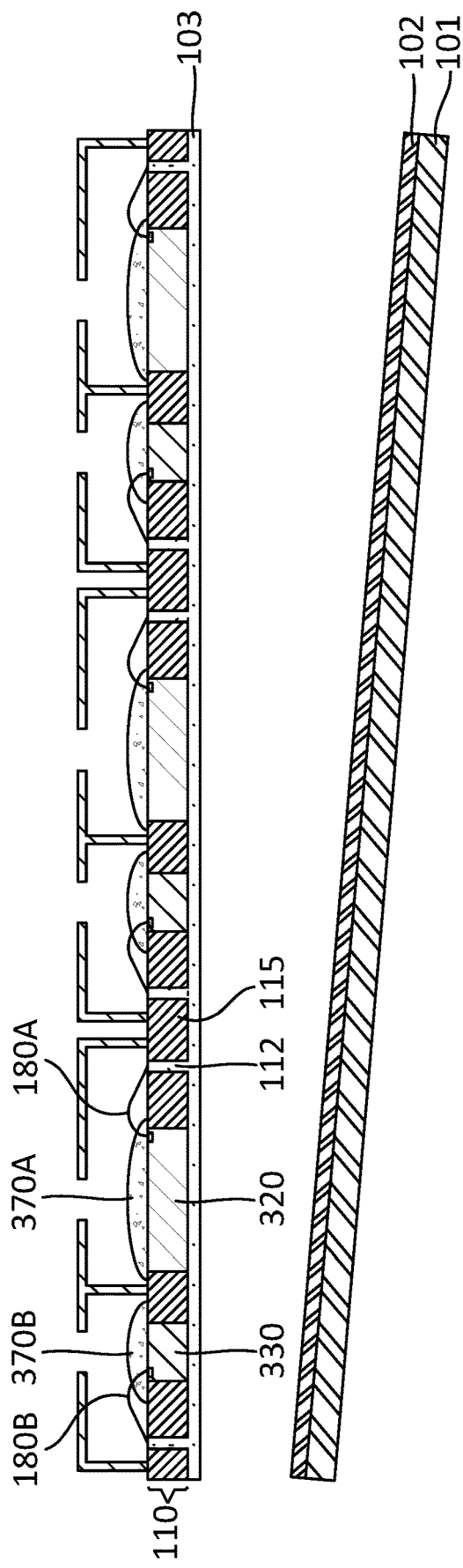
FIG. 41 shows cross-sectional view of an example method for manufacturing an example semiconductor device.

FIG. 41 shows cross-sectional view of semiconductor device 300 at a later stage of manufacture. In the example shown in FIG. 41, carrier 101 can be separated from conductive layer 103. In some examples, temporary bond layer 102 can be separated from conductive layer 103 while attached to carrier 101. In some examples, heat, light, a chemical solution and/or a physical external force can be provided, thereby removing or reducing a bonding strength of temporary bond layer 102. Accordingly, conductive layer 103 can be exposed.

Figure 42:
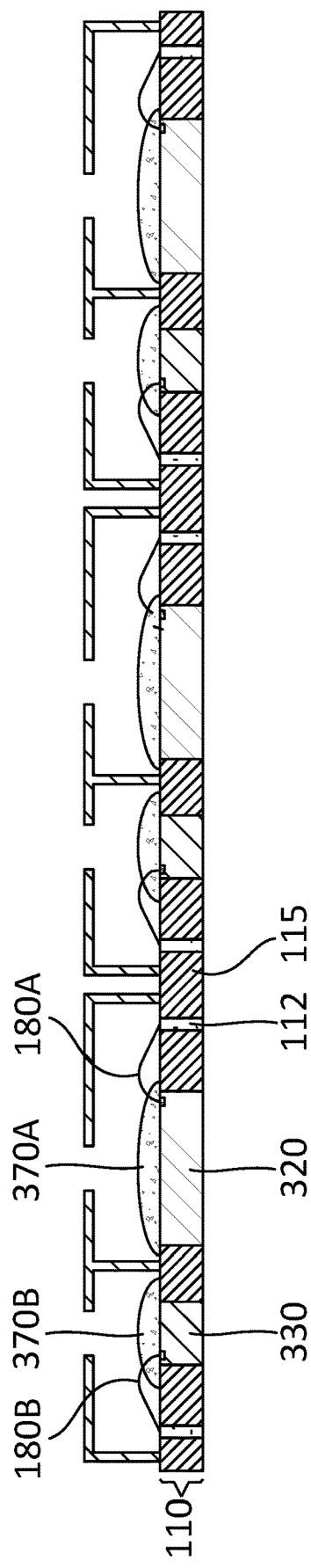
FIG. 42 shows cross-sectional view of an example method for manufacturing an example semiconductor device.

FIG. 42 shows cross-sectional view of semiconductor device 300 at a later stage of manufacture. In the example shown in FIG. 42, conductive layer 103 can be removed. In some examples, conductive layer 103 can be removed by mechanical grinding and/or chemical etching. Accordingly, bottom sides of electronic components 320 and 330, substrate interconnects 112 and substrate encapsulant 115 can be exposed. In some examples, bottom sides of electronic components 320 and 330, substrate interconnects 112 and substrate encapsulant 115 can be substantially coplanar. In some examples, the bottom sides of electronic components 320 and 330 and the bottom sides of substrate interconnects 112 can be exposed through the bottom side of encapsulant 115.

Figure 43:
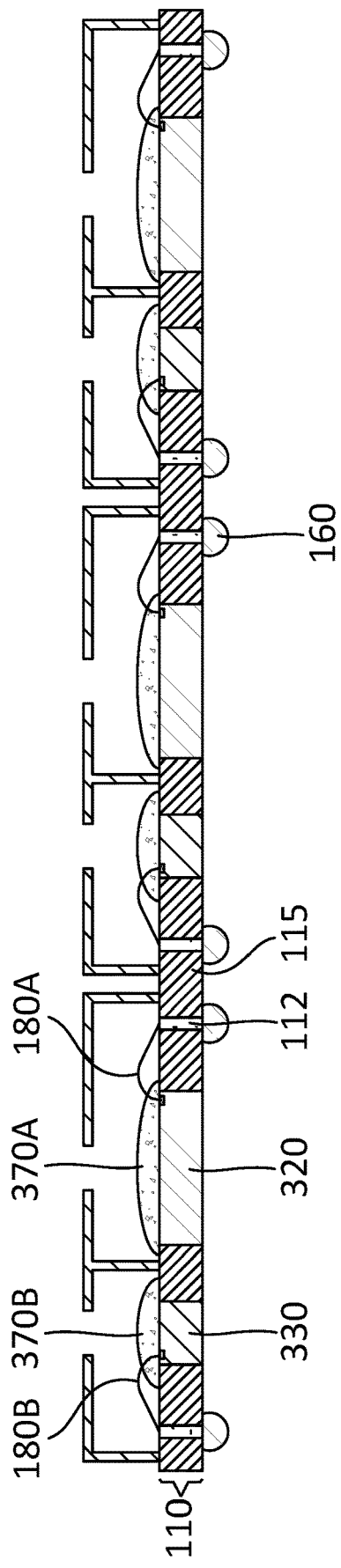
FIG. 43 shows cross-sectional view of an example method for manufacturing an example semiconductor device.

FIG. 43 shows cross-sectional view of semiconductor device 300 at a later stage of manufacture. In the example shown in FIG. 43, external interconnects 160 can be provided on the bottom sides of substrate interconnects 112. External interconnects 160 can comprise or be connected to substrate interconnects 112 through a low melting point material. External interconnects 160 can allow semiconductor device 300 to be mounted to an external device.

Figure 44:
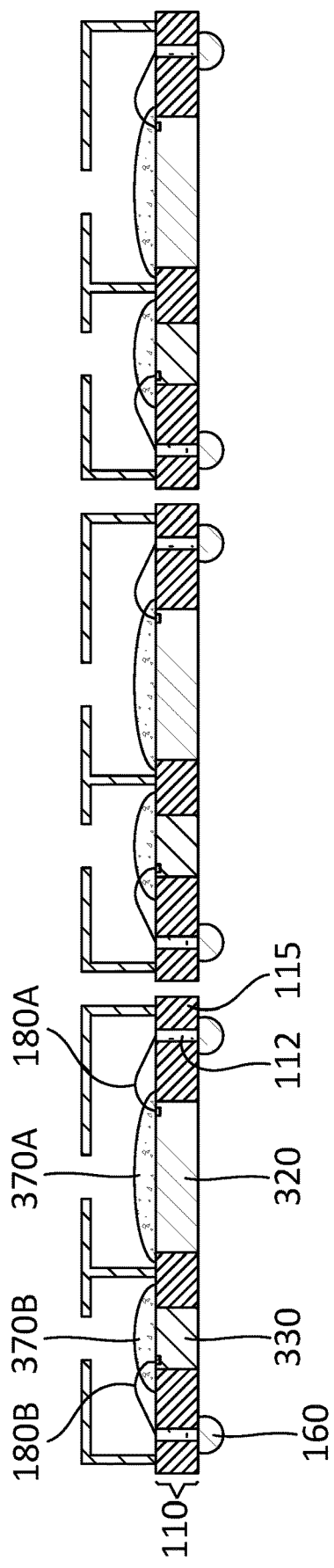
FIG. 44 shows cross-sectional view of an example method for manufacturing an example semiconductor device.

FIG. 44 shows cross-sectional view of semiconductor device 300 at a later stage of manufacture. In the example shown in FIG. 44, semiconductor device 300 can be singulated into discrete semiconductor devices. In some examples, semiconductor device 300 can be singulated into discrete semiconductor devices by a diamond blade or laser beam. In some examples, sidewalls of substrate encapsulant 115 and cover structure 350 can be made substantially coplanar.

When singulated, semiconductor device 300 can correspond to the depiction shown in FIG. 31. As can be appreciated there, electronic component 320 and electronic component 330 are coupled to or embedded in substrate 110, with their sidewalls coated by encapsulant 115 and their top sides exposed from encapsulant 115. In some examples, the bottom sides of electronic component 320 or electronic component 330 can be exposed from encapsulant 115 at the bottom side of substrate 110. In some examples, the top side of electronic deice 320 comprises an active area and terminal 321. In some examples, the top side of electronic device 330 comprises an active area and terminal 322. Internal interconnect 180A couples terminal 321 to a substrate interconnect 112 of substrate 110, and internal interconnect 180B couples terminal 331 to another substrate interconnect 112 of substrate 110. Electronic devices 320 and 330 are separated from each other by a portion of encapsulant 115 of substrate 110. Cover structure 350 comprises divisor wall 355 that divides compartments 351 and 352 and that is located over the portion of encapsulant 115 that separates electronic component 320 from electronic component 330. In some examples, electronic component 320 can comprise a radiation emitting component that emits radiation through aperture 390B of compartment 352. In some examples, electronic component 330 can comprise a radiation receiver component that, through aperture 390A of compartment 351, senses or detects a reflection of the radiation emitted by electronic component 320. In some examples, protective layers 370A and 370B can be translucent with respect to the radiation emitted by electronic component 330, permitting emission of such radiation from electronic device 330 and detection of a reflection of such radiation by electronic device 320. In some examples, divisor wall 355 or compartment 351 can be opaque with respect to the radiation emitted by electronic component 330, restricting such radiation from entering compartment 351 and directly inciding upon electronic component 320 other than through aperture 390A.

Semiconductor device 300 having reduced dimensions can be achieved by the manufacturing method described. In some examples, as the thickness and width of semiconductor device 300 can be reduced by such manufacturing method, semiconductor device 300 can be suitably applied to a wearable device.

Figure 45:
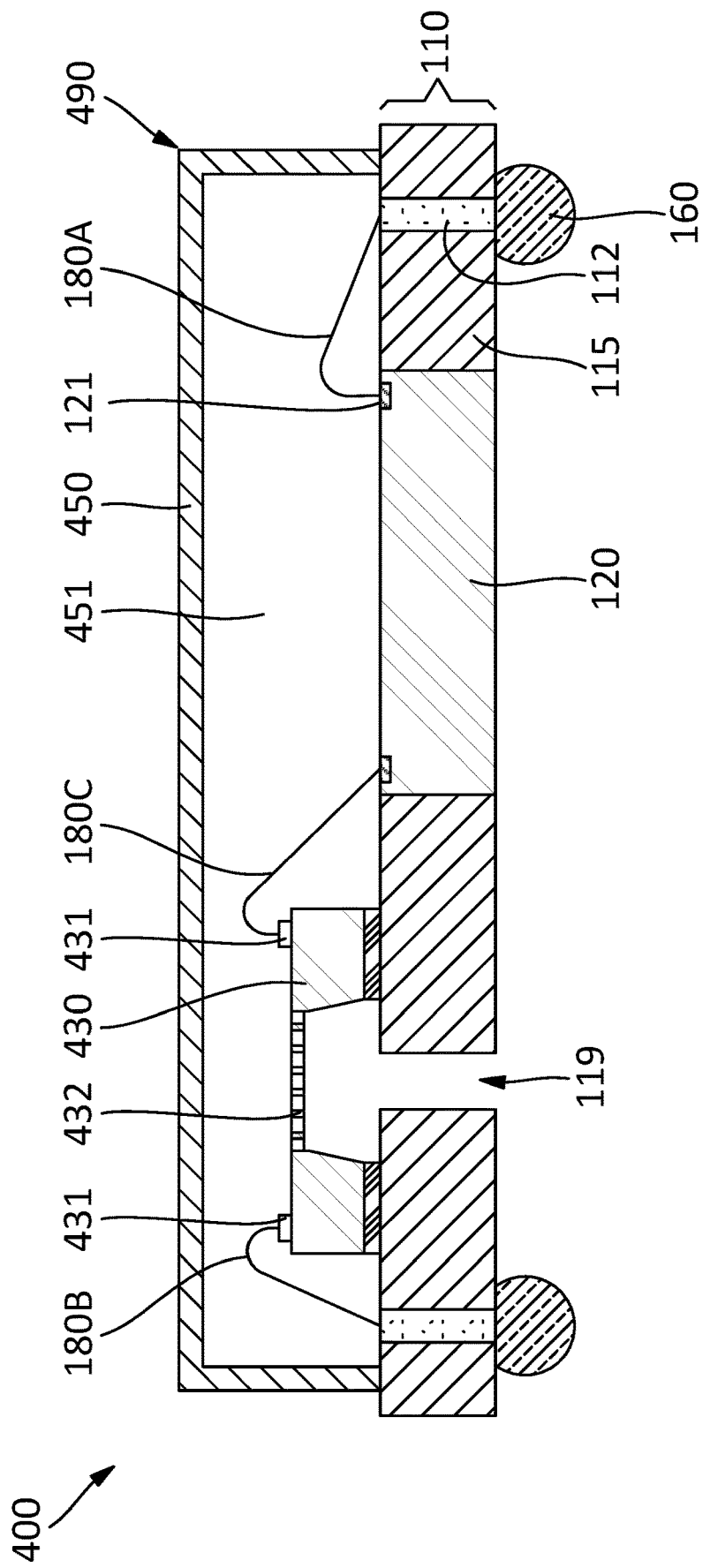
FIG. 45 shows a cross-sectional view of an example semiconductor device.
Figure 46C:
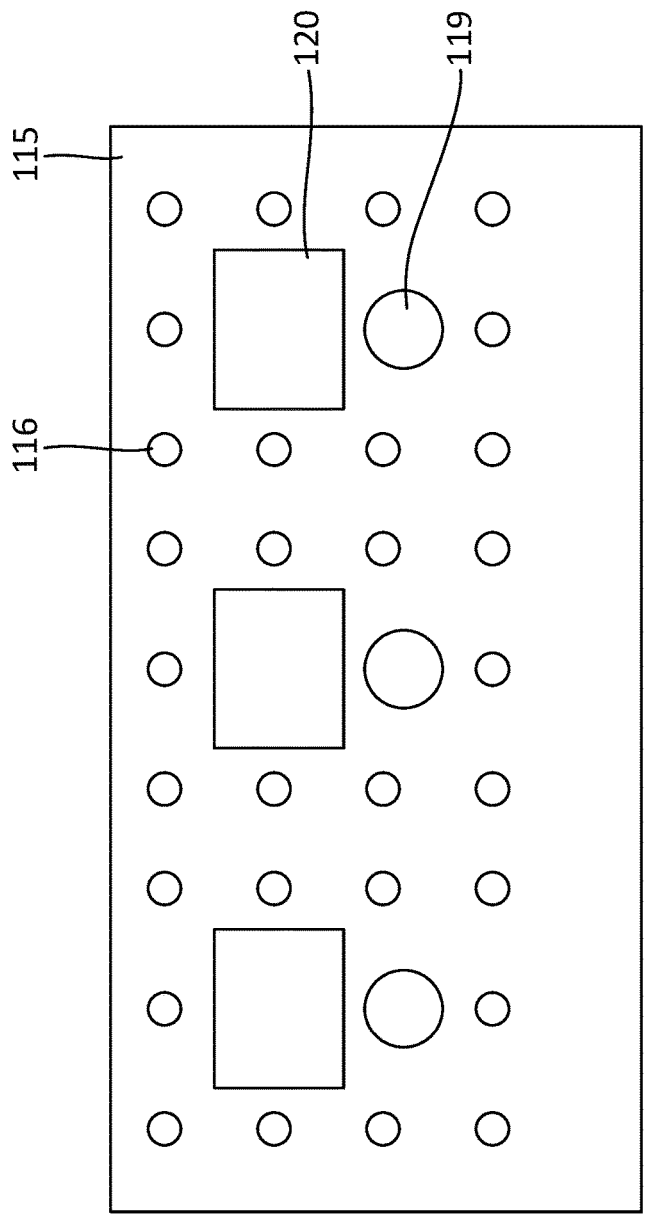
Figure 46D:
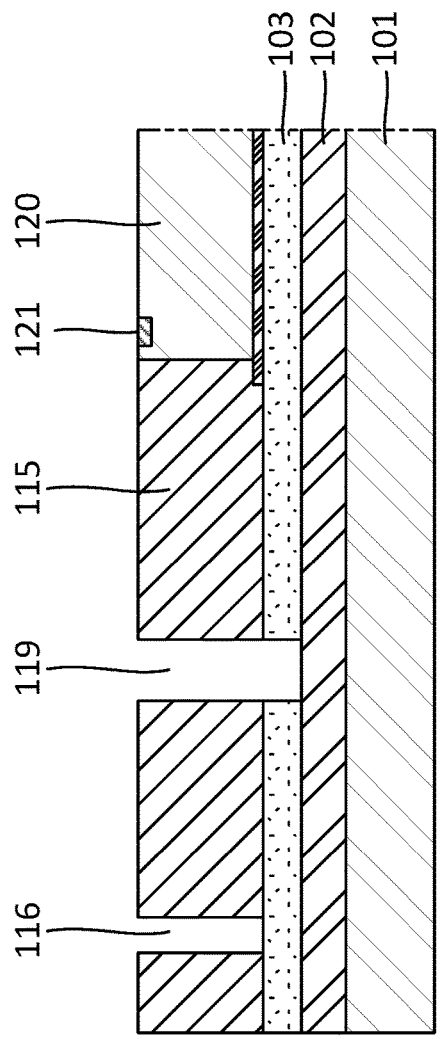

FIG. 45 shows a cross-sectional view of an example semiconductor device 400. In the example shown in FIG. 45, semiconductor device 400 can comprise a substrate 110, electronic components 120 and 430 and a cover structure 450.

Substrate 110 can further comprise an opening or aperture 119, compared to substrates in other examples of this disclosure. Electronic component 430 can comprise a terminal 431 and a MEMS region 432. Cover structure 450 can comprise a compartment 451.

Substrate 110, cover structure 450, external interconnects 160 and internal interconnects 180A, 180B and 180C can be referred to a semiconductor package 490, which can provide electronic components 120 and 430 with protection from external elements and/or environmental exposure. In addition, semiconductor package 490 can provide electrical coupling between an external component and external interconnects 160.

FIGS. 46 to 56 show various drawings of an example method for manufacturing semiconductor device 400.

FIGS. 46A, 46B, 46C and 46D show perspective, top plane, cross-sectional and enlarged cross-sectional view of semiconductor device 400 at an early stage of manufacture. In the example shown in FIGS. 46A and 46B, at least two types of openings 116 and 119 can be formed in encapsulant 115. Opening (aperture) 119 positioned adjacent to electronic component 120 can have a relatively larger diameter and can pass through encapsulant 115 and conductive layer 103. Opening 116 can be formed about sides of electronic components 120 and 430 and opening 119, and can pass through encapsulant 115. Here, opening 119 having a relatively larger diameter or breadth can be formed to permit an external signal, such as a pressure signal, to reach electronic component 430. Openings 116 having a relatively smaller diameter can be plurally formed to provide a path to substrate interconnects 112.

The formation of opening 119 can be similar to the formation of opening 116 as described with respect to other examples here. Opening 119 can have a diameter in the range from approximately 400 µm to approximately 500 µm, and openings 116 can have a diameter in the range from approximately 5 µm to approximately 20 µm.

Figure 47C:
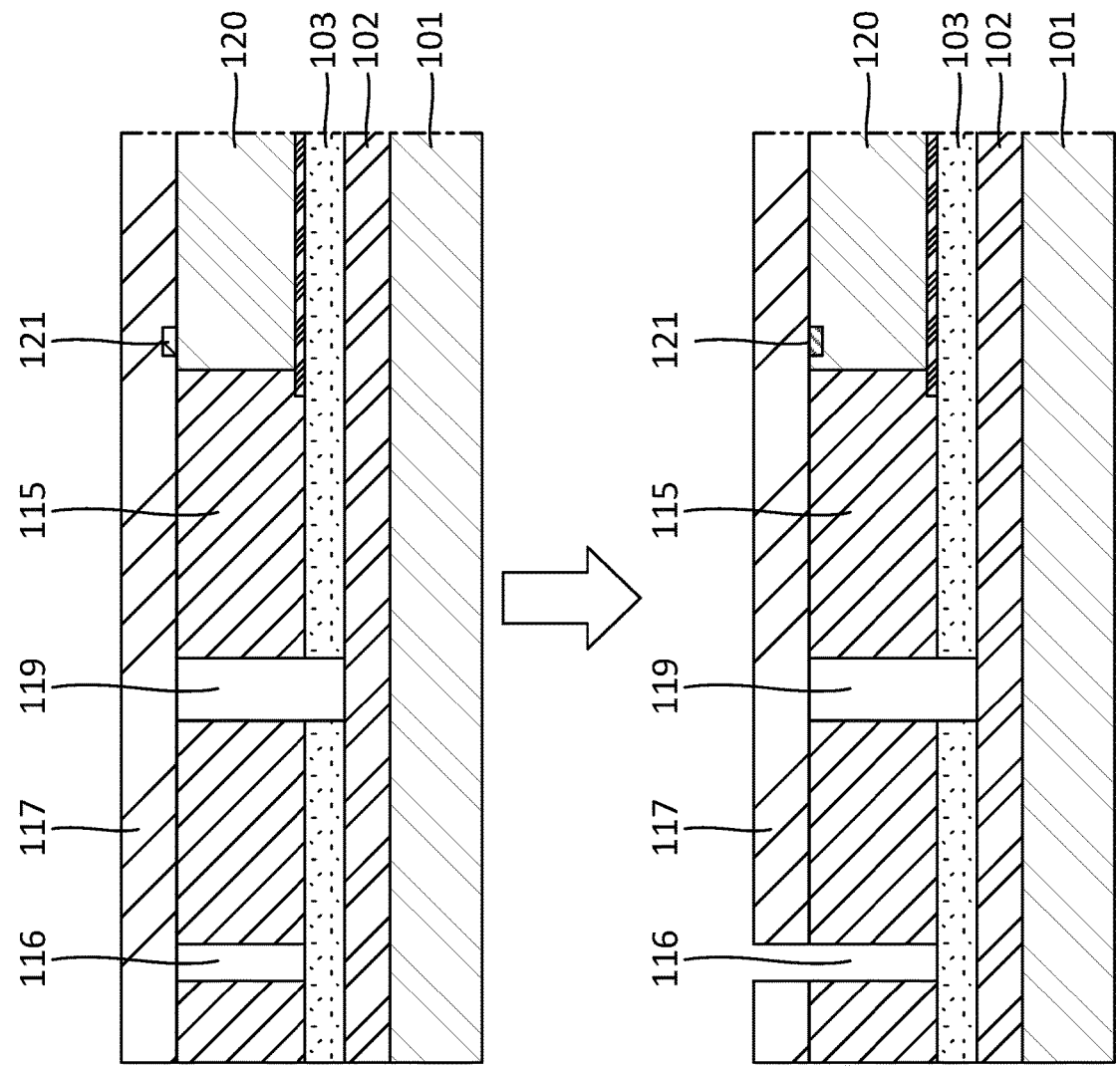

FIGS. 47A, 47B and 47C show perspective, cross-sectional and enlarged cross-sectional view of semiconductor device 400 at a later stage of manufacture. In the example shown in FIGS. 47A and 47B, photosensitive film 117 can be laminated on the top sides of electronic components 120 and 430 and encapsulant 115 and then patterned. Photosensitive film 117 can close openings 116 and 119 formed in encapsulant 115, but only opening 116 can be opened by a patterning process. In some examples, openings can be formed in photosensitive film 117 as the result of patterning. Accordingly, openings of photosensitive film 117 can be connected with openings 116 of encapsulant 115. Here, opening 119 can be still in a closed state.

Figure 48A:
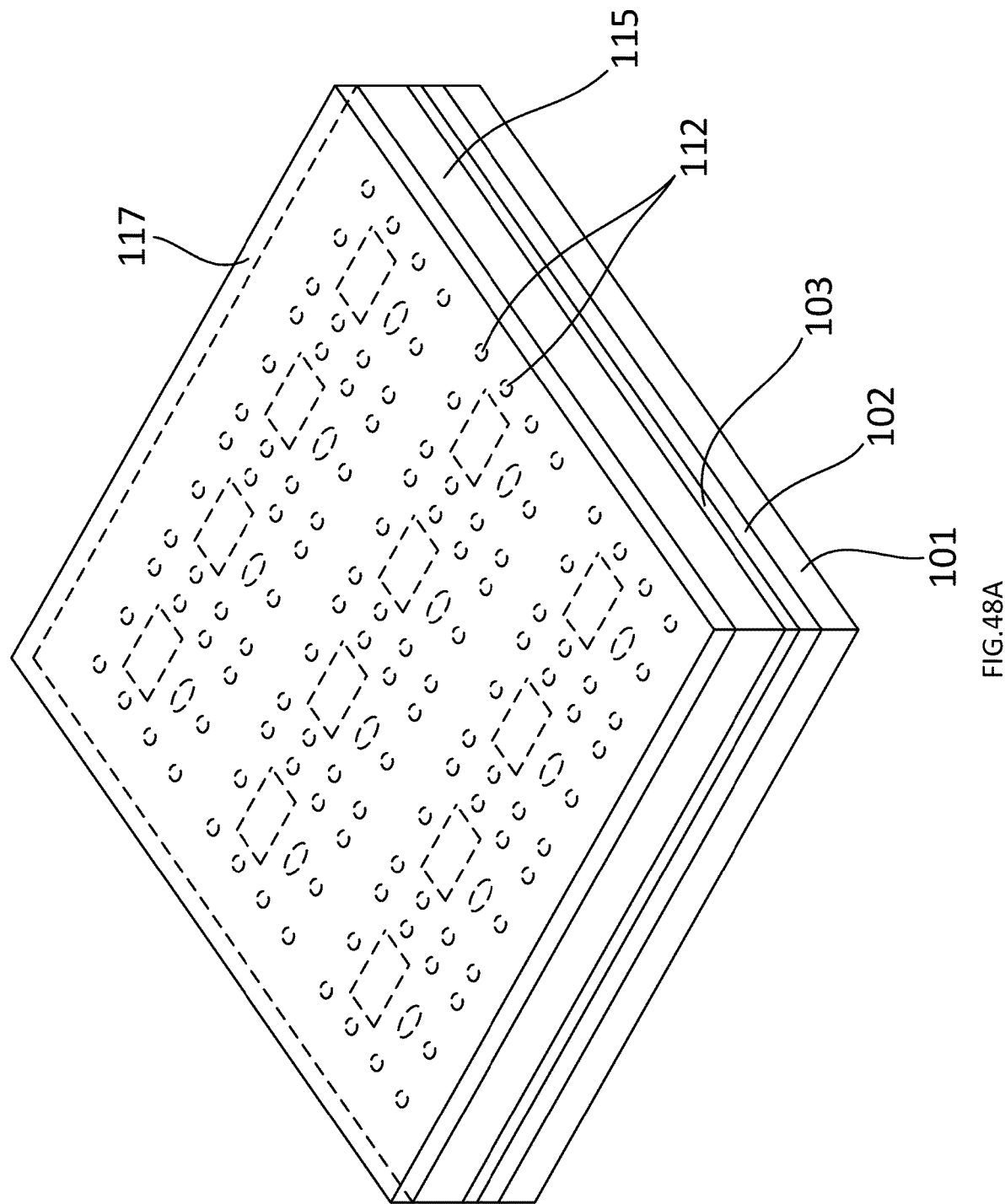
FIGS. 48A, 48B and 48C show perspective, cross-sectional and enlarged cross-sectional view of an example method for manufacturing an example semiconductor device.
Figure 48B:
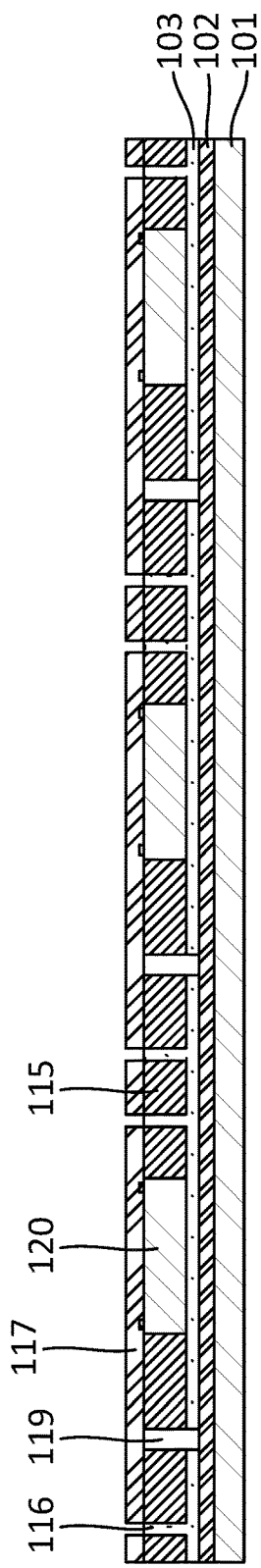
Figure 48C:
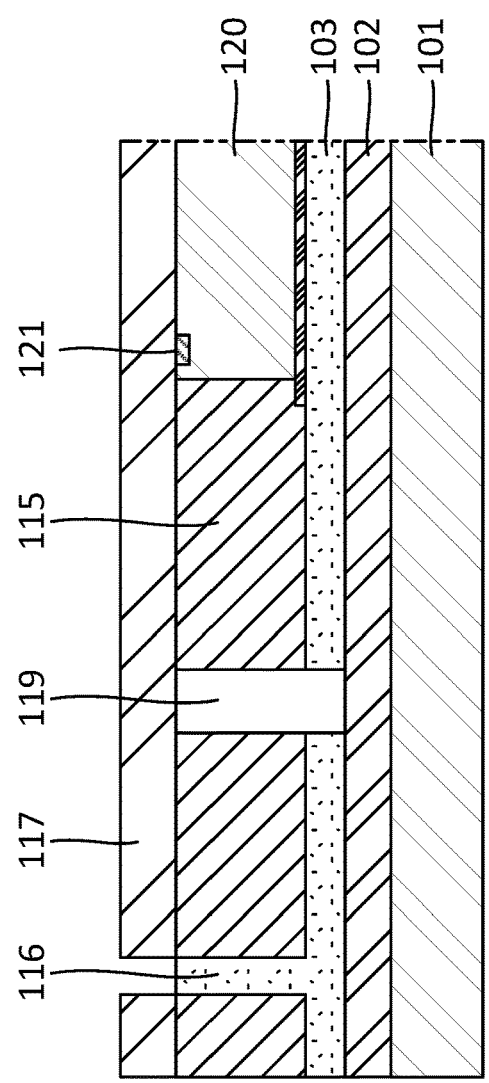

FIGS. 48A, 48B and 48C show perspective, cross-sectional and enlarged cross-sectional view of semiconductor device 400 at a later stage of manufacture. In the example shown in FIGS. 48A and 48B, substrate interconnects 112 can be formed in openings 116 of encapsulant 115. In some examples, substrate interconnects 112 can be filled in openings 116 of encapsulant 115. In some examples, since opening 119 of substrate 110 is still closed by photosensitive film 117, no interconnect is formed in opening 119.

FIGS. 49A, 49B, 49C and 49D show perspective, cross-sectional, top plane and enlarged cross-sectional view of semiconductor device 400 at a later stage of manufacture. In the example shown in FIGS. 49A and 49B, photosensitive film 117 can be removed from the top sides of encapsulant 115 and/or electronic component 120. The top sides of substrate interconnects 112 can be substantially coplanar with the top sides of electronic component 120 and encapsulant 115. In some examples, the top sides of substrate interconnects 112 can be exposed through the top side of encapsulant 115. In addition, opening 119 and temporary bond layer 102 disposed at an interior side of opening 119 can be exposed through encapsulant 115.

Substrate 110 can include encapsulant 115, substrate interconnects 112 and opening 119, and can be configured such that electronic component 120 is embedded in encapsulant 115. In some examples, electronic component 120 can be embedded in substrate 110, and opening 119 can be formed in substrate 110, providing semiconductor device 400 having a reduced thickness and improved efficiency.

Figure 50A:
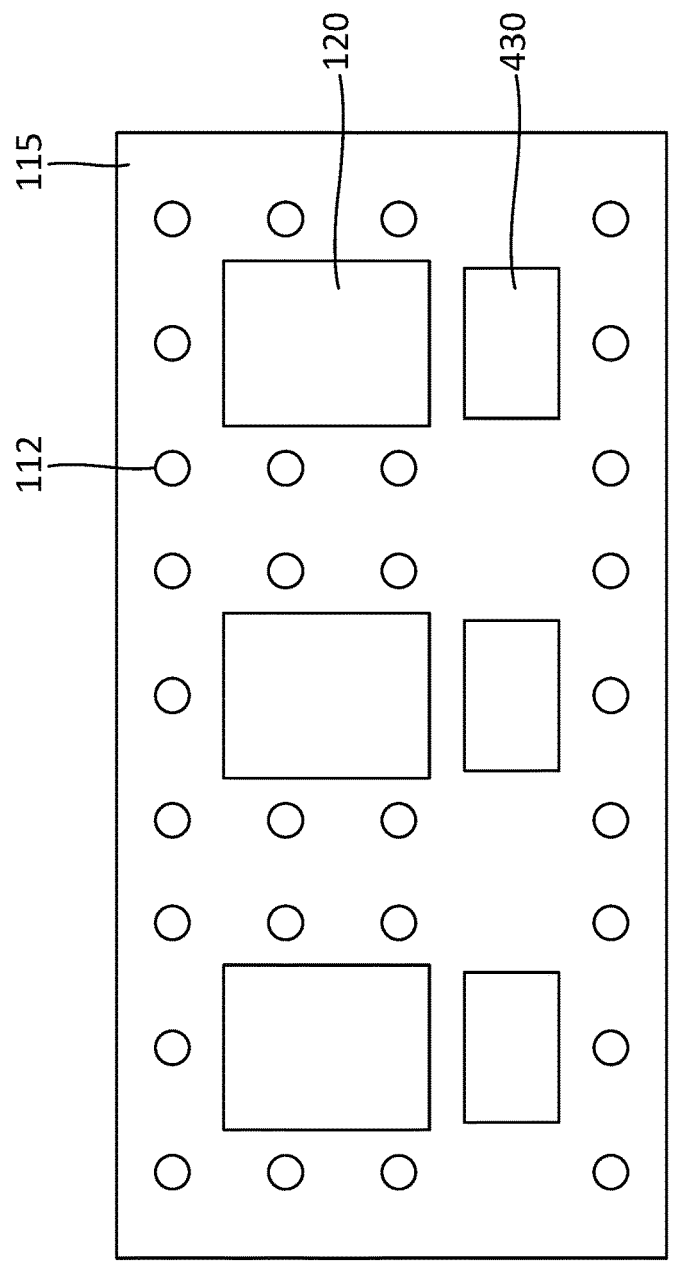
FIGS. 50A and 50B show perspective and cross-sectional view of an example method for manufacturing an example semiconductor device.
Figure 50B:
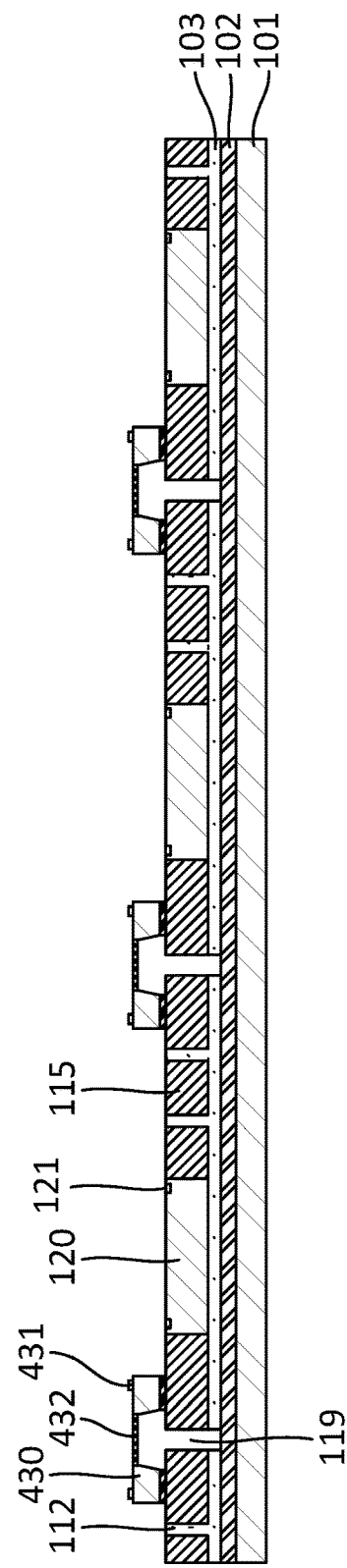

FIGS. 50A and 50B show perspective and cross-sectional view of semiconductor device 400 at a later stage of manufacture. In the example shown in FIGS. 50A and 50B, electronic component 430 can be attached to encapsulant 115 of substrate 110. In some examples, electronic component 430 can be provided over a region corresponding to (overlapping) opening 119 formed in encapsulant 115. In some examples, opening 119 of encapsulant 115 can be closed by electronic component 430. Accordingly, an external signal (e.g., pressure, sound, etc.) can be transmitted to electronic component 430 through opening 119 of substrate 110. In some examples, electronic component 430 can be adhered to encapsulant 115 of substrate 110 using an adhesive. In some examples, electronic component 430 can comprise a terminal 431 and a MEMS region (e.g., a diaphragm region) 432 that is exposed to opening 119. Electronic component 430 can comprise or be referred to as a MEMS, a semiconductor die or a semiconductor chip. Electronic component 430 can have a thickness in the range from approximately 150 µm to approximately 250 µm. Electronic component 430 can function as a microphone or a pressure sensor.

FIGS. 51A and 51B show perspective and cross-sectional view of semiconductor device 400 at a later stage of manufacture. In the example shown in FIGS. 51A and 51B, internal interconnect 180A can electrically connect electronic component 120 and substrate interconnects 112, internal interconnect 180B can electrically connect electronic component 430 and substrate interconnects 112, and internal interconnect 180C can electrically connect electronic component 120 and electronic component 430. In some examples, an active region of electronic component 120 can comprise processing circuitry for processing signals from the MEMS of electronic component 430. In some examples, internal interconnect 180A can allow electronic component 120 to be electrically connected to an external component, and internal interconnect 180B can allow electronic component 430 to be electrically connected to an external component.

Figure 52A:
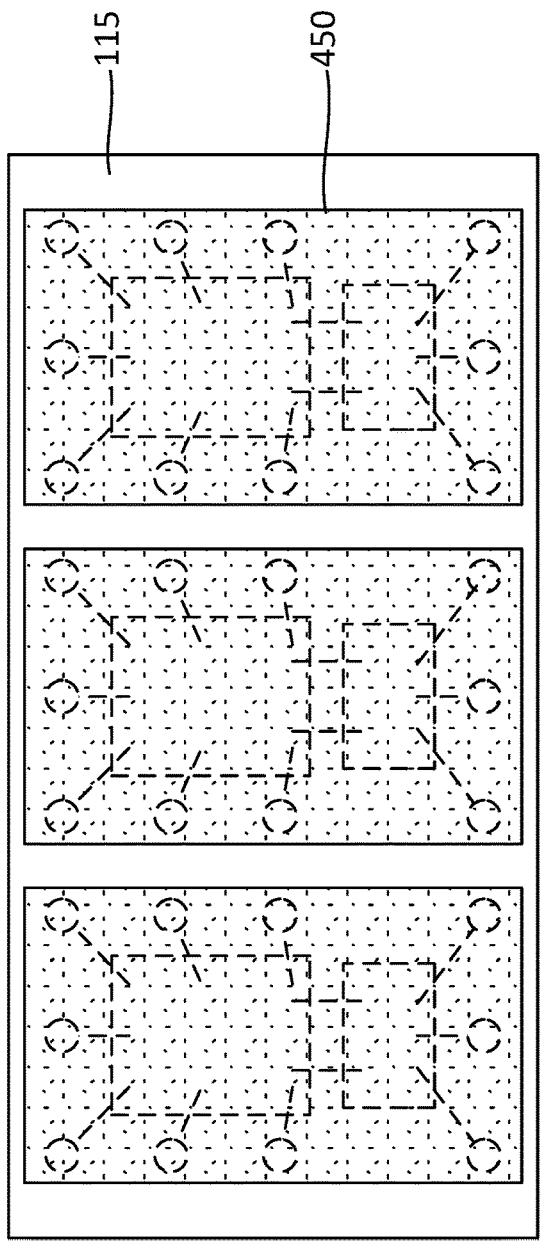
FIGS. 52A and 52B show perspective and cross-sectional view of an example method for manufacturing an example semiconductor device.
Figure 52B:
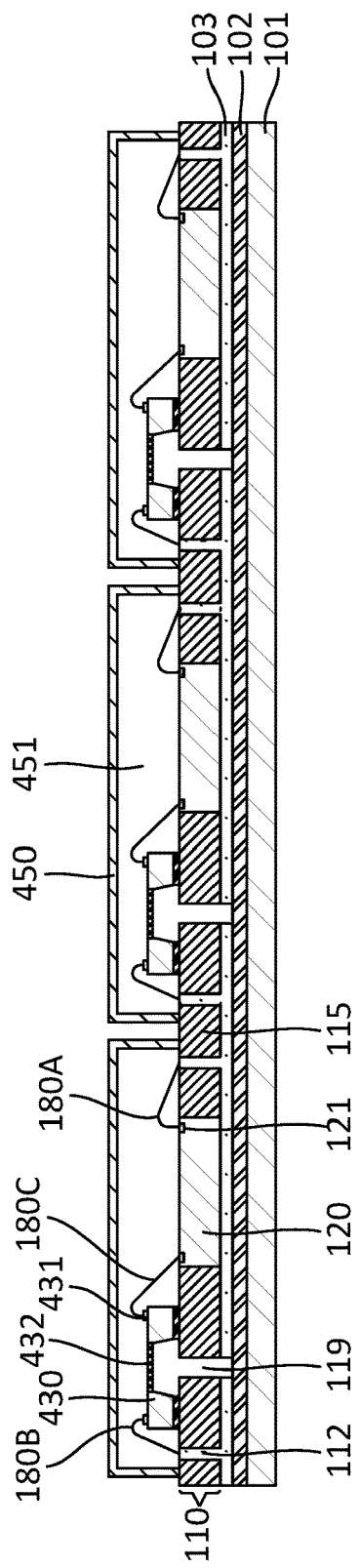

FIGS. 52A and 52B show perspective and cross-sectional view of semiconductor device 400 at a later stage of manufacture. In the example shown in FIGS. 52A and 52B, cover structure 450 can be adhered to substrate 110. Cover structure 450 can cover electronic components 120 and 430 and can define compartment 451 surrounding internal interconnects 180A, 180B and 180C. Cover structure 450 can generally protect electronic components 120 and 430 and internal interconnects 180A, 180B and 180C from external elements and/or environmental exposure.

Figure 53:
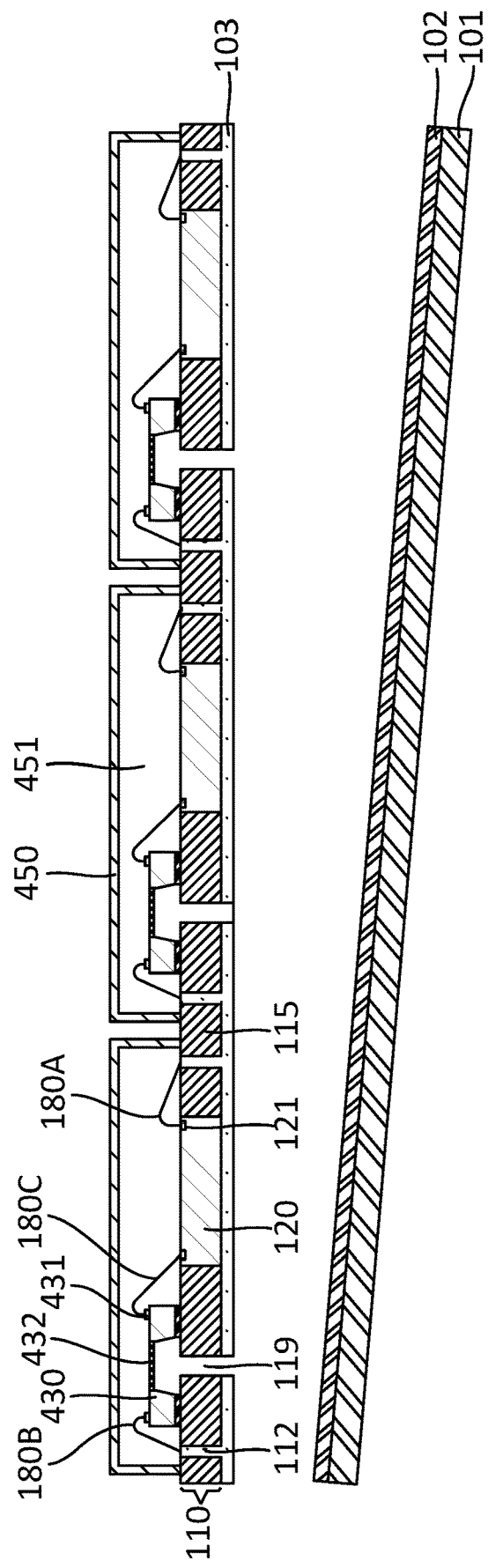
FIG. 53 shows cross-sectional view of an example method for manufacturing an example semiconductor device.

FIG. 53 shows cross-sectional view of semiconductor device 400 at a later stage of manufacture. In the example shown in FIG. 53, carrier 101 can be separated from conductive layer 103. In some examples, temporary bond layer 102 can be separated from conductive layer 103 while attached to carrier 101. Accordingly, conductive layer 103 can be exposed. In addition, in some examples, opening 119 can also be exposed.

Figure 54:
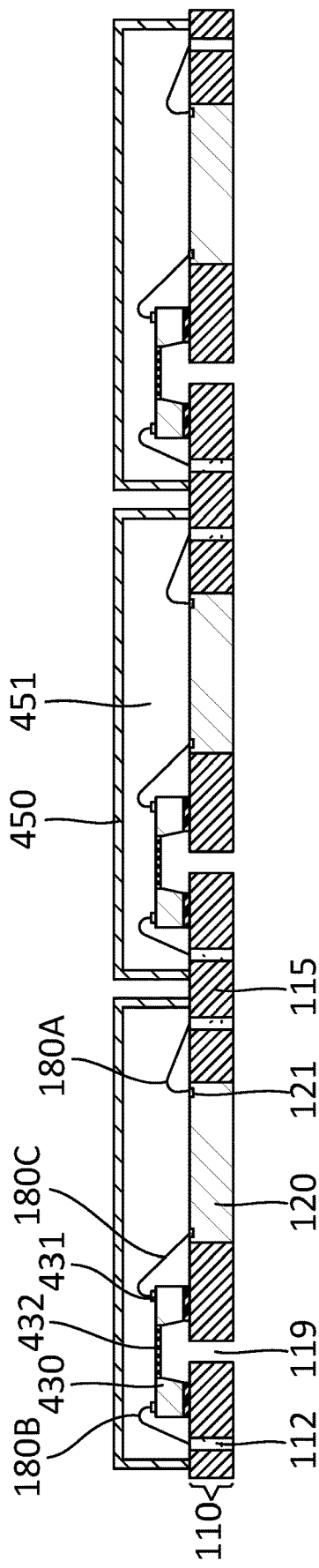
FIG. 54 shows cross-sectional view of an example method for manufacturing an example semiconductor device.

FIG. 54 shows cross-sectional view of semiconductor device 400 at a later stage of manufacture. In the example shown in FIG. 54, conductive layer 103 can be removed. In some examples, conductive layer 103 can be removed by mechanical grinding and/or chemical etching. Bottom sides of electronic component 430, substrate interconnects 112 and encapsulant 115 can be exposed. In some examples, opening 119 positioned to correspond to electronic component 430 can be exposed through encapsulant 115.

Figure 55:
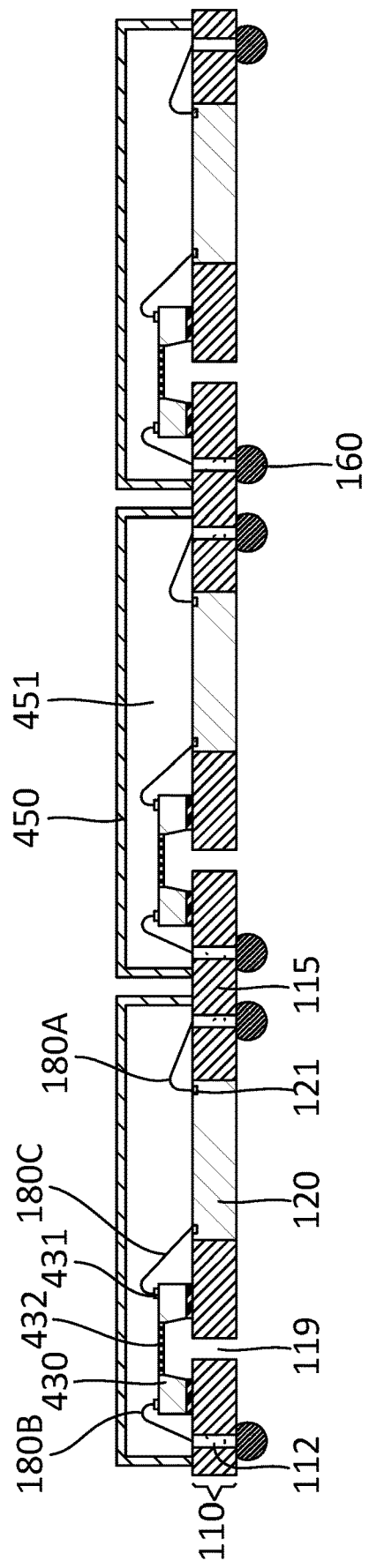
FIG. 55 shows cross-sectional view of an example method for manufacturing an example semiconductor device.

FIG. 55 shows cross-sectional view of semiconductor device 400 at a later stage of manufacture. In the example shown in FIG. 55, external interconnects 160 can be provided on the bottom sides of substrate interconnects 112. In this way, opening 119 passing through substrate 110 and electronic component 120 embedded in substrate 110 can be positioned/exposed between external interconnects 160.

Figure 56:
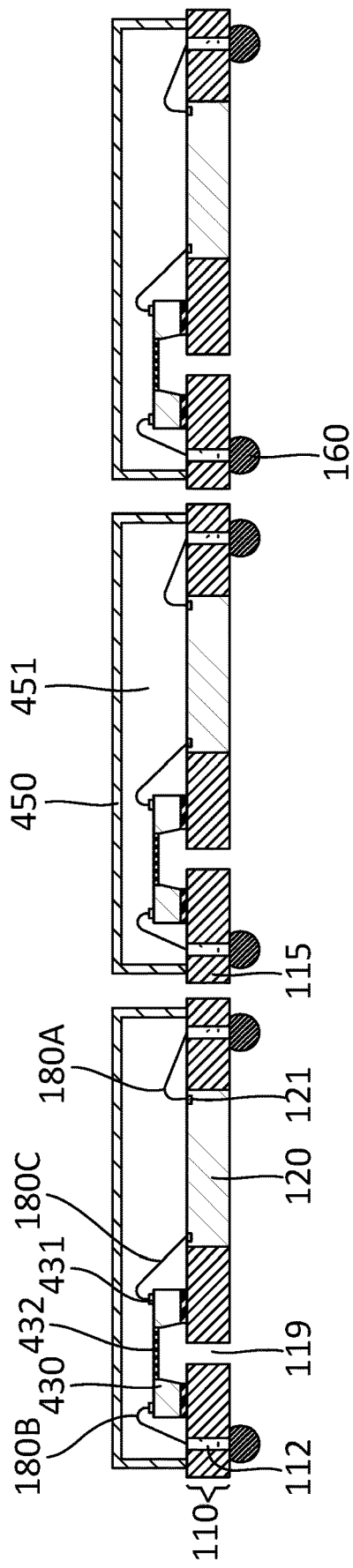
FIG. 56 shows cross-sectional view of an example method for manufacturing an example semiconductor device.

FIG. 56 shows cross-sectional view of semiconductor device 400 at a later stage of manufacture. In the example shown in FIG. 56, semiconductor device 400 can be singulated into discrete semiconductor devices. In some examples, semiconductor device 400 can be singulated into discrete semiconductor devices by a diamond blade or laser beam. Sidewalls of encapsulant 115 and cover structure 450 can be made substantially coplanar.

Semiconductor device 400 having reduced dimensions can be achieved by the manufacturing method described. In some examples, as the thickness and width of semiconductor device 400 can be reduced by such manufacturing method, semiconductor device 400 can be suitably applied to a wearable device.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. An apparatus comprising:
   a substrate comprising a substrate top side, a substrate bottom side, and a substrate first interconnect, wherein the substrate first interconnect comprises a substrate first interconnect top side, a substrate first interconnect bottom side, and a substrate first interconnect sidewall that extends between the substrate first interconnect top side and the substrate first interconnect bottom side;

a semiconductor die embedded in the substrate, wherein the semiconductor die comprises a die top side, a die bottom side, and a die sidewall, and wherein the die top side comprises a die first terminal and a die second terminal;

a first internal interconnect that couples the die first terminal to the substrate first interconnect top side;

a micro-electro mechanical system (MEMS) device comprising a device top side, and a device bottom side, wherein the device top side comprises a device first terminal;

an adhesive that contacts the die top side and the device bottom side, wherein the adhesive couples the MEMS device to the semiconductor die; and a second internal interconnect that couples the device first terminal to the die second terminal; and wherein an encapsulant of the substrate contacts the substrate first interconnect sidewall;

wherein the encapsulant of the substrate contacts the die sidewall;

wherein the die top side is uncovered by the encapsulant; and wherein the MEMS device has a footprint that overlaps a footprint of the semiconductor die.

2. The apparatus of claim 1, comprising:
an external interconnect comprising an external interconnect upper end; and
wherein of the external interconnect upper end is coupled to the substrate first interconnect bottom side.

3. The apparatus of claim 1, wherein the second internal interconnect comprises a bonding wire having a first end coupled to the device first terminal and a second end coupled to the die second terminal.

4. The apparatus of claim 1, wherein:
the substrate comprises a substrate second interconnect;
the substrate second interconnect comprises a substrate second interconnect top side, a substrate second interconnect bottom side, and a substrate second interconnect sidewall that extends between the substrate second interconnect top side and the substrate second interconnect bottom side;
the device top side comprises a device second terminal; and
the apparatus comprises a bonding wire having a first end coupled to the device second terminal and a second end directly coupled to the substrate second interconnect top side.

5. The apparatus of claim 1, wherein:
the encapsulant comprises an encapsulant top side that is coplanar with the die top side; and
the encapsulant comprises an encapsulant bottom side that is coplanar with the die bottom side.

6. The apparatus of claim 1, wherein:
the encapsulant comprises an encapsulant top side that is coplanar with the substrate first interconnect top side; and
the encapsulant comprises an encapsulant bottom side that is coplanar with the substrate first interconnect bottom side.

7. A method, comprising:
providing a substrate comprising a substrate top side, a substrate bottom side, and a substrate first interconnect, wherein the substrate first interconnect comprises a substrate first interconnect top side, a substrate first interconnect bottom side, and a substrate first interconnect sidewall that extends between the substrate first interconnect top side and the substrate first interconnect bottom side;

providing a semiconductor die embedded in the substrate, wherein the semiconductor die comprises a die top side, a die bottom side, and a die sidewall, and wherein the die top side comprises a die first terminal and a die second terminal;

providing a first internal interconnect that couples the die first terminal to the substrate first interconnect top side;

providing a micro-electro mechanical system (MEMS) device comprising a device top side, and a device bottom side, wherein the device top side comprises a device first terminal;

providing an adhesive that contacts the die top side and the device bottom side, wherein the adhesive couples the MEMS device to the semiconductor die; and providing a second internal interconnect that couples the device first terminal to the die second terminal; and wherein an encapsulant of the substrate contacts the substrate first interconnect sidewall;

wherein the encapsulant of the substrate contacts the die sidewall;

wherein the die top side is uncovered by the encapsulant; and wherein the MEMS device has a footprint that overlaps a footprint of the semiconductor die.

8. The method of claim 7, comprising:
providing an external interconnect comprising an external interconnect upper end; and
wherein of the external interconnect upper end is coupled to the substrate first interconnect bottom side.

9. The method of claim 7, wherein the second internal interconnect comprises a bonding wire having a first end coupled to the device first terminal and a second end coupled to the die second terminal.

10. The method of claim 7, wherein:
the substrate comprises a substrate second interconnect;
the substrate second interconnect comprises a substrate second interconnect top side, a substrate second interconnect bottom side, and a substrate second interconnect sidewall that extends between the substrate second interconnect top side and the substrate second interconnect bottom side;
the device top side comprises a device second terminal; and
the method comprises providing a bonding wire having a first end coupled to the device second terminal and a second end directly coupled to the substrate second interconnect top side.

11. The method of claim 7, wherein:
the encapsulant comprises an encapsulant top side that is coplanar with the die top side; and
the encapsulant comprises an encapsulant bottom side that is coplanar with the die bottom side.

12. The method of claim 7, wherein:
the encapsulant comprises an encapsulant top side that is coplanar with the substrate first interconnect top side; and
the encapsulant comprises an encapsulant bottom side that is coplanar with the substrate first interconnect bottom side.

* * * * *